United States Patent
Leeb et al.

(10) Patent No.: US 9,945,692 B2
(45) Date of Patent: Apr. 17, 2018

(54) NON-INTRUSIVE MONITORING

(71) Applicant: Massachusetts Institute of Technology, Cambridge, MA (US)

(72) Inventors: Steven B. Leeb, Belmont, MA (US); James Paris, Boston, MA (US); John Sebastian Donnal, Cambridge, MA (US); Jinyeong Moon, Cambridge, MA (US); Christopher Schantz, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 487 days.

(21) Appl. No.: 14/263,407

(22) Filed: Apr. 28, 2014

(65) Prior Publication Data

US 2014/0320125 A1    Oct. 30, 2014

Related U.S. Application Data

(60) Provisional application No. 61/817,198, filed on Apr. 29, 2013.

(51) Int. Cl.
| | | |
|---|---|---|
| *G01B 7/30* | (2006.01) | |
| *G01D 5/16* | (2006.01) | |
| *G01R 33/09* | (2006.01) | |
| *G01R 21/08* | (2006.01) | |
| *G01R 15/20* | (2006.01) | |

(52) U.S. Cl.
CPC ............ *G01D 5/16* (2013.01); *G01R 15/207* (2013.01); *G01R 21/08* (2013.01); *G01R 33/098* (2013.01)

(58) Field of Classification Search
CPC .......................................................... G01B 7/30
USPC ..................................................... 324/207.25
See application file for complete search history.

(56) References Cited

U.S. PATENT DOCUMENTS

| | | | | |
|---|---|---|---|---|
| 4,630,485 | A | * 12/1986 | Wastl, Sr. | .................. 73/861.56 |
| 5,196,982 | A |   3/1993 | Landsberg et al. | |
| 5,327,789 | A | * 7/1994 | Nijdam | ...................... 73/861.56 |
| 6,330,516 | B1 | 12/2001 | Kammeter | |
| 8,344,724 | B2 |   1/2013 | Leeb et al. | |
| 2011/0080165 | A1 |   4/2011 | Masamichi et al. | |
| 2012/0221260 | A1* |   8/2012 | Kamimura et al. | ............ 702/45 |
| 2013/0116941 | A1* |   5/2013 | Lie-Nielsen et al. | ........... 702/46 |

FOREIGN PATENT DOCUMENTS

| | | |
|---|---|---|
| DE | 102005016374 A1 * | 10/2006 |
| EP | 0 176 634 A1 | 4/1986 |
| EP | 2 642 303 A1 | 9/2013 |

(Continued)

OTHER PUBLICATIONS

Partial Translation of DE102005016374A1, Oct. 12, 2006.*

(Continued)

*Primary Examiner* — Bot Ledynh
(74) *Attorney, Agent, or Firm* — Wolf, Greenfield & Sacks, P.C.

(57) ABSTRACT

Methods and apparatus for non-intrusive monitoring by sensing physical parameters such as electric and/or magnetic fields. Such apparatus and techniques may find application in a variety of fields, such as monitoring consumption of electricity, water, etc., in homes or businesses, for example, or industrial process monitoring.

27 Claims, 42 Drawing Sheets

(56) References Cited

FOREIGN PATENT DOCUMENTS

WO 2012/055354 A1 5/2012

OTHER PUBLICATIONS

Government of South Australia, A Practical Guide to Reading Water Meters, 2006.*
Loreit et al., DE102005016374A1, Partial Translation, 2005.*
AAH002-02E: 6 Oe Sat. Analog Sensor. NVE Corporation. 17 pages. [Online] (http://www.nve.com/webstore/catalog/product info.php?products_id=509).
Barry Hoberman. The Emergence of Practical MRAM. Crocus Technologies, 7 pages. [Online] (http://www.crocustechnology.com/pdf/BH%20GSA%20Article.pdf).
Cox et al., "Using the non-intrusive load monitor for shipboard supervisory control," in IEEE Electric Ship Technologies Symposium, Arlington, VA, May 2007, pp. 523-530.
DeNucci et al., "Diagnostic indicators for shipboard systems using non-intrusive load monitoring," in IEEE Electric Ship Technologies Symposium, Philadelphia, Pennsylvania, Jul. 2005, pp. 413-420.
Greene et al., "Non-intrusive monitoring for condition-based maintenance," in American Society of Naval Engineers Reconfigurability and Survivability Symposium, Atlantic Beach, Florida, Feb. 2005, 11 pages.
Gu et.al, "An investigation of the effects of measurement noise in the use of instantaneous angular speed for machine diagnosis," Mechanical Systems and Signal Processing, v.20, No. 6, pp. 1444-1460, Aug. 2006.
Ikeda et al., "Tunnel magnetoresistance of 604% at 300 K by suppression of Ta diffusion in CoFeB/MgO/CoFeB pseudo-spin-valves annealed at high temperature". Appl. Phys. Lett. vol. 93, 082508, (2008).
International Search Report and Written Opinion dated Nov. 5, 2014 by the EPO in International Application No. PCT/US2014/035689, 18 pages.
Khan et al., "A multiprocessor for transient event detection," IEEE Transactions on Power Delivery, vol. 12, No. 1, pp. 51-60, Jan. 1997.
Leeb et al., "Transient event detection in spectral envelope estimates for nonintrusive load monitoring," IEEE Transactions on Power Delivery, vol. 10, No. 3, pp. 1200-1210, Jul. 1995.
M. Julliere (1975). "Tunneling between ferromagnetic films". Physics Letters, vol. 54A, No. 3, pp. 225-226, Sep. 8, 1975.
Mitchell et al., Shipboard fluid system diagnostic indicators using nonintrusive load monitoring, in American Society for Naval Engineers Day 2007, Arlington, VA, 90 pages, Jun. 2007.
Mitchell et al., "Shipboard fluid system diagnostic indicators using non-intrusive load," Naval Engineers Journal, vol. 119, No. 1, pp. 109-119, Nov. 2007.
Norford et al., "Non-intrusive electrical load monitoring in commercial buildings based on steady state and transient load-detection algorithms," Energy and Buildings, vol. 24, pp. 51-64, (1996).
P.A. Regalia, "An improved lattice-based adaptive IIR notch filter," IEEE Trans. Signal Processing, vol. 39, No. 9, pp. 2124-2128, Sep. 1991.
Parkin et al. (2004) "Giant tunnelling magnetoresistance at room temperature swith MgO (100) tunnel barriers". Nature Materials, vol. 3, Dec. 2004, pp. 862-867.
Proper et al., "Field demonstration of a real-time non-intrusive monitoring system for condition-based maintenance," in Electric Ship Design Symposium, National Harbor, Maryland, Feb. 2009, 12 pages.
Shaw et al., "Nonintrusive load monitoring and diagnostics in power systems," IEEE Transactions on Instrumentation and Measurement, vol. 57, No. 7, pp. 1445-1454, Jul. 2008.
STJ-340: Four Element Bridge Magnetic Sensor. Micro Magnetics. 2 pages. [Online] (http://www.micromagnetics.com/docs/STJ-340 datasheet.pdf).
U.S. Department of Energy, The smart grid: An introduction, 48 pages, Aug. 2009. [Online]. (http://energy.gov/oe/downloads/smart-grid-introduction-0).

* cited by examiner

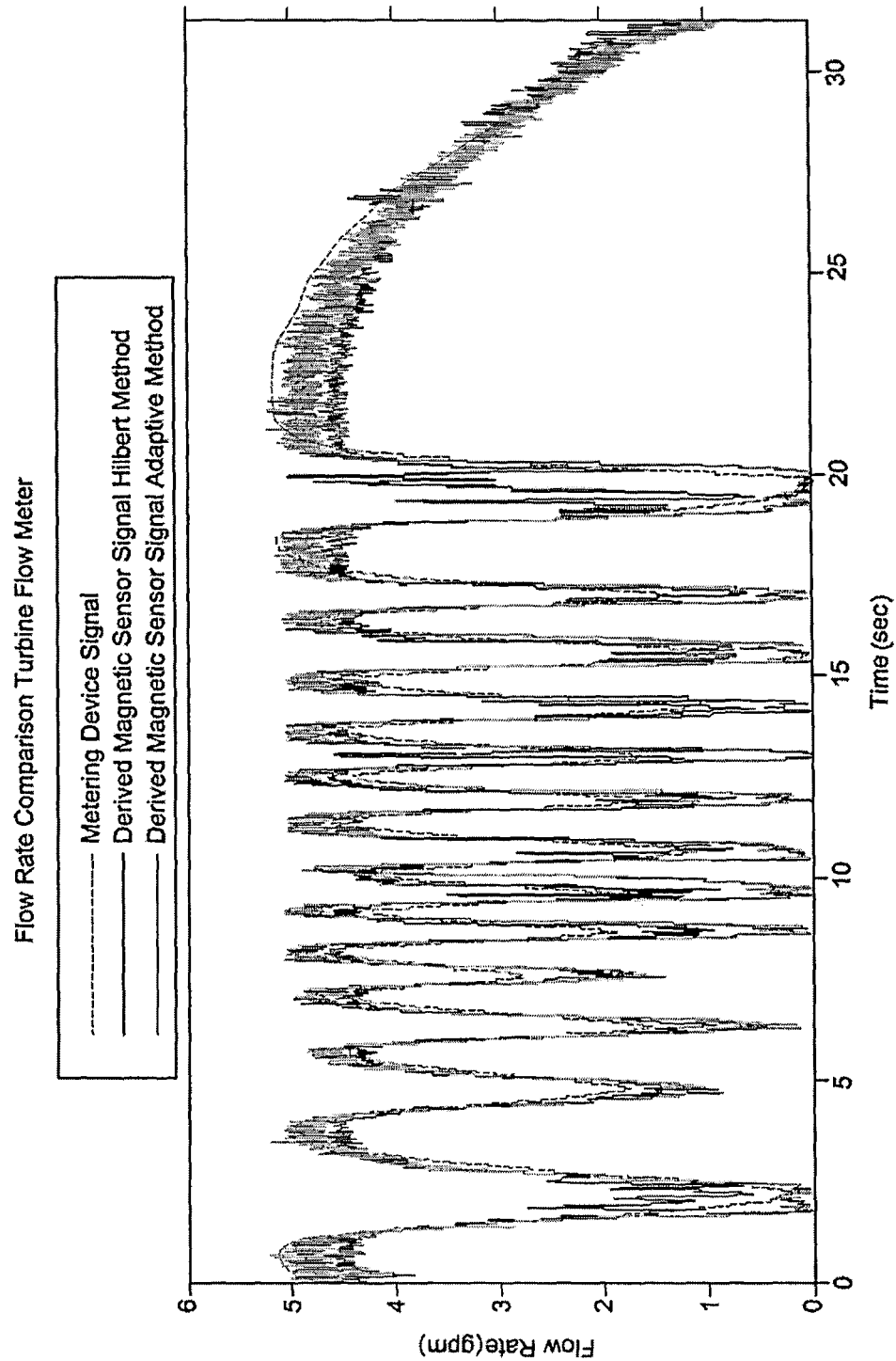

NON-INTRUSIVE MONITORING

CROSS-REFERENCE TO RELATED APPLICATIONS

This application claims priority to U.S. provisional application Ser. No. 61/817,198, titled "Non-Intrusive Monitoring," filed Apr. 29, 2013, which is hereby incorporated by reference in its entirety.

This application is related to U.S. patent application Ser. No. 12/614,245, filed Nov. 6, 2009, now U.S. Pat. No. 8,344,724, which is hereby incorporated by reference in its entirety.

BACKGROUND

1. Field of Invention

The apparatus and techniques described herein relate to non-intrusive monitoring by sensing physical parameters such as electric and/or magnetic fields. Such apparatus and techniques may find application in a variety of fields, such as monitoring consumption of electricity, water, etc., in homes or businesses, for example, or industrial process monitoring.

2. Discussion of the Related Art

Among the many potential benefits identified by the U.S. Department of Energy, the smart grid promises enormous energy savings through cost-effective demand-side energy management. Reducing the power consumed by utility customers by just 5% would equate to permanently eliminating the fuel and greenhouse gas emissions from 53 million cars. The accessibility of power monitoring information will be a critical driver for the success of these efforts. Centralized power monitoring systems promise lower sensor count than other per-load sensor systems. Several references describe centralized power monitoring approaches in which loads are identified and then monitored according to their current signatures. Closed or clamp core sensors wrapped around the utility feed are often used to provide current sense signals. These sensors are impractical in many retrofit applications. For instance, skilled labor is required to separate line and neutral in order to deploy a wrap-around sensor, and in some industrial environments electrical service interruption may be unacceptable or prohibitively expensive.

There are several patents describing non-contact power monitoring. EP0176634A1 describes a Hall Effect sensor for monitoring multiple conductor cables, but only for a two-wire conductor and for a specific wire rotation. Numerous patents describe a circuit breaker with integrated current monitoring (for example, U.S. Pat. No. 5,196,982), but all of the described techniques require replacement of the existing breaker. U.S. Pat. No. 6,330,516 describes magnetic sensors arrayed around a breaker panel but does not describe a signal processing technique that can be used to recover to current and voltage information from these sensors or what type of sensors are actually used. It is unclear how the described system could be implemented in practice.

In addition to electrical services, premises such as homes or businesses may receive utility services such water and natural gas services. A premises may be equipped with a water meter that measures the total amount of water consumed and/or a gas meter that measures the total amount of natural gas consumed. A conventional water meter has a display that a user may view to see the total amount of water that has passed through the water meter. More recently, a new type of water meter has been developed that has built-in a wireless communication capability for wirelessly sending the information representing the total amount of water that has passed through the water meter to an external computing device. However, installing such a water meter may require the services of a trained professional, and thus may be prohibitively expensive.

SUMMARY

Some embodiments relate to a sensor apparatus that includes a tunneling magnetoresistive magnetic field sensor, a coiled conductor and a circuit configured to provide a current to the coiled conductor to at least partially cancel a magnetic field at the tunneling magnetoresistive magnetic field sensor.

Some embodiments relate to a non-intrusive monitoring method for monitoring flow of a consumable through a field-producing device. The non-intrusive monitoring method includes positioning a sensor apparatus proximate to and external to the field-producing device. The sensor apparatus includes a tunneling magnetoresistive magnetic field sensor that produces a magnetic monitoring signal. The method also includes processing the magnetic monitoring signal to extract information regarding the flow of the consumable through the field-producing device.

Some embodiments relate to a system for non-intrusive monitoring of at least one circuit breaker. The system includes a first sensor apparatus configured to be positioned external to and proximate a first circuit breaker to detect a field produced by the first circuit breaker. The first sensor apparatus is configured to produce a first monitoring signal. The system also includes a second sensor apparatus configured to be positioned external to and proximate a second circuit breaker to detect a field produced by the second circuit breaker. The second sensor apparatus is configured to produce a second to monitoring signal. The system also includes a processing device configured to determine an electrical parameter of the first circuit breaker based on the first and second monitoring signals.

Some embodiments relate to method for non-intrusive monitoring of at least one circuit breaker. The method includes positioning a first sensor apparatus external to and proximate a first circuit breaker to detect a field produced by the first circuit breaker. The first sensor apparatus is configured to produce a first monitoring signal. The method also includes positioning a second sensor apparatus external to and proximate a second circuit breaker to detect a field produced by the second circuit breaker. The second sensor apparatus is configured to produce a second monitoring signal. The method also includes determining an electrical parameter of the first circuit breaker based on the first and second monitoring signals.

Some embodiments relate to a monitoring apparatus for monitoring flow of a fluid through a field-producing device. The monitoring apparatus includes a sensor apparatus configured to measure a field produced by the field-producing device. The monitoring apparatus also includes a sensor positioning apparatus configured to position the sensor apparatus external to and proximate to the field-producing device to measure the field.

Some embodiments relate to a non-intrusive monitoring method for monitoring flow of a fluid through a field-producing device. The method includes receiving a magnetic monitoring signal from a sensor apparatus positioned proximate to and external to the field-producing device. The method also includes processing the magnetic monitoring signal to extract information regarding the flow of the fluid through the field-producing device.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily to drawn to scale, with emphasis instead being placed on illustrating various aspects of the techniques and devices described herein.

FIG. 19B shows a plot of measured flow rates using several techniques.

DETAILED DESCRIPTION

Described herein are methods and apparatus for non-intrusive monitoring that can be used in any of a variety of applications, such as monitoring consumption of a consumable such as electricity, water, etc., in homes or businesses, and industrial process monitoring, by way of example. Such methods and apparatus advantageously may be used in retrofit applications whereby monitoring can be performed without modification of existing equipment. Non-intrusive monitoring may be performed by measuring physical parameters, such as electric fields and/or magnetic fields, produced by the equipment being monitored. For example, a sensor apparatus may be placed by an untrained user in a suitable position to measure a physical parameter (e.g., electric and/or magnetic field(s)) produced by existing installed equipment.

Some embodiments are capable of measuring current and/or voltage levels on a circuit breaker without modifying the circuit breaker or panel, by detecting electric and/or magnetic field(s) external to the circuit breaker.

Figure 1A:
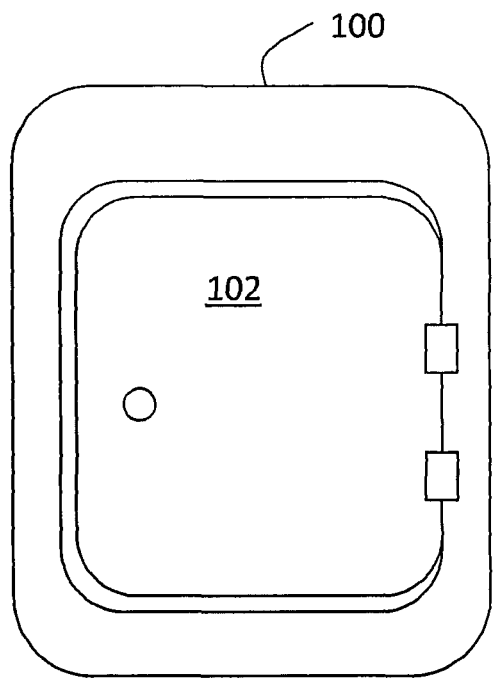
FIG. 1A shows a typical circuit breaker unit when the door is closed.
Figure 1B:
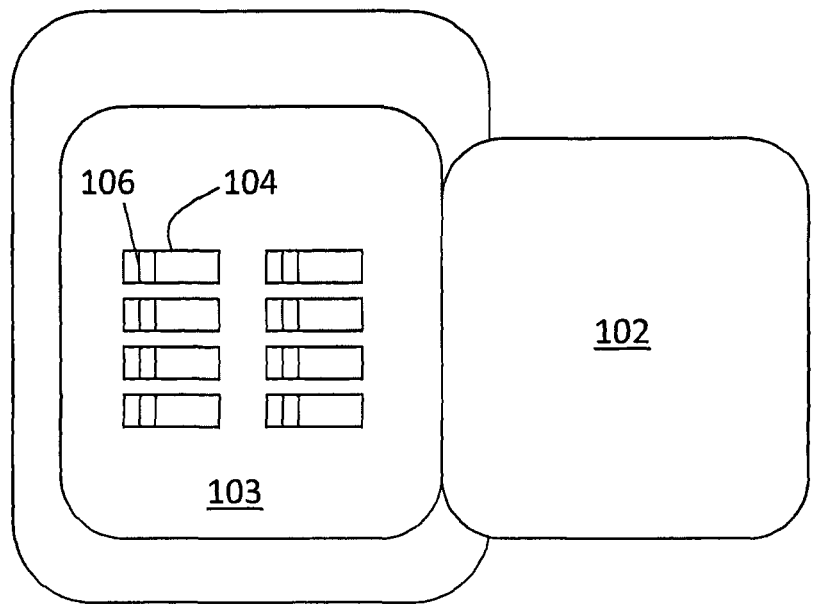
FIG. 1B shows the interior of the circuit breaker unit when the door is open, including a circuit breaker panel with a plurality of circuit breakers.

FIG. 1A shows a typical circuit breaker unit 100 of the type commonly used in homes and offices. Circuit breaker unit 100 has a door 102 that may be opened and closed by hand. The door 102 may be closed most of the time for safety reasons, as shown in FIG. 1A. FIG. 1B shows the interior of the circuit breaker unit 100 when the door 102 is open. The circuit breaker unit 100 may include a circuit breaker panel 103 having a plurality of circuit breakers 104 disposed therein, each circuit breaker being connected to a different circuit to provide overcurrent protection. Circuit breaker 104 has a toggle switch 106 that may be in the "on" position or the "off" position. When current is flowing in normal operation the toggle switch 106 is in the "on" position to allow the current to flow to the circuit protected by the circuit breaker 104. When circuit breaker 104 senses an overcurrent condition, the circuit breaker 104 switches off as a to protective mechanism to prevent current from flowing to the circuit. When the circuit breaker 104 switches off, the toggle switch 106 may flip to the "off" position. The circuit breaker 104 can be re-set manually by flipping the toggle switch 106 back to the "on" position.

In some designs, the circuit breaker unit 100 and/or door 102 may be constructed of a metal, such as steel. The housing of the circuit breaker 104 and the toggle switch 106 may be formed of a hard plastic material. It should be appreciated, however, that these components may be formed of a variety of other materials, and are not limited to steel and plastic, respectively.

Figure 1C:
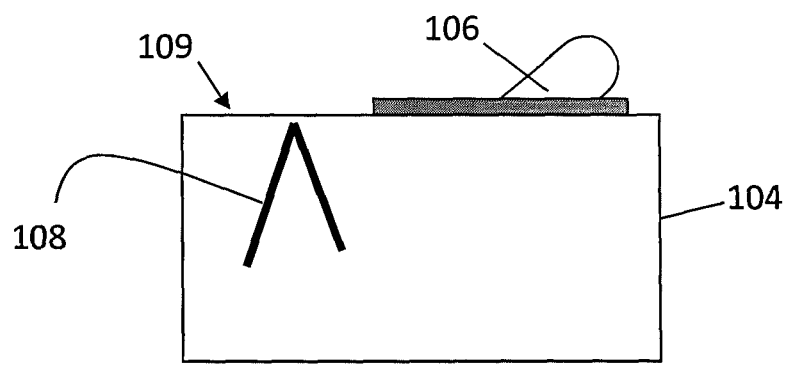
FIG. 1C shows a cross-sectional view of a circuit breaker.

FIG. 1C shows a cross-sectional view of a circuit breaker 104, including toggle switch 106 and a conductor 108. Conductor 108 carries the current for the circuit that is protected by the circuit breaker 104. For purposes of illustration, only a portion of conductor 108 is shown in FIG. 1C.

A circuit breaker typically may be constructed in a manner such that conductor 108 is positioned adjacent to the face 109 of the circuit breaker 104, as illustrated in FIG. 1C. Conductor 108 may be positioned in a region that is beyond the range of travel of toggle switch 106. The current flowing through conductor 108 creates a magnetic field in the proximity of conductor 108. In addition, the electric potential of conductor 108 creates an electric field in the proximity of conductor 108 In accordance with some embodiments, the electric field and/or the magnetic field produced by conductor 108 can be sensed outside of the housing of circuit breaker 104 and outside of the circuit breaker panel 103. In accordance with some embodiments, sensing of the electric field and/or the magnetic field produced by conductor 108 can be used for non-intrusive power monitoring of the circuit protected by circuit breaker 104.

Figure 1D:
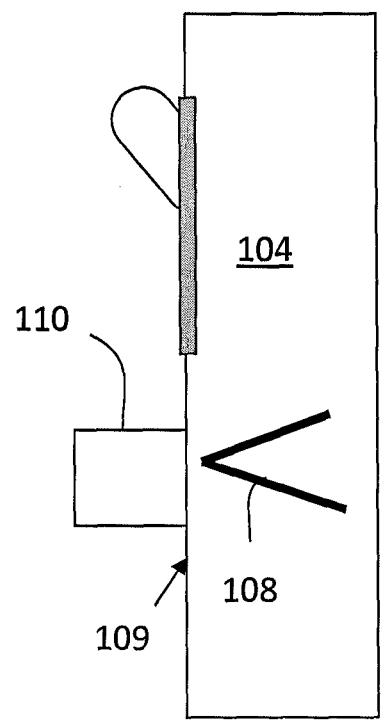
FIG. 1D shows placement of a sensor apparatus at the face of a circuit breaker.

FIG. 1D shows a sensor apparatus 110 that may be placed in the proximity of conductor 108 (e.g., near or at the face 109 of the circuit breaker 104) to detect the electric field produced by conductor 108, the magnetic field produced by conductor 108, or both. As used in this context, the terms "proximity" and "proximate" means that the sensor apparatus 110 is close enough to produce a sensed signal suitable for monitoring. In some embodiments, sensor apparatus 110 may be positioned in contact with the face 109 of the circuit breaker 104. Positioning the sensor apparatus 110 as close as possible to to the conductor 108 may increase the magnitude of the detected signal. However, it should be appreciated that suitable detection can also be obtained when the sensor apparatus 110 is positioned farther from conductor 108.

Monitoring signals regarding the magnetic and/or electric field sensed by sensor apparatus 110 may be sent to another device using any suitable technique, such as via a wired connection and/or via a wireless link. U.S. Pat. No. 8,344,724 describes an example of a suitable technique in which signals can be transmitted through the circuit breaker door. However, the techniques described herein are not limited in this respect, as any suitable techniques may be used for sending signals from sensor apparatus 110 to another device.

Figure 2A:
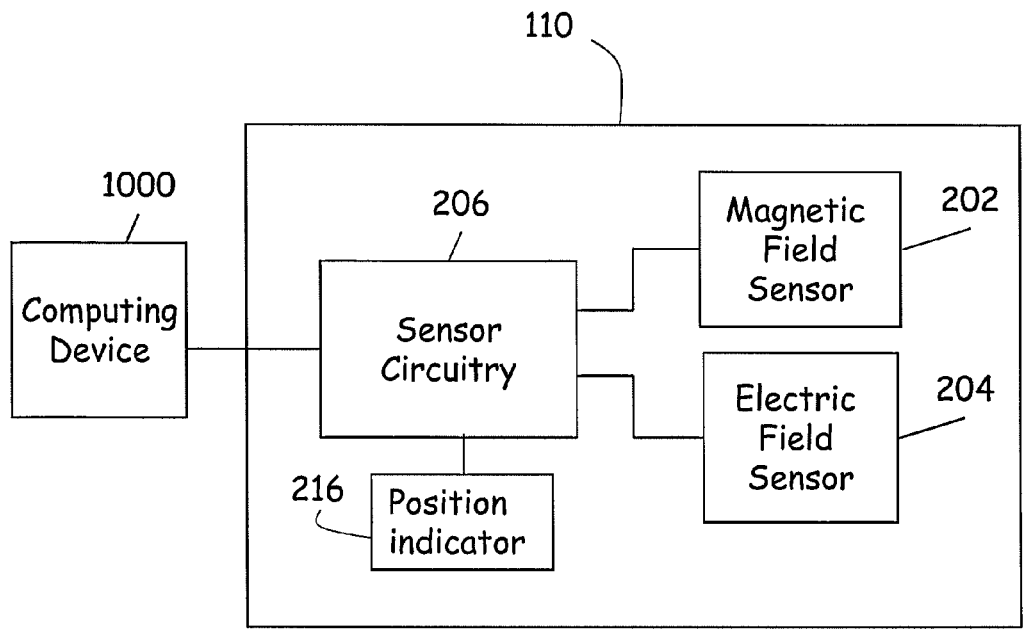
FIGS. 2A and 2B show block diagrams of sensor apparatus, according to some embodiments.
Figure 18:
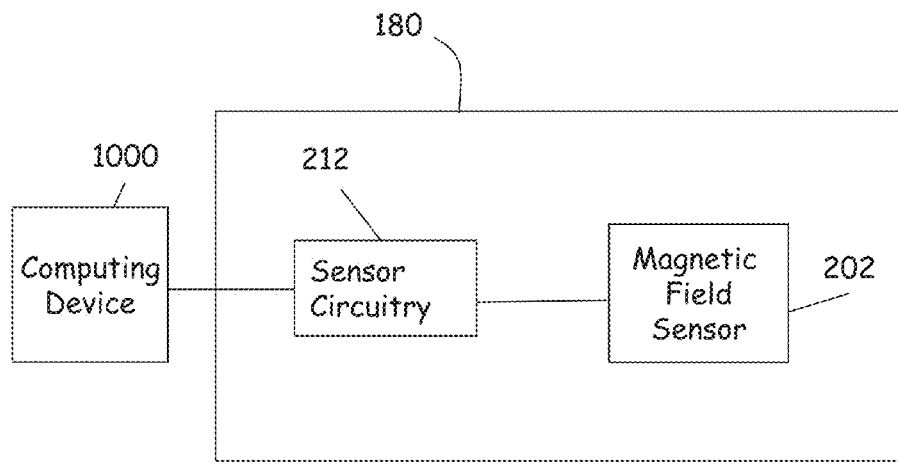
FIG. 18 shows a sensor apparatus having a magnetic field sensor.

FIG. 2A shows a block diagram of a sensor apparatus 110 capable of sensing electric and magnetic fields, according to some embodiments. Sensing the magnetic field produced by conductor 108 enables measuring the current through conductor 108. Sensing the electric field produced by conductor 108 enables measuring the voltage of conductor 108. Measuring both the voltage of and the current through conductor 108 can be advantageous, as it can allow obtaining additional information regarding the power provided to a load, such as phase information, by way of example. As shown in FIG. 2A, the sensor apparatus 110 may include a magnetic field sensor 202, an electric field sensor 204, an optional position indicator 216, and sensor circuitry 206. Sensor apparatus 110 need not include both a magnetic field sensor 202 and an electric field sensor 204, as in some embodiments a sensor apparatus 110 may include a magnetic field sensor 202 and no electric field sensor (as in sensor apparatus 180 of FIG. 18), or an electric field sensor 204 and no magnetic field sensor. Examples of a magnetic field sensor 202, electric field sensor 204, sensor circuitry 206 and position indicator 216 are described in further detail below.

Measuring Current

The inventors have recognized and appreciated that a circuit breaker panel 103 may have a plurality of circuit breakers, each of which includes a conductor 108 that produces electric and/or magnetic fields that may interfere with measurements of fields produced by other circuit breakers. Accurately reading the magnetic field produced by circuit breaker 104 and isolating a particular breaker's contribution to the sensed magnetic field are difficult problems. Experiments have shown that the close proximity of the plurality of circuit breakers in a circuit breaker panel 103 can make it very difficult to distinguish their respective magnetic fields.

As discussed above, current can be measured by sensing the magnetic fields around the circuit breaker panel 103. Ampere's Law establishes the linear relationship between magnetic fields and current, but without a closed path around the conductor, accurately measuring this field is a challenging task. On the surface of a circuit breaker and the exterior of a power cable, the fields are not uniformly radial, and depending on the particular geometry, can be very small—less than 1 Gauss for bench top load currents in typical wires. Two exemplary circuit topologies are described that can accurately sense these small fields and can do so even in the presence of DC offsets introduced by nearby magnetic elements such as steel breaker panels, and the Earth itself.

Figure 28A:
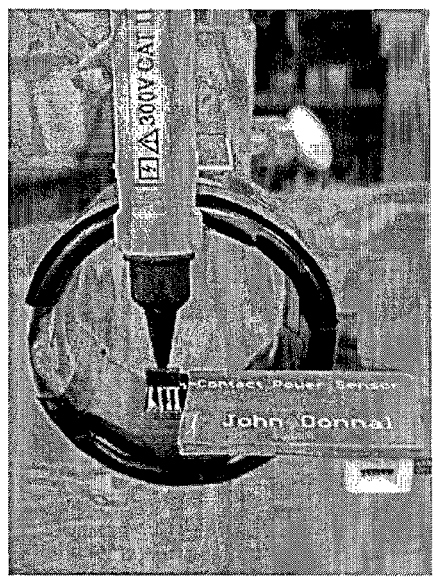
FIGS. 28A and 28B shows experimental setups for testing a Hall Effect sensor and TMR sensor, respectively.
Figure 28B:
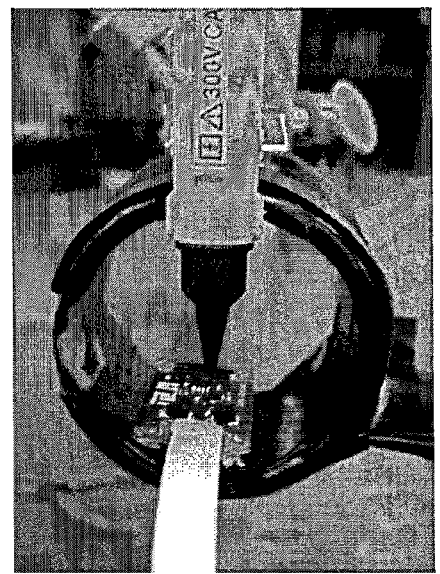
Figure 29:
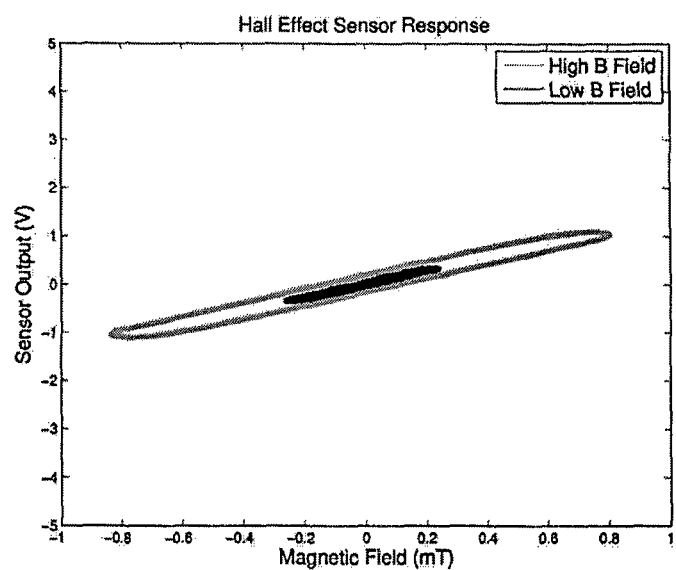
FIGS. 29 and 30 show sensing results for the Hall Effect and TMR-based sensors respectively.
Figure 30:
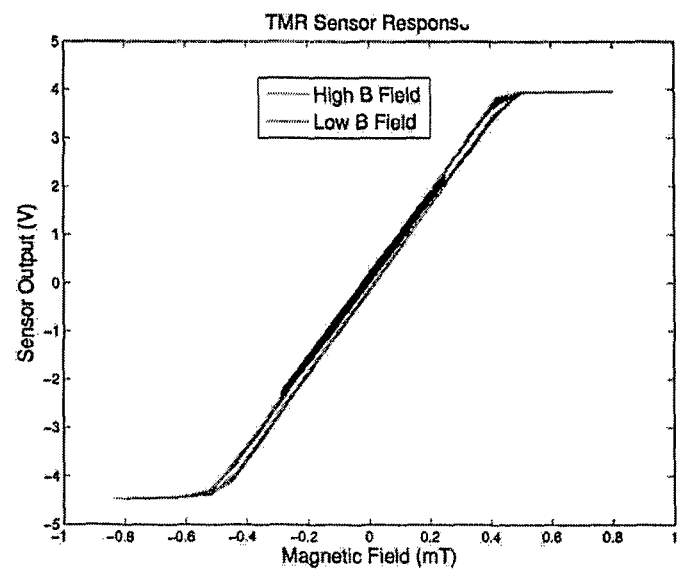

The first circuit, based on a Hall Effect sensor, is a cost effective solution suitable for measuring larger loads or in situations where the wire topology exposes a relatively strong magnetic field. The second non-contact circuit uses a Tunneling Magnetoresistive (TMR) element (a recently introduced sensor technology) with an inductive feedback technique to accurately measure extremely small fields. The response of both circuit designs are evaluated with the experimental setup shown in FIGS. 28A and 28B. For illustration and characterization, each sensor is placed in an air core solenoid where a signal generator coupled with a power amplifier generates a magnetic field. Sensor output is compared to the field strength as measured with a fluxgate-magnetometer (an Aim Instrument I-proper 520). Results for the Hall Effect and TMR-based sensors are shown in FIGS. 29 and 30, respectively. Two levels of field strength illustrate the degree of hysteresis in the sensor response. Steeper slope reflects higher sensitivity.

A. Hall Effect Sensor

Figure 27:
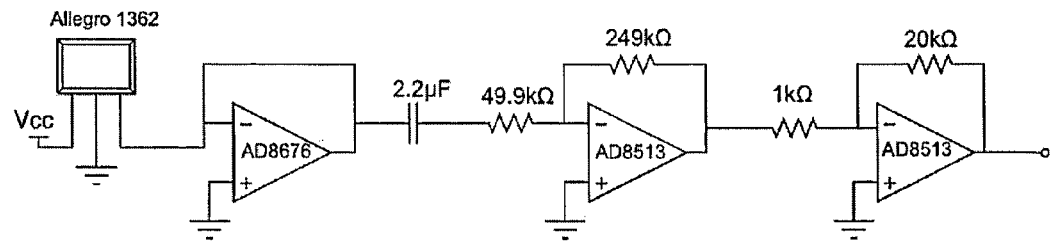
FIG. 27 shows a schematic of sensing circuitry which may be used with a Hall Effect sensor.

A schematic for an exemplary circuit for making measurements using a Hall Effect sensor is shown in FIG. 27. The Hall Effect is widely known and used in many current sensor designs. One of the most sensitive devices available in quantity is Allegro MicroSystem's A1362 Hall Effect sensor. However, any suitable Hall Effect sensor may be used. The A1362 has a programmable gain, which can be set up to 16 mV/G, sufficient to resolve the magnetic fields of interest. The quiescent output level is also programmable but not tightly controlled. Therefore, in order to measure small fields without saturating the output, a high pass filter with a cutoff at 1.5 Hz AC-couples the sensor to the inverting amplifier gain stage. The large capacitive input of the filter stage may be present, which may be addressed using a follower to buffer the sensor output. Overall gain can be adjusted by tuning the feedback leg of the gain stage; however, adding additional amplification to resolve smaller fields is of limited utility because the A1362 has a gain independent noise floor of 8 mV. Any suitable measurement circuitry may be used, as the techniques described herein are not limited to the circuit shown in FIG. 27.

Figure 34:
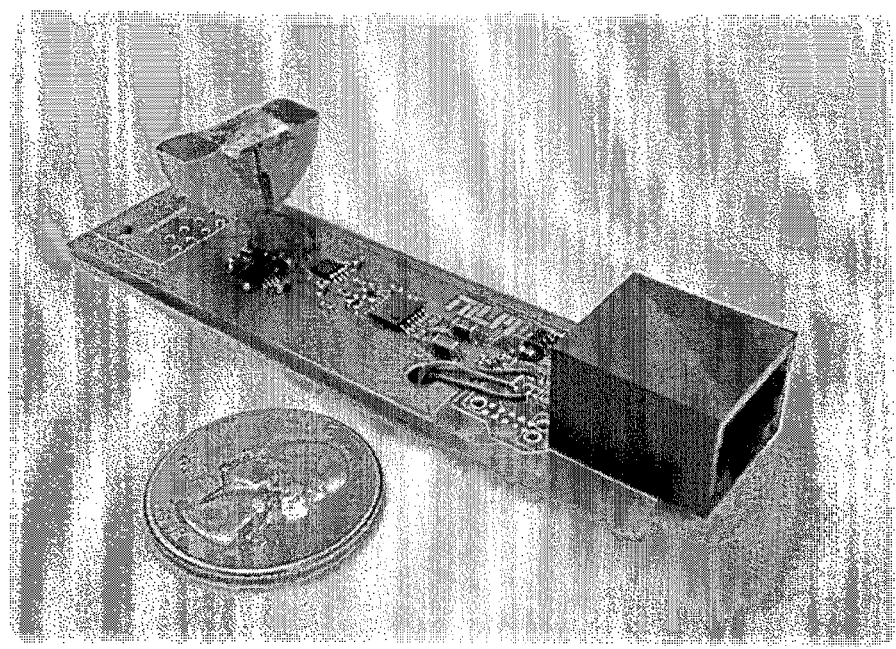
FIG. 34 shows a prototype sensor apparatus with a partial ferrite ring designed to capture radial fields near the surface of a multiconductor cable.

In situations where the geometry of the fields is approximately known, the response of the Hall Effect circuit can be improved by attaching magnetic material parallel to the field lines around the A1362 chip. The prototype, shown unpackaged in FIG. 34 has a partial ferrite ring designed to capture radial fields near the surface of a multiconductor cable such as the three phase power line in FIG. 35.

B. TMR Device

In some embodiments, magnetic fields can be sensed more effectively using a tunneling magnetoresistive (TMR) magnetic field sensor (also referred to herein as a TMR device). The TMR effect describes the change in resistance of a particular material due to applied magnetic fields. Recent advancements using new materials and advanced fabrication techniques have improved the sensitivity of TMR devices. Current state of the art TMR devices show up to a 600% change in relative resistance at room temperature. A TMR device is well-suited for non-intrusive monitoring applications because of its high sensitivity and bipolar operation. One example of a suitable TMR device is the STJ-340 manufactured by Micromagnetics. However, this is merely by way of example, and any suitable TMR device may be used. Further, some embodiments are not limited to the use of a TMR device, as any other type of magnetic field sensor of suitable sensitivity may be used.

TMR devices are sensitive to very small magnetic fields but have the drawback to of a correspondingly narrow range of linear operation. There are two significant difficulties in building a practical current sensor with a TMR device. First, the TMR device has a significant DC offset due to static fields. Secondly, the TMR device is non-linear over the range of operation. The output may saturate for large fields and distort high frequency harmonics.

In some embodiments, to improve linearity over the range of magnetic fields of interest, a TMR device can be used in conjunction with a coiled conductor that is actively driven with current to drive the magnetic field at the TMR device to zero. One example of a coiled conductor that may be used is a solenoid having an air-core winding. A feedback loop can be used to drive the coiled conductor to maintain the TMR device in its linear region of operation, which improves the accuracy of the field strength readings.

Figure 2B:
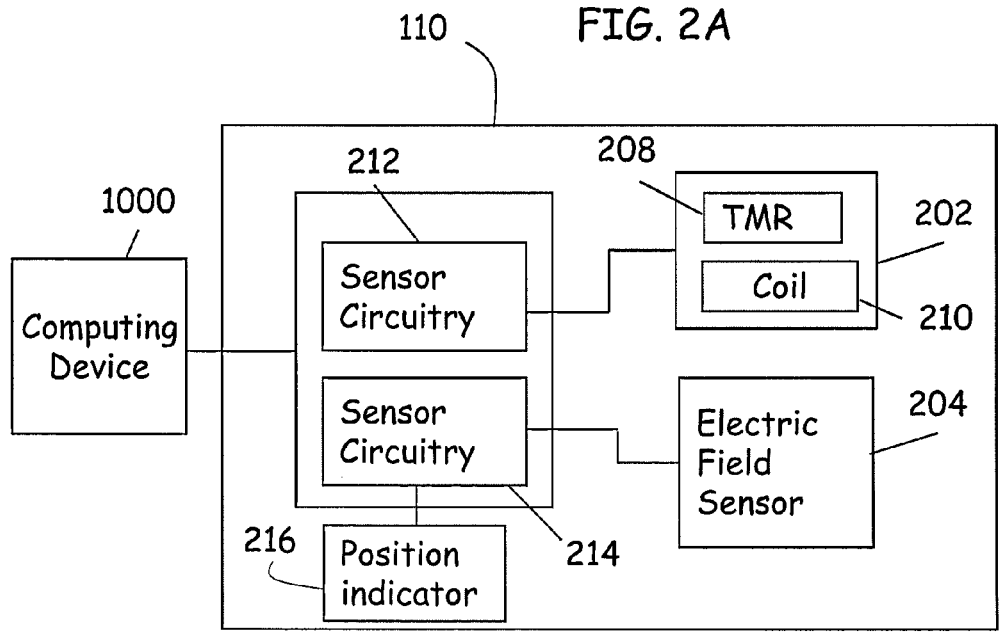
Figure 3:
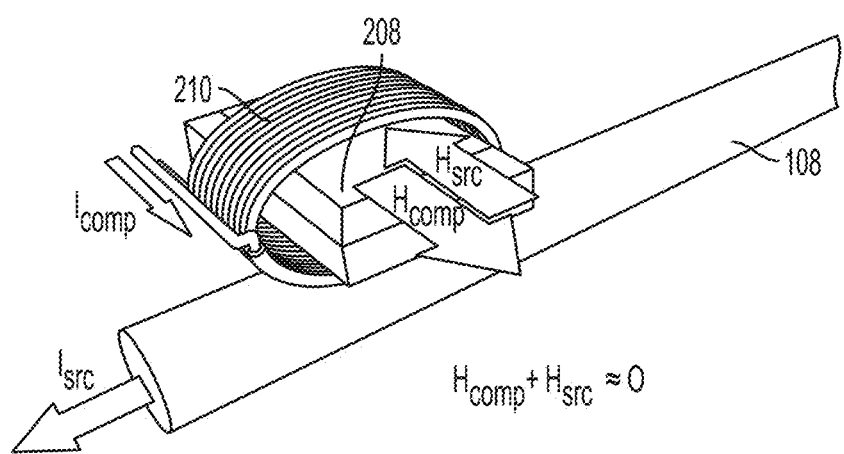
FIG. 3 shows a sensor apparatus in which a coiled conductor is wrapped around a TMR device.
Figure 4:
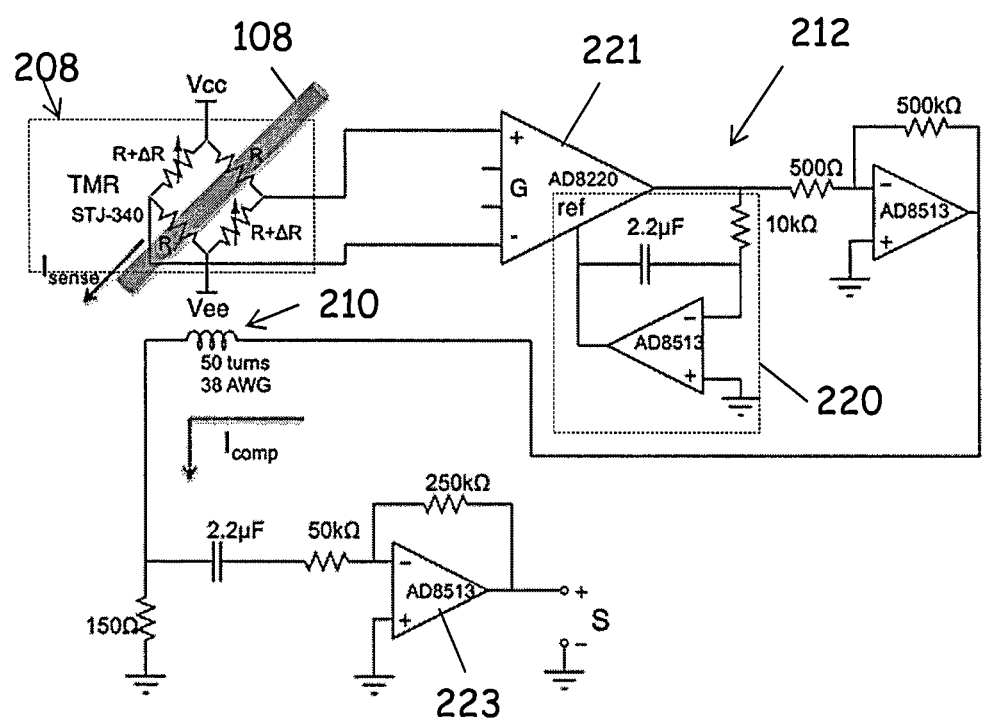
FIG. 4 shows an example of sensor circuitry for sensing magnetic fields.

FIG. 2B shows an example of a sensor apparatus 110 including a TMR device 208, a coiled conductor 210, and sensor circuitry 212. FIG. 3 illustrates an embodiment in which the coiled conductor 210 is wrapped around the TMR device 208. To correct for the saturation and linearity errors, a feedback loop is used to provide current to the coiled conductor 210 to actively drive the magnetic field sensed by the TMR device 208 to zero. FIG. 4 shows an example of sensor circuitry 212 that may be used for sensing magnetic fields from the TMR device 208 and for driving the coiled conductor 210. The DC offset error is corrected by a lowpass feedback loop 220 which keeps the REF pin of the instrumentation amplifier 221 adjusted so that the output is a small AC signal around ground. By keeping the TMR device 208 exposed to very small fields we ensure substantially linear operation and also extend the range of operation. The general operation of the feedback topology is show in FIG. 3. In this example, the current $I_{comp}$ is measured as a voltage across the 150Ω resistor and AC coupled to an output amplifier 223. However, it should be appreciated that the circuit shown in FIG. 4 is merely by way of example, as the techniques described herein are not limited to the particular type and arrangement of components illustrated in FIG. 4.

Figure 5:
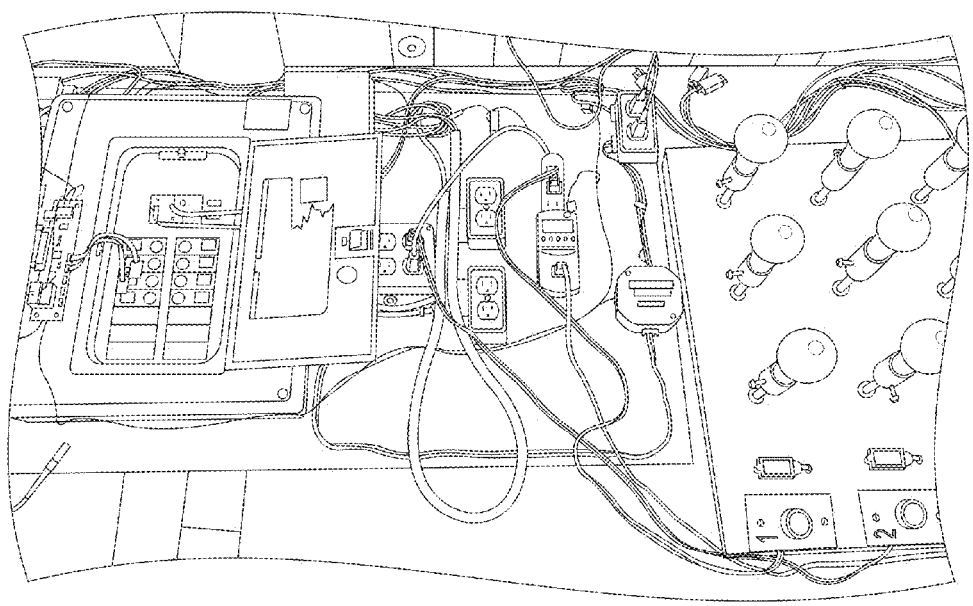
FIG. 5 shows an experimental setup for evaluating non-intrusive current and voltage measurements.

FIG. 5 shows an experimental setup used to evaluate the non-intrusive current and voltage measurements. The breaker box is a standard two phase panel with eight circuits installed. The breaker is wired to the utility with one of the phases inverted by a variac. The 180 degree difference between the phases matches the standard configuration in household wiring. A series of incandescent bulbs with dimmers are used as loads for this panel. The total load can be adjusted from 0-2 KW and various harmonics can be introduced by the dimmers.

Figure 6A:
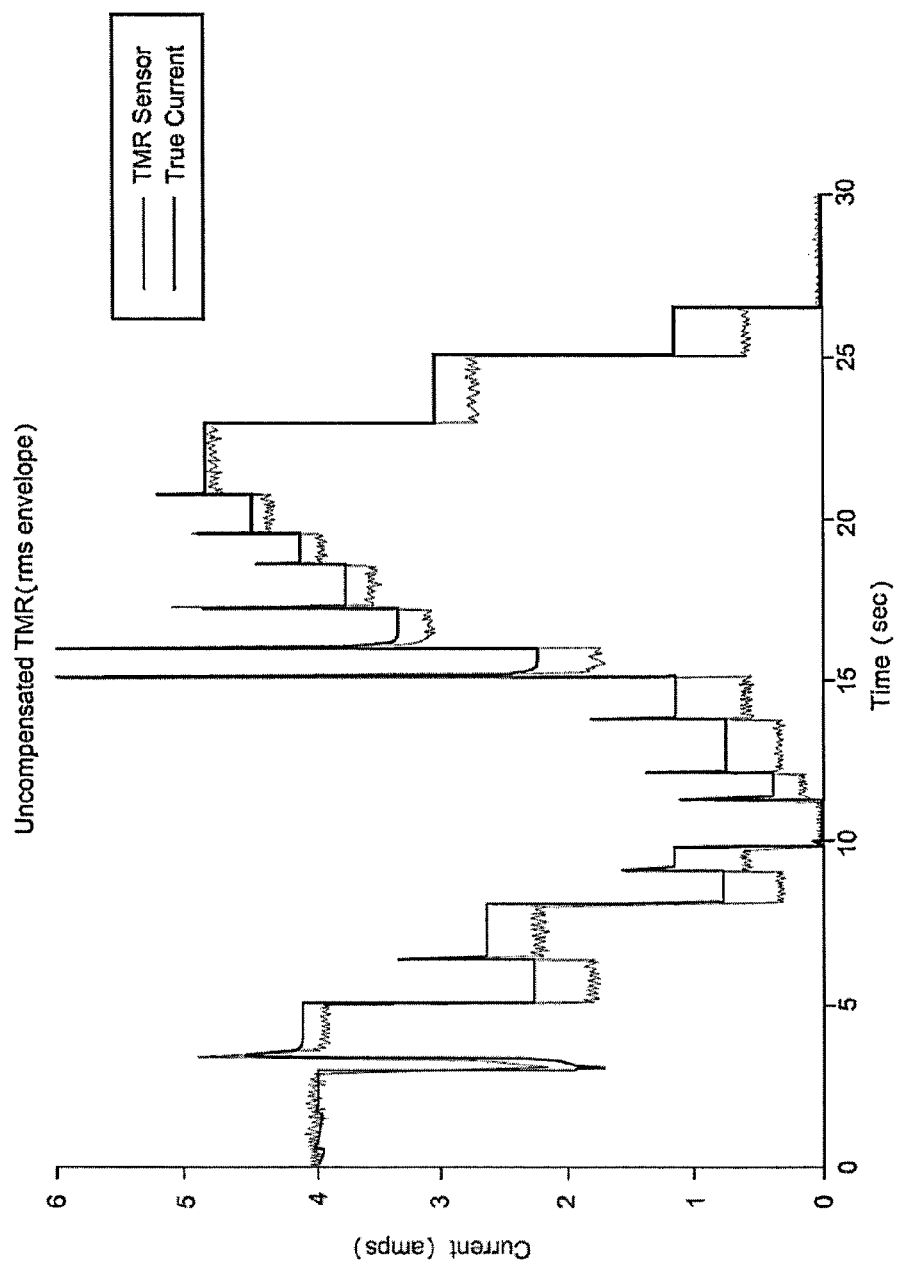
FIG. 6A shows a plot of uncompensated sensor output.

The harmonic distortion and saturation of the raw TMR output (after DC offset removal) without compensation using the coiled conductor 210 is evident in FIG. 6A, which shows an exemplary current waveform and measurement thereof. The incandescent bulbs have large inrush currents, and the correspondingly large magnetic fields saturate the sensor output. The harmonics introduced by the dimmers are distorted by the inherent frequency response of the TMR device.

Figure 6B:
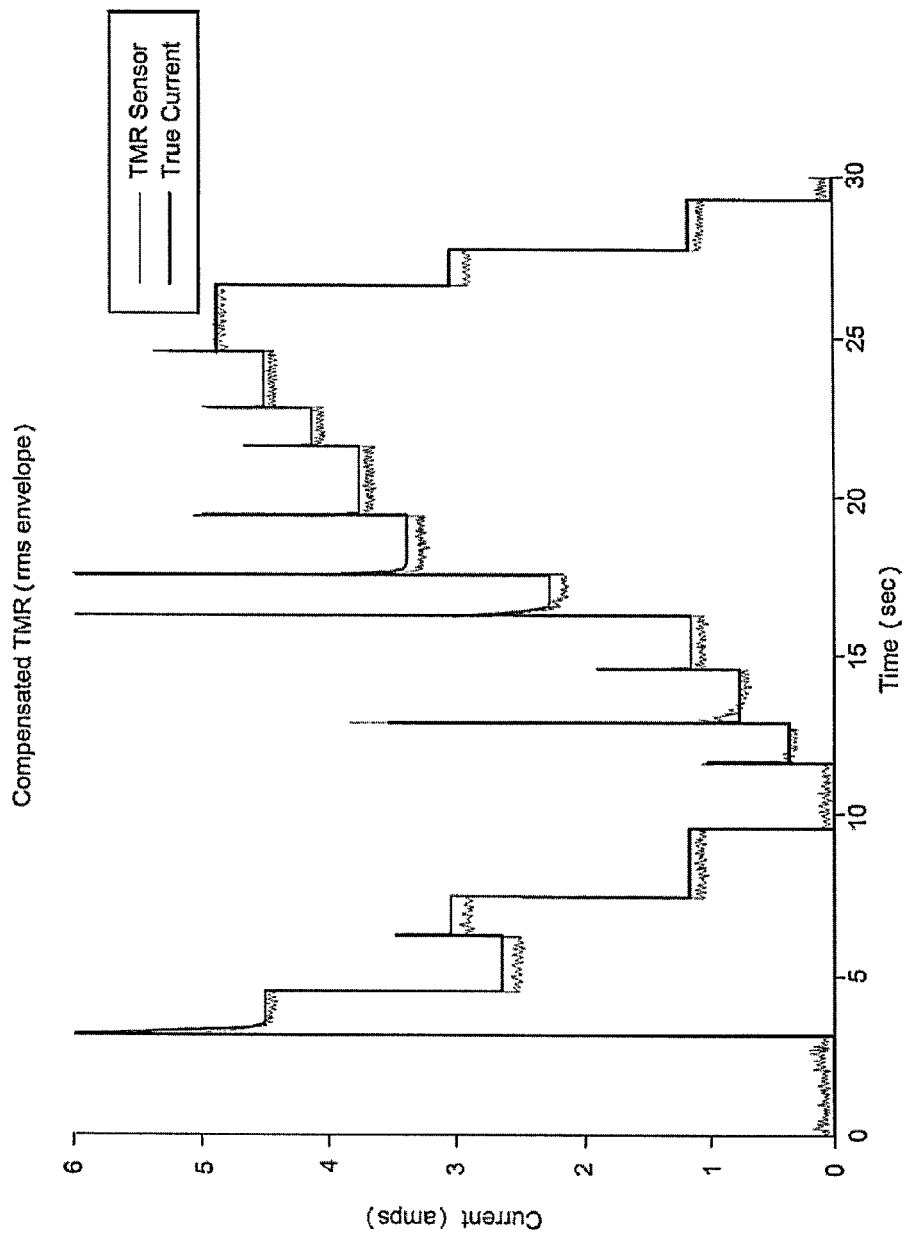
FIG. 6B shows a plot of compensated sensor output.

Using a coiled conductor 210 as described above to at least partially cancel the magnetic field at the TMR device 208 can maintain the TMR device 208 in its linear range of operation. A compensated signal S (shown FIG. 4) is plotted against $I_{source}$ in FIG. 6B. This figure shows that the metal breaker panel introduces some hysteresis but the output is linearly related to $I_{source}$, which is a desirable result.

Figure 7:
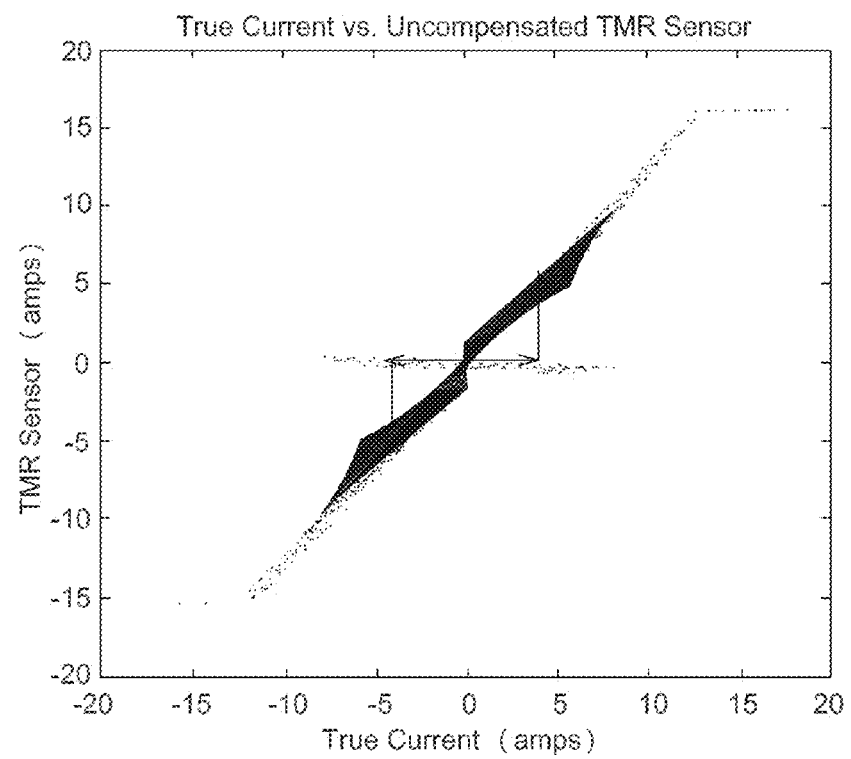
FIG. 7 shows a plot of current measured by the TMR device vs. the true current for an uncompensated TMR device.
Figure 8:
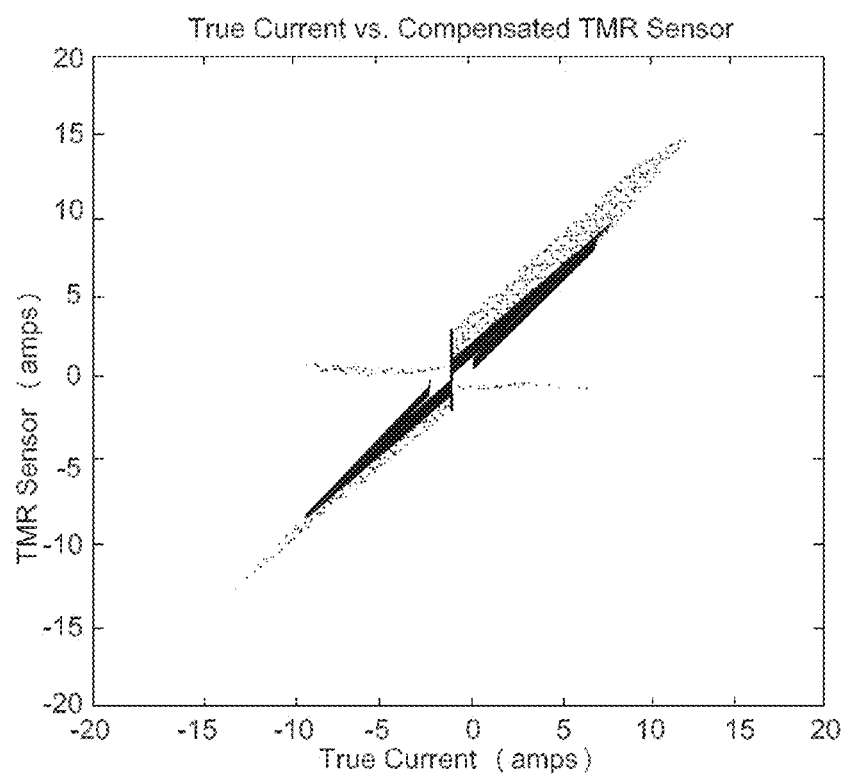
FIG. 8 shows a plot of the current measured by the TMR device vs. the true current for a TMR device that is compensated.

FIG. 7 shows a plot of current measured by the TMR device vs. the true current for an uncompensated TMR device. FIG. 8 shows a plot of the current measured by the TMR device vs. the true current for a TMR device that is compensated (e.g., biased into its linear range of operation) as described above. As can be seen from FIGS. 7 and 8, the compensated TMR device exhibits less hysteresis than that exhibited by the uncompensated TMR device.

Measuring Voltage

In some embodiments, the voltage of a conductor in a circuit breaker can be measured non-intrusively using an electric field sensor. Measuring the voltage can be performed in addition to measuring the current, in some embodiments. Accurately measuring the voltage and current of a circuit breaker allows quantifying real and reactive power consumption and, as will be discussed below, measuring voltage can help calibrate the current readings. The voltage at the circuit breaker can be measured by placing a conductive pickup in a position to capacitively sense the electric field produced by the conductor within the circuit breaker. The conductor within the circuit breaker is to thereby capacitively coupled to suitable sensor circuitry, e.g., an instrumentation amplifier. In some embodiments, analog circuitry may correct for the phase distortion created by the capacitive sensing.

Voltage can be sensed in a non-contact manner by positioning the conductive pickup, e.g., a metallic plate, close enough to the circuit breaker 104 such that the conductive pickup capacitively couples to the charged conductor 108 inside the circuit breaker 104. As shown in FIGS. 1D, 2A and 2B, sensor apparatus 110 may include an electric field sensor 204. Electric field sensor 204 may include a conductive pickup 601 and sensor circuitry 214 may be coupled to the conductive pickup 601 to process the detected signal.

Figure 9:
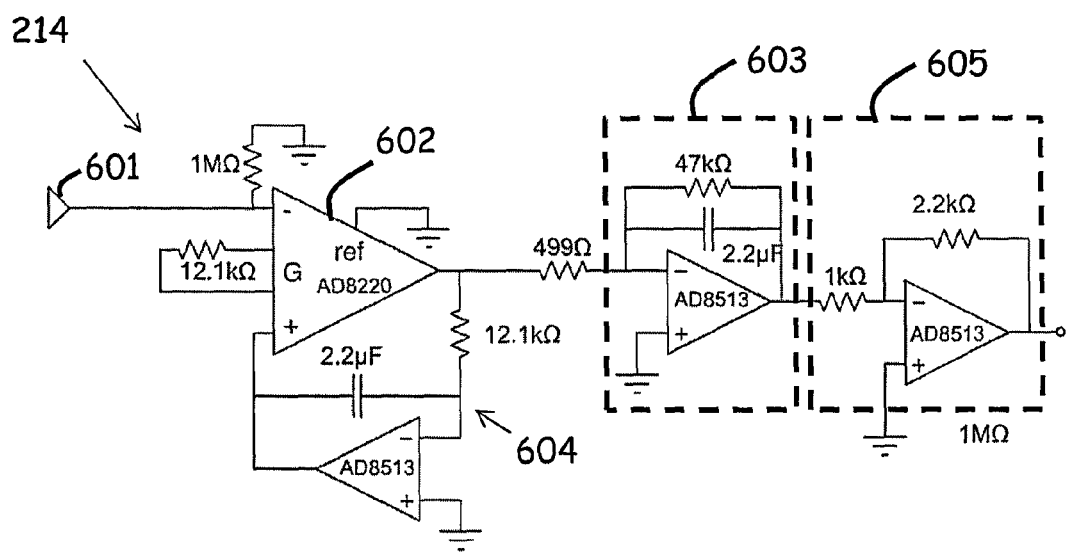
FIG. 9 shows a schematic of sensor circuitry for non-contact measurement of the circuit breaker voltage.

FIG. 9 shows a schematic of sensor circuitry 214 for non-contact measurement of the circuit breaker voltage, according to some embodiments. The input resistance to the sensor circuitry 214 is approximately the resistance from the conductive pickup 601 to ground since the nominal input resistance to the instrumentation amplifier 602 is orders of magnitude larger than the resistance of the resistor providing the input bias current. The transfer function for the input stage is a simple RC divider of the following form $$H(s) = \frac{sRC}{1+sRC}$$

Figure 31:
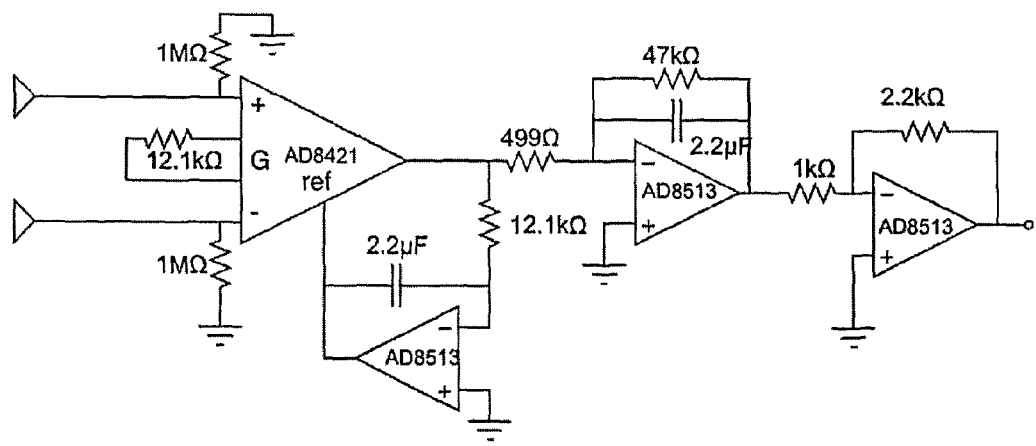
FIG. 31 shows a differential sensing circuit topology.
Figures 32A, 32B:
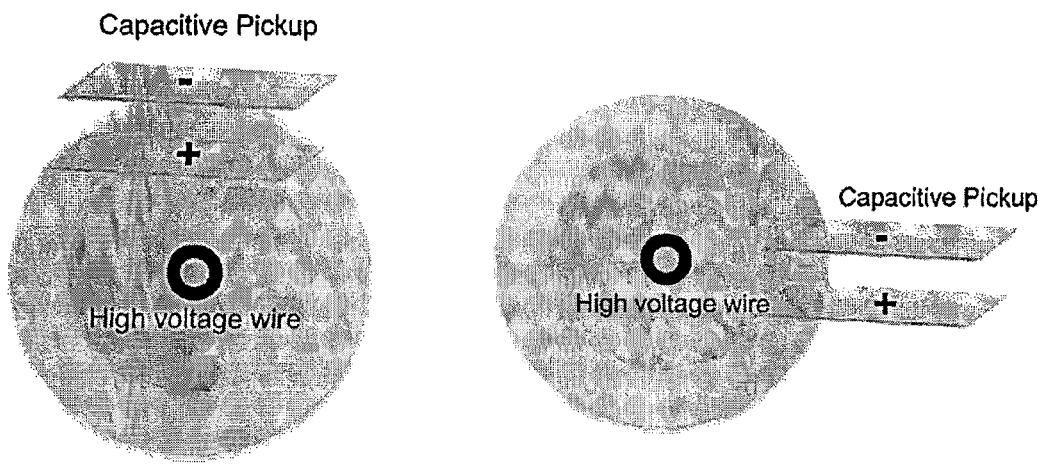
FIGS. 32A and 32B illustrate differential sensor operation in different positions.

The capacitance is very small, likely on the order of a few picofarads, so the quantity sRC<<1 and the transfer function reduces to sRC. This is a differentiator, so the input stage can be followed with an integrator 603. Additionally, a feedback loop 604 keeps the instrumentation amplifier 602 biased at the DC operating point on the conductive pickup 601. The negative input to the instrumentation amplifier 602 should not be at ground because the input bias current creates a voltage across the resistor to ground. Therefore, the positive input should be kept at some DC level, and this is maintained through feedback loop 604. The final stage 605 is a non-inverting gain amplifier, which may be of the same construction as that used for the current sensor circuitry 212. The electric field can be measured using a single ended topology but a differential design, as shown in FIG. 31, increases the performance with minimal increase in complexity. In an environment with many different high voltage conductors, a single foil pickup acts as an omnidirectional sensor. By using a differential setup the sensor can be directionally targeted to the region of interest. FIGS. 32A and 32B illustrate the differential sensor operation. Conductors directly below the sensor generate higher magnitude fields on the bottom plate than on the top plate while conductors to the sides of the sensor generate equal magnitude fields on both plates. The differential amplifier rejects the common mode signals providing selectively higher gain to conductors located below the sensor surface. However, the circuits illustrated in FIGS. 9 and 31 are merely examples of circuits that may be used for processing the signal from the conductive pickup 601, as the techniques described herein are not limited to the particular circuits illustrated in FIGS. 9 and 31.

Figure 10:
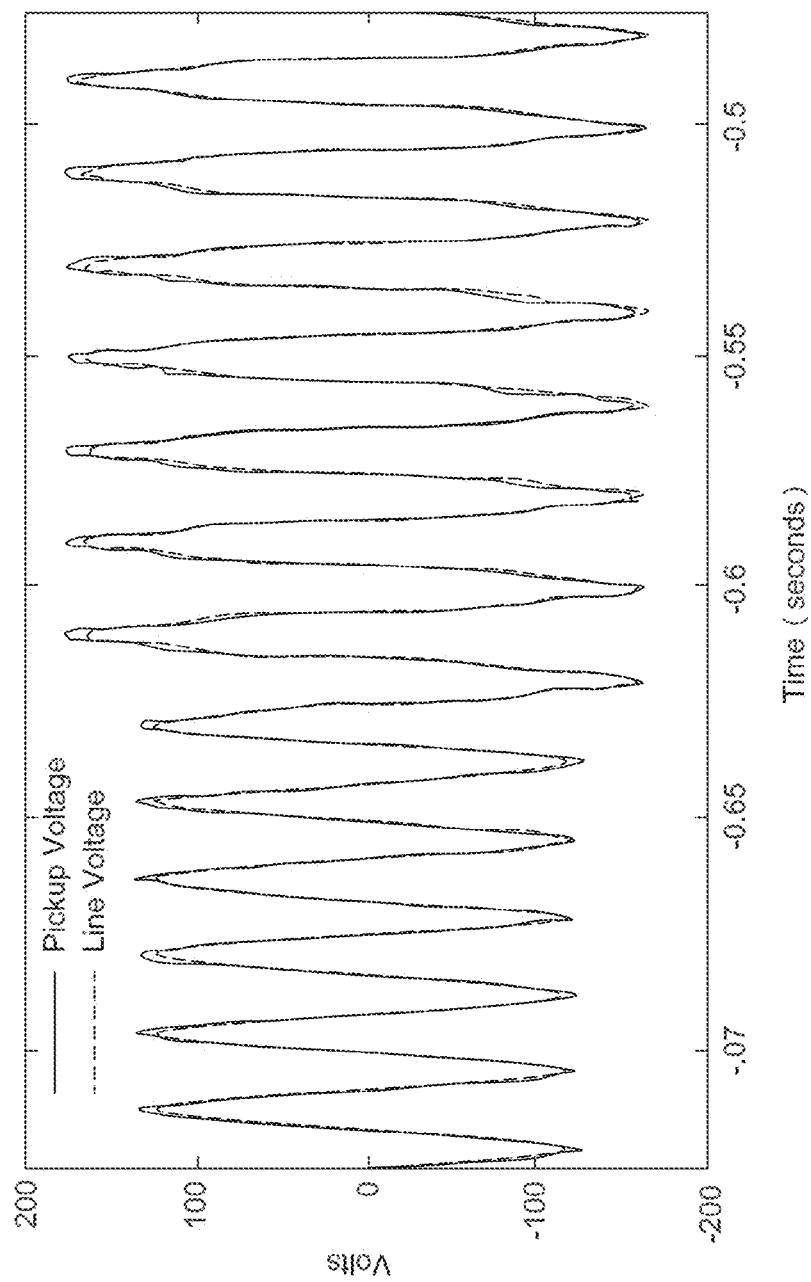
FIG. 10 shows the step response of the electric field sensor as measured at the output of the sensor circuitry.

The step response of the electric field sensor 204 as measured at the output of the sensor circuitry 214 is shown in FIG. 10. The utility's waveform has harmonic content which is faithfully reconstructed by the sensor circuitry 214.

Figure 17A:
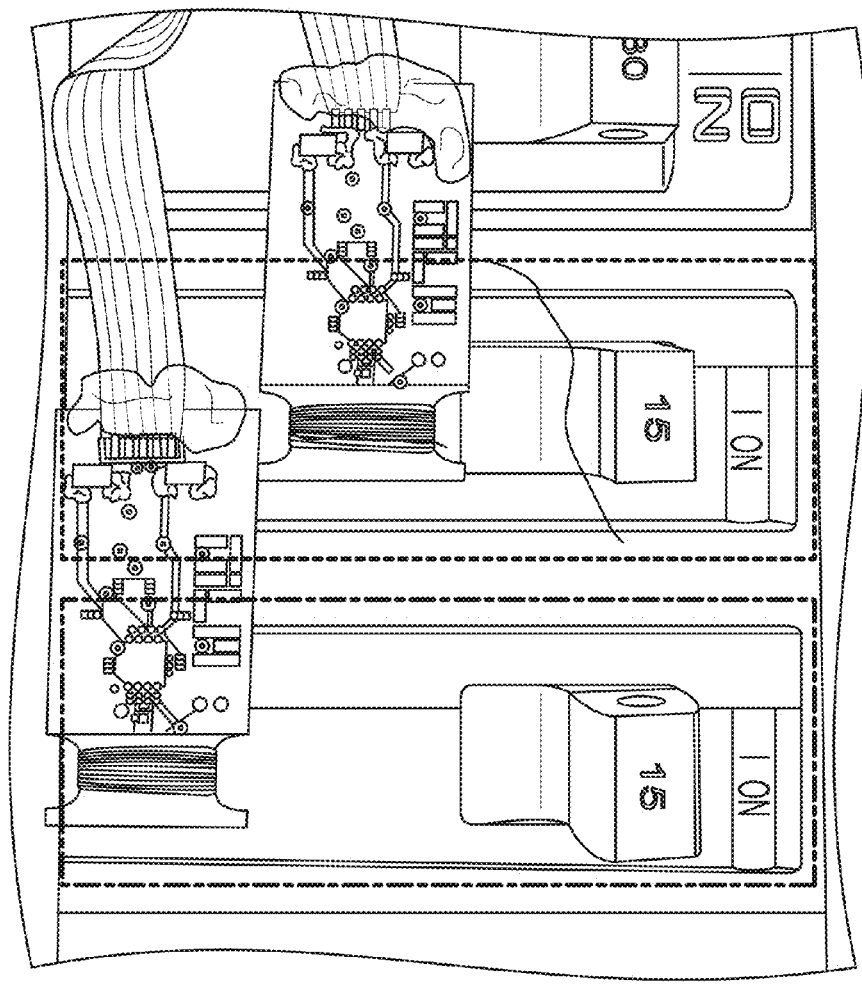
FIG. 17A shows a setup for measuring interfering fields on a standard home breaker panel.

In some embodiments, the conductive pickup 601 and the TMR device 208 may be collocated so the electric and magnetic field strengths can be localized accurately. In some embodiments, the conductive pickup 601 includes a copper foil plate which can be placed directly on the TMR device 208 since it does not interfere with the magnetic fields. The TMR device 208 and electric field sensor 204 may both be incorporated on a printed circuit board (PCB) that integrates the current and voltage sensing. Notches formed in the sides of the PCB may facilitate the winding of coiled conductor 210 around the TMR device 208, as illustrated in FIG. 17A.

Sensor Array

In some embodiments, an array of sensor apparatus may be used to detect fields produced by respective circuit breakers 104 of a circuit breaker panel 103. For example, an individual sensor apparatus 110 as described herein may be positioned at the face 109 of each circuit breaker 104 that is desired to be monitored or which may produce fields that interfere with measurements of other circuit breakers.

In some embodiments, the aggregate of the magnetic field measurements from each sensor apparatus can be processed by a reconstruction algorithm which calculates the current through each circuit breaker 104 based on magnetic field strengths measured to by each sensor apparatus, while compensating for magnetic fields produced by other circuit breakers. The current measurements can be used in conjunction with the non-contact voltage measurements taken at each sensor location, and the user can be provided with a complete power waveform for each breaker or conductor of interest.

The magnetic field sensor 202 and electric field sensor 204 discussed above can detect field strength. The electric and magnetic fields are linearly related to current and voltage by Maxwell's Equations but the scale factor depends on the geometry of the conductors, and in general should be calculated independently for each sensor. Recovering voltage and current is further complicated by interfering fields from nearby conductors.

Figure 33A:
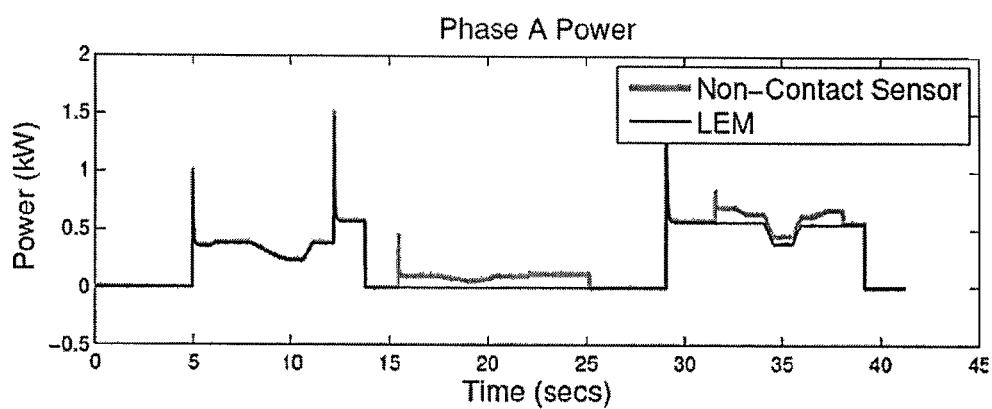
FIGS. 33A and 33B show plots of output of non-contact sensors to traditional LEM current sensors on two conductors in close proximity carrying different phases.
Figure 33B:
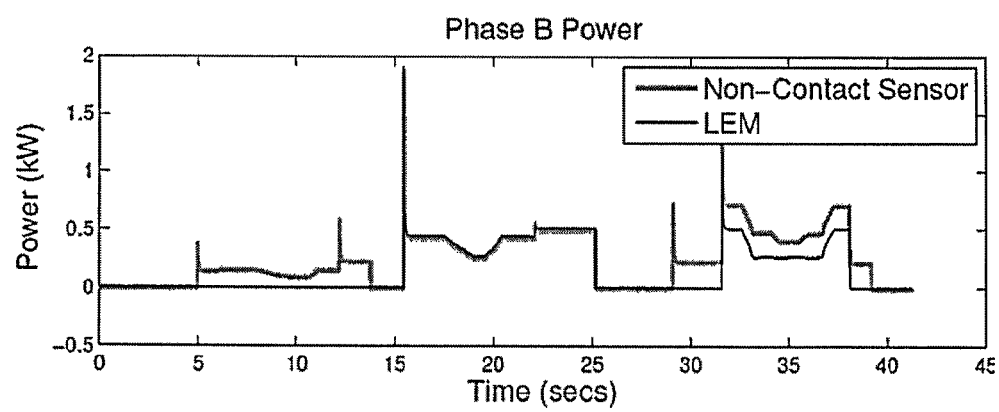

In many systems of interest there are multiple current-carrying conductors. If the magnetic fields of the conductors overlap, the output of any single non-contact sensor will be a combination of these fields, misrepresenting the current flowing in the nominal conductor of interest. FIGS. 33A and 33B compare the output of non-contact sensors to traditional LEM current sensors on two conductors in close proximity. Each non-contact sensor picks up significant interference from current in the neighboring conductor. This section introduces techniques to accurately measure individual currents with non-contact sensors in environments with complex, superposed magnetic fields.

1.1 Monitoring a Circuit Breaker Panel

Due to the close proximity of circuits on a breaker panel and the steel construction of the panel itself, the magnetic fields are often fully mixed so that any single sensor detects some portion of every current flowing through the panel or cable. Even if a precise location for minimal interference could be determined, the narrow dimensions of many breaker panels limit placement options as seen in FIG. 17A. Assuming the breaker currents are linearly independent, N sensors are needed to measure N breakers. The $n^{th}$ sensor output for an N breaker panel can be expressed as:

$$S_n = M_1 I_1 + M_2 I_2 + \ldots + M_N I_N \quad (1)$$

Or, equivalently using the inverse relationship, for N sensors, the $n^{th}$ breaker current can be expressed as:

$$I_n = K_1 S_1 + K_2 S_2 + \ldots + K_N S_N \quad (2)$$

The full system can be expressed in matrix form where the current flowing in the breaker directly under each sensor is represented by the diagonal K values and the interference terms are the off-diagonal K's.

$$\begin{bmatrix} I_1 \\ I_2 \\ I_3 \\ \vdots \end{bmatrix} = \begin{bmatrix} K_{11} & K_{12} & K_{13} & \\ K_{21} & K_{22} & K_{23} & \\ K_{31} & K_{32} & K_{33} & \ldots \\ & \vdots & & \end{bmatrix} \times \begin{bmatrix} S_1 \\ S_2 \\ S_3 \\ \vdots \end{bmatrix} \quad (3)$$

1.2 Monitoring Cables with Neutral Return Path

The equations are slightly different for a multiple conductor power cables. These systems do not have fully independent conductors and are subject to the additional constraint of Kirchoff's Current Law (KCL):

$$I_1 + I_2 + I_3 + \ldots + I_{neutral} = 0 \quad (4)$$

This equation reduces the dimension of the solution space. Standard power cables have only two current-carrying wires—hot and neutral. In this simple case only a single sensor is needed. The equations to find current are:

$$I_{hot} = KS$$

$$I_{neutral} = -I_{hot} \quad (5)$$

The same technique can be extended for multiple phases and a common neutral. For a three phase power cable, such as the one shown in FIG. 35, there are four current carrying wires so the full matrix has 16 elements but KCL reduces the number of unknown currents by one. A nine element matrix using only three sensors is enough to determine all the currents. The equations for a three phase power cable are:

$$\begin{bmatrix} I_1 \\ I_2 \\ I_3 \end{bmatrix} = \begin{bmatrix} K_{11} & K_{12} & K_{13} \\ K_{21} & K_{22} & K_{23} \\ K_{31} & K_{32} & K_{33} \end{bmatrix} \times \begin{bmatrix} S_1 \\ S_2 \\ S_3 \end{bmatrix} \quad (6)$$

$$I_{neutral} = -(I_1 + I_2 + I_3)$$

1.3 Example 3 Phase Monitoring

Figure 35:
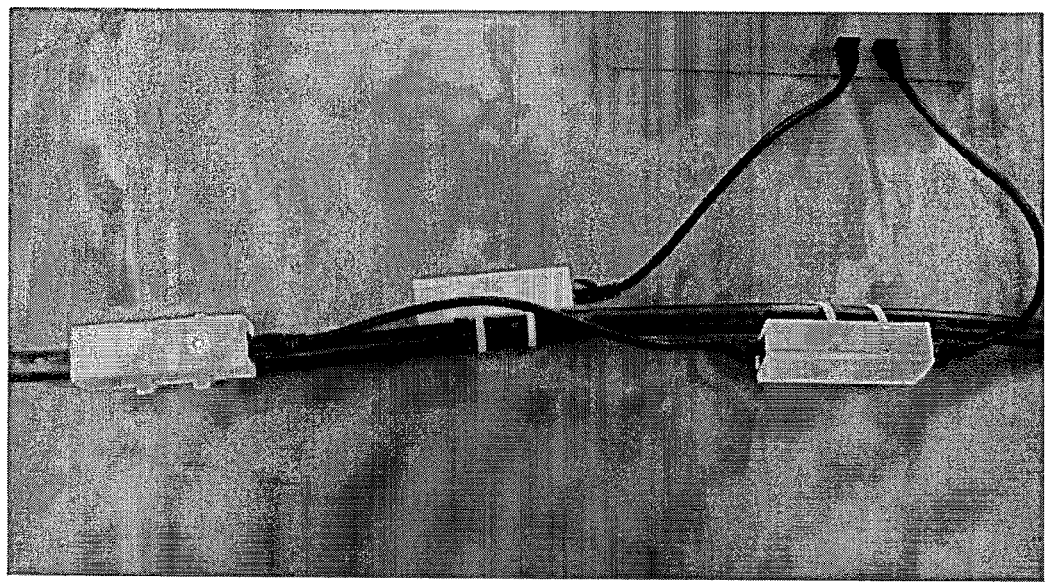
FIG. 35 illustrates sensing fields from a multiconductor cable using a plurality of sensor apparatus.
Figure 36:
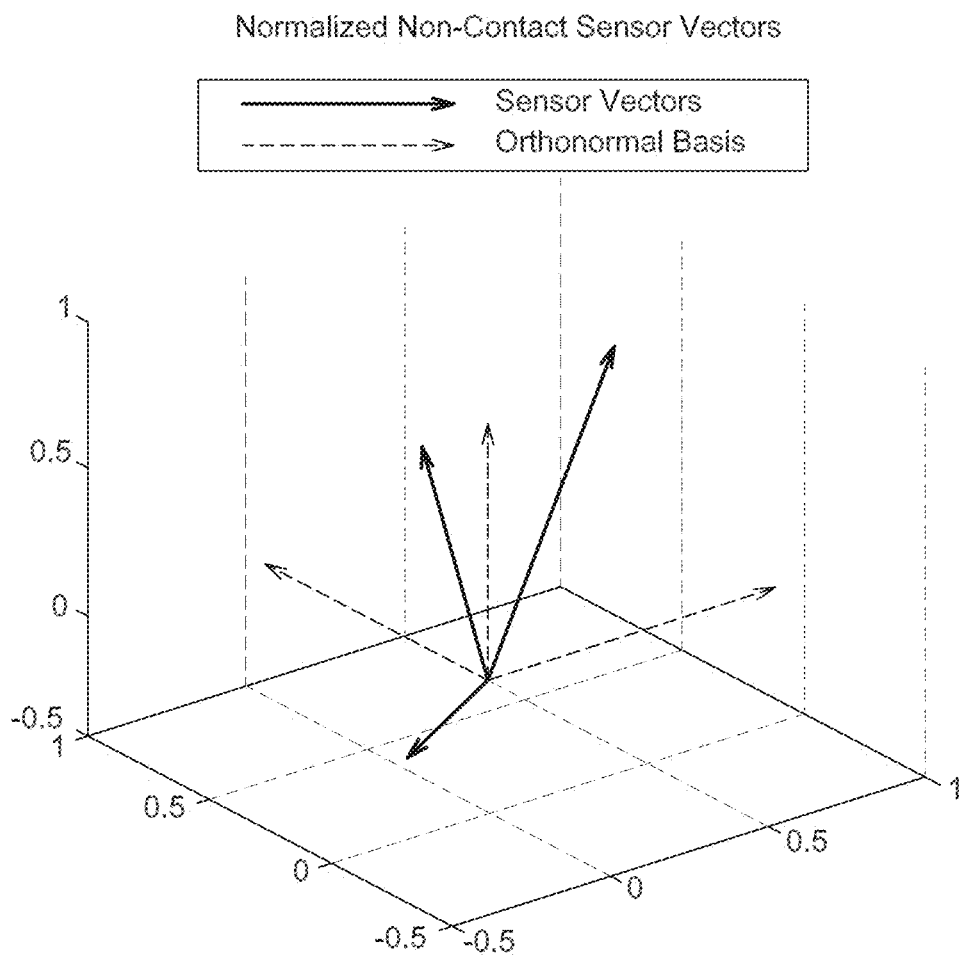
FIG. 36 shows a visualization of the sensor vectors.
Figure 37:
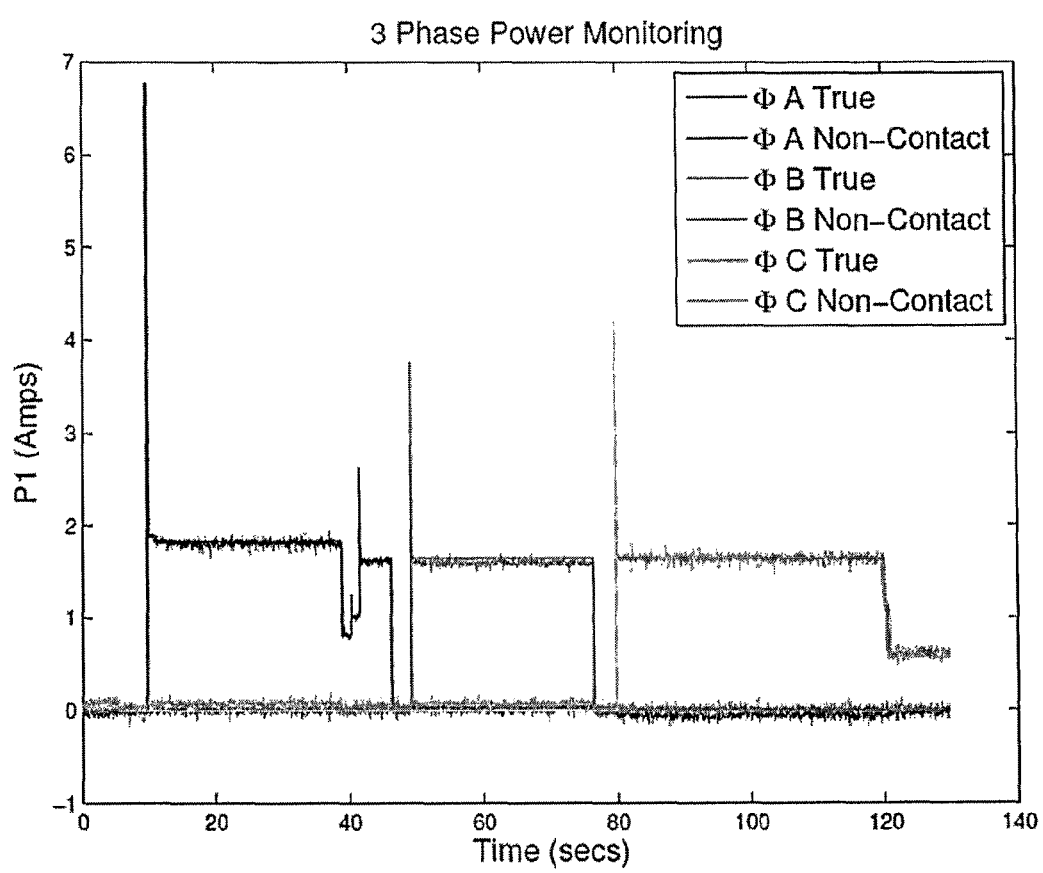
FIG. 37 shows a comparison between standard current sensors and the non-contact sensors for loads on three phases.

In FIG. 35, three non-contact sensor prototypes are mounted with custom enclosures to a three phase power cable. The close proximity of the conductors causes significant overlap in the magnetic fields outside the cable. A visualization of the sensor vectors is shown in FIG. 36. The "traditional" current sensors form an orthonormal basis shown in dashed lines. Despite the mixed fields, the non-contact sensors are still linearly independent and span R3. Applying the fit matrix [K] to the sensor output accurately reconstructs the line currents. FIG. 37 shows a comparison between standard current sensors and the non-contact sensors for loads on all three phases.

2 System Calibration

Equations (3, 5, 6) can calculate all currents of interest in complex systems, but they cannot be used until the K values in the fit matrix are determined. If only one current is present, the calibration matrix reduces to a set of equations relating the current to a specific sensor:

$$\begin{bmatrix} S_1 \\ S_2 \\ S_3 \\ \vdots \end{bmatrix} = \begin{bmatrix} M_{11} & M_{12} & M_{13} & \\ M_{21} & M_{22} & M_{23} & \\ M_{31} & M_{32} & M_{33} & \ldots \\ & \vdots & & \end{bmatrix} \times \begin{bmatrix} I_1 \\ 0 \\ 0 \\ \vdots \end{bmatrix} \quad (7)$$

$$\Downarrow$$

$$\begin{aligned} S_1 &= M_{11} I_1 \\ S_2 &= M_{21} I_1 \\ S_3 &= M_{31} I_1 \\ &\vdots \end{aligned}$$

Iterating with a known current on each conductor produces the full matrix [M]. The fit matrix can be found as $$[K] = [M]^{-1} \quad (8)$$

While technically correct, this method places a burden on the user to first shut down all connected loads and then connect a single known load to each conductor in sequence. If the system of interest is a circuit breaker panel this type of calibration is unrealistic—a homeowner or facilities manager is unlikely to shut off the power and walk around in the dark connecting test loads. In environments with mission critical equipment, such as a microgrid on an Army Forward Operating Base (FOB), this type of calibration may not be possible.

Figure 38:
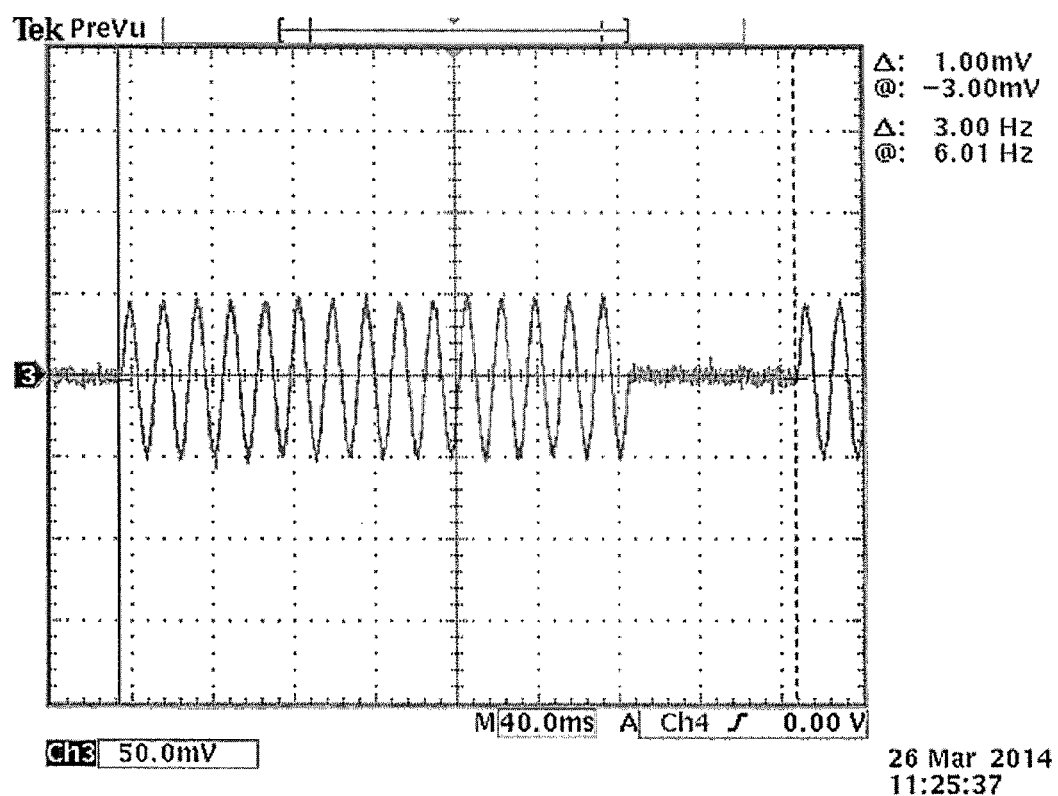
FIG. 38 illustrates an exemplary PWM frequency of 3 Hz.

In order to calculate the elements of the [M] matrix without interrupting service, a known current may be separated from the background environment. This can be done by applying pulse width modulation (PWM) to a calibration load to create an identifiable pattern in the current waveform. There are a variety of methods to design a PWM load. An exemplary calibration load tracks the input voltage and draws power for 15 out of every 20 line cycles generating a 75% duty cycle. On a 60 Hz service this corresponds to a PWM frequency of 3 Hz as shown in FIG. 38. Assuming there are no other significant loads cycling at 3 Hz, the calibration load can be differentiated from the background environment using spectral analysis. A complete calibration procedure using this PWM load is developed first for a single phase system and then extended for multiphase systems.

2.1 Single Phase Systems

Input from the non-contact sensors is fed into a preprocessing algorithm which calculates real and reactive current flow. The preprocessor uses the zero crossings of the voltage waveform to compute estimates of real (P) and reactive (Q) current each line cycle. If all conductors are on the same phase (as in the case of a single phase breaker panel), then the zero crossings of the line voltage correspond exactly to the zero crossings of the non-contact voltage sensors. The calibration load is resistive, drawing purely real power, so only the P output of the preprocessor is used for the calibration procedure. The preprocessor computes P and Q each line cycle and the calibrator PWM waveform is also defined by line cycles (rather than absolute frequency) which allows the same calibration procedure to be performed on both 50 and 60 Hz services and is also robust against line frequency variation during calibration.

The real component of the preprocessor output for the calibration load can be defined as follows:

$$P_{cal}[n] = \begin{cases} I_{cal}, & |n| \leq |7| \\ 0, & 7 < |n| \leq 10 \end{cases} \quad (9)$$

and $$P_{cal}[n+20] = P_{cal}[n]$$

where $I_{cal}$ is the known current draw of the calibration load. The non-contact sensor response can be expressed as:

$$P_{nc}[n] = S(P_{cal} + P_{bkgd}) \quad (10)$$

where S is the unknown scale factor representing the sensor's response to the calibration load and $P_{bkgd}$ is the current drawn by other loads in the system. The goal of this analysis is to find the value of S. This scale factor is the entry $M_{xy}$ in the [M] matrix for sensor x with the calibrator connected to conductor y.

First $P_{bkgd}$ is removed from the signal. At the harmonics of the calibration waveform, $P_{bkgd}$ is 0 based on the assumption that the calibrator is the dominant load at its PWM frequency. Using the Discrete Fourier Transform (DFT) defined as:

$$\hat{x}[k] = \frac{1}{N}\sum_{n=0}^{N-1} x[n]e^{-2\pi j \frac{kn}{N}} \quad (11)$$

and only considering k's corresponding to harmonics of $P_{cal}$, the non-contact sensor can be represented in the frequency domain as:

$$\hat{P}_{nc}[k] = S\mathcal{F}\{P_{cal}[n]\} \quad (12)$$

By comparing the fundamental component of the measured signal, $P_{nc}$, to the fundamental component of the known signal, $P_{cal}$, it is possible to calculate the coefficient S.

The Fourier Series coefficients of a unit amplitude periodic rectangular pulse are:

$$a_k = \frac{\sin\left[(2\pi k/N)\left(N_1 + \frac{1}{2}\right)\right]}{N\sin[2\pi k/2N]}, k \neq 0, \pm N, \pm 2N, \ldots \quad (13)$$

$$a_k = \frac{2N_1 + 1}{N}, \quad k = 0, \pm N, \pm 2N, \ldots \quad (14)$$

With the parameters of the calibration load defined in Eq 9, the coefficient of the fundamental of $P_{cal}$ is:

$$a_1 = I_{cal}\frac{\sin[\pi/4]}{20\sin[\pi/20]} \quad (15)$$

Using a 200 point rectangular window to compute the DFT, the fundamental of $P_{nc}$ is $\hat{P}_{nc}[10]$. This yields an expression for S:

$$|\hat{P}_{nc}[10]| = Sa_1 \quad (16)$$

The magnitude of $\hat{P}_{nc}$ is used in Eq 16 because the calibration waveform detected by the pickup is actually $P_{cal}[n+n_0]$ where $n_0$ is an uncontrolled time shift due to the fact that the calibration load is not time aligned with the sampling interval. This time shift becomes a phase shift in the frequency domain making $\hat{P}_{nc}[10]$ complex:

$$\hat{P}_{nc}[k] = \hat{P}_{cal}[k]e^{-jk(2\pi/20)n_0} \quad (17)$$

$$= \hat{P}_{cal}[k]e^{-jk\Phi} \quad (18)$$

where $\Phi$ is an unknown phase shift. The sign of S can still be recovered despite this phase shift by comparing the phase of the harmonics of $P_{nc}$. The first two terms of a generic Fourier Series are:

$$a_1 e^{j\Phi} + a_2 e^{j2\Phi} \quad (19)$$

The phase difference between these two terms is:

$$\angle a_2 - 2\times\angle a_1 \quad (20)$$

Substituting in the phases for each coefficient yields:

$$2\Phi - 2(\Phi) = 0$$

If the pickup has a negative response to the calibration load the first two terms of the Fourier Series would instead be:

$$-a_1 e^{j\Phi} - a_2 e^{j2\Phi}$$

expressing the negative signs as $e^{j\pi}$ the phase difference is:

$$\pi + 2\Phi - 2(\pi + \Phi) = -\pi$$

Therefore if the phase difference between the first two terms of the Fourier Series is $\pi$ then the sign of S is negative. If the difference is 0, S is positive. Thus the finally expression for S incorporating both magnitude and sign is:

$$S = \begin{cases} \dfrac{|\hat{P}_{nc}[10]|}{a_1}, & \angle a_{nc_2} - 2\angle a_{nc_1} = 0 \\ -\dfrac{|\hat{P}_{nc}[10]|}{a_1}, & \angle a_{nc_2} - 2\angle a_{nc_1} = \pi \end{cases} \quad (21)$$

and using a 200 point DFT, $a_{nc_1} = \hat{P}_{nc}[10]$ and $a_{nc_2} = \hat{P}_{nc}[20]$.

This analysis relies on the presence of even harmonics in $P_{cal}$. In the case of a symmetric waveform with no even harmonics the phase difference is not an effective discriminant and the sign of S cannot be recovered. To see why this is the case consider the first two non-zero terms of the Fourier Series for a symmetric waveform:

positive: $a_1 e^{j\Phi} + a_3 e^{j3\Phi}$ negative: $-a_1 e^{j\Phi} - a_3 e^{j3\Phi}$ The phase differences between the fundamental and the third harmonic is:

$$\angle a_3 - 3\times\angle a_1$$

Substituting in the phases for each coefficient yields:

positive: $3\Phi - 3(\Phi) = 0$ negative: $\pi + 3\Phi - 3(\pi + \Phi) = 2\pi = 0$ There is no difference between the phases in either the positive or negative wave-form. Intuitively this makes sense because the polarity of a symmetric waveform is ambiguous without a DC component ($a_0$). This is why the calibration load has a PWM duty cycle of 75% rather than 50%.

2.2 Multiphase Systems

The principal complication in multiphase systems is accurately detecting the line voltage phases. In a single phase system the non-contact voltage sensor has the same phase as the line voltage. In a multiphase environment this is not necessarily the case. Consider the output of a non-contact voltage sensor in a three phase system:

$$v_{nc}[n]=S_1v_1+S_2v_2+S_3v_3 \tag{22}$$

The phases are all sinusoids of the same frequency $\omega$ so this equation can be written using complex exponentials as:

$$v_{nc}[n] = \mathcal{R}\{S_1 V_1 e^{j\omega t} + S_2 V_2 e^{j\omega t+\Phi_2} + S_3 V_3 e^{j\omega t+\Phi_3}\} \tag{23}$$

While not a requirement, the analysis is cleaner assuming (as is often the case) that the phases have the same amplitude V:

$$v_{nc}[n]= \mathcal{R} \{Ve^{j\omega t}(S_1 e^{j0}+S_2 e^{j\varphi 2}+S_2 e^{j\varphi 3})\} \tag{24}$$

The sum of $S_n e^{j\varphi n}$ terms can be represented as a single complex exponential:

$$v_{nc}[n] = \mathcal{R}\{Ve^{j\omega t}Se^{j\Phi}\} \tag{25}$$

$$= \mathcal{R}\{Ae^{j\omega t+\Phi}\} \tag{26}$$

where A is the amplitude of the non-contact sensor output. Assuming the line voltage amplitude V is a known constant, the output of a single non-contact voltage sensor is sufficient to fully reconstruct all phase voltages:

$$v_1[n] = v_{nc}[n]\left(\frac{V}{A}e^{j\phi_1}\right) \tag{27}$$

$$v_2[n] = v_{nc}[n]\left(\frac{V}{A}e^{j\phi_2}\right) \tag{28}$$

$$v_3[n] = v_{nc}[n]\left(\frac{V}{A}e^{j\phi_3}\right) \tag{29}$$

The only unknowns are the phase correction terms $\varphi_n$, which can be calculated using the calibration load. The calibration load draws only real power so the output of the preprocessor at the PWM frequency should be all P and no Q. However, a misalignment between the line phase and the phase of the non-contact sensor will cause the preprocessor to compute a different ratio of P and Q. The correction factor $\varphi_n$ is the rotation required to produce all P and zero Q. This is simply the negative of the power factor angle calculated by the preprocessor:

$$\phi = -\tan^{-1}\left(\frac{Q_{nc}}{P_{nc}}\right) \tag{30}$$

Due to the interference of background loads, the computation is only correct at the PWM frequency and its harmonics. Using a 200 point DFT, and evaluating the fundamental of P and Q gives the following equation for $\varphi$:

$$\phi = \tan^{-1}\left(\frac{\hat{Q}_{nc}[10]}{\hat{P}_{nc}[10]}\right) \tag{31}$$

Once the voltage waveforms for each phase are known, the calibration procedure to find the S coefficients for the non-contact current sensors is identical to the single phase procedure described previously.

2.3 Rapid Calibration

To more efficiently compute the fit matrix in a multi-conductor system, calibration loads can be connected to each phase and run simultaneously. This is advantageous when multiple phases are available at a single point such as the 240V dryer outlets in residential environments and three phase outlets in industrial environments. Simultaneous calibration may necessitate that each load toggle at a distinct frequency such as 0.5 Hz, 3 Hz, and 7 Hz so that the Fourier coefficients of the fundamentals do not interfere and their harmonics do not overlap.

Alternate Reconstruction Algorithm

Figure 11:
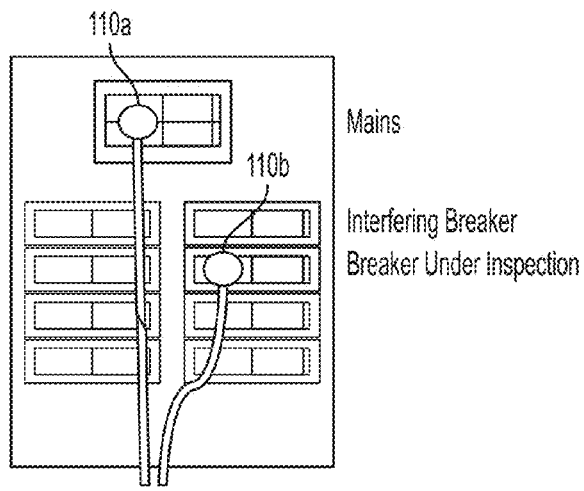
FIG. 11 shows the placement of sensors suitable for use with an alternative reconstruction technique.

In certain situations it is possible to recover the true current flowing through a breaker without applying sensors to every breaker on the panel. In particular, if the loads are known to vary substantially as step functions, a sensor placed on the mains circuit and on the breaker of interest is sufficient to monitor the current through the breaker of interest even if numerous other breakers on the panel are generating interfering fields. FIG. 11 shows the placement of sensors 110a and 110b for this alternative reconstruction technique.

Figure 12:
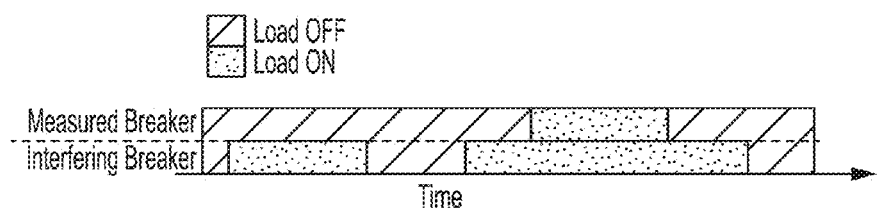
FIG. 12 shows the timing of operations for an experiment using the alternative reconstruction technique.
Figure 13:
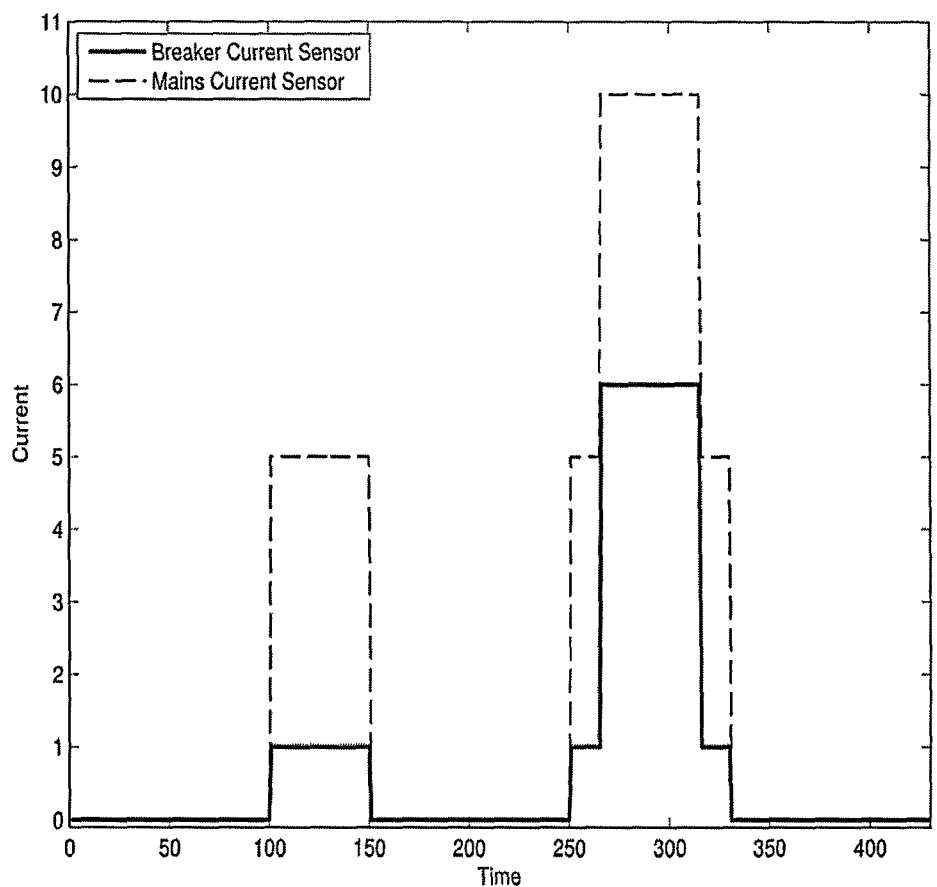
FIG. 13 shows the output of the sensors for the experiment using the alternative reconstruction technique.

A simulated example referencing the layout of FIG. 11 will illustrate the steps to recover current flowing in a single breaker when interfering breakers contribute to the sensor's reading. For the sake of simplicity, assume there are only two loads connected to the panel. Each load is identical and is either on or off (e.g. a light bulb). One load is connected to the breaker under inspection and the other is connected to a neighboring breaker (hereafter referred to as the interfering load). The simulated experiment is conducted as follows:
  1. The interfering load is started
  2. The interfering load is stopped.
  3. The interfering load is started again
  4. The load under inspection is started
  5. The load under inspection is stopped
  6. The interfering load is stopped This timing of the above operations is illustrated in FIG. 12. The output from the sensors is shown in FIG. 13.

The sensor output shows the effects of interference from the nearby breaker. Here, the interference is about 10%: a level that is not unreasonable in practice. The correct current flowing through the breaker of interest is a single step but the interfering load adds a spurious transient and complicates the true transient with additional artifacts. The challenge is to recover the correct current waveform using only the output from the two sensors 110a and 110b. This can be performed by processing the derivatives of the sensor outputs.

A first step is to create diff streams for both sensors. The diff operation is defined as the following:

$$\text{diff}(s[n])\equiv s[n]-s[n-1]$$

Figure 14A:
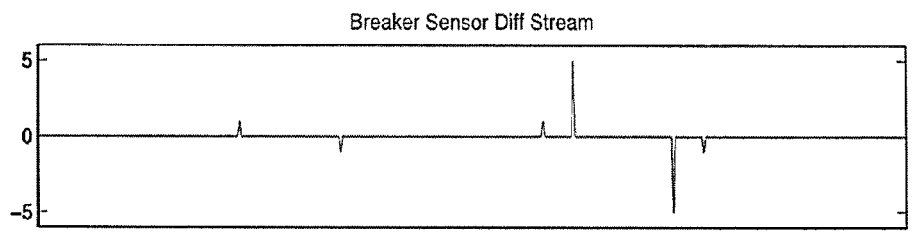
FIG. 14A shows the breaker sensor diff stream.
Figure 14B:
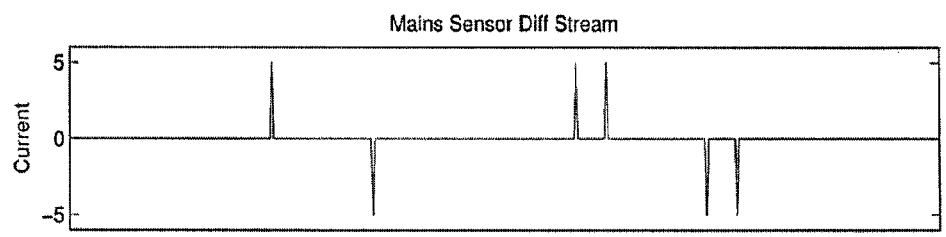
FIG. 14B shows the mains sensor diff stream.
Figure 14C:
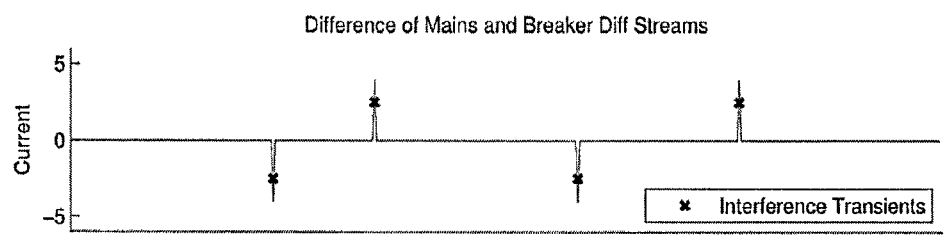
FIG. 14C shows the difference between the two breaker sensor diff stream and the mains sensor diff stream.

The diff stream of the breaker sensor is subtracted from the diff stream of the mains sensor and the resulting stream is only nonzero when an interfering transient occurs. This sequence of operations is shown in FIGS. 14A-C.

Figure 15:
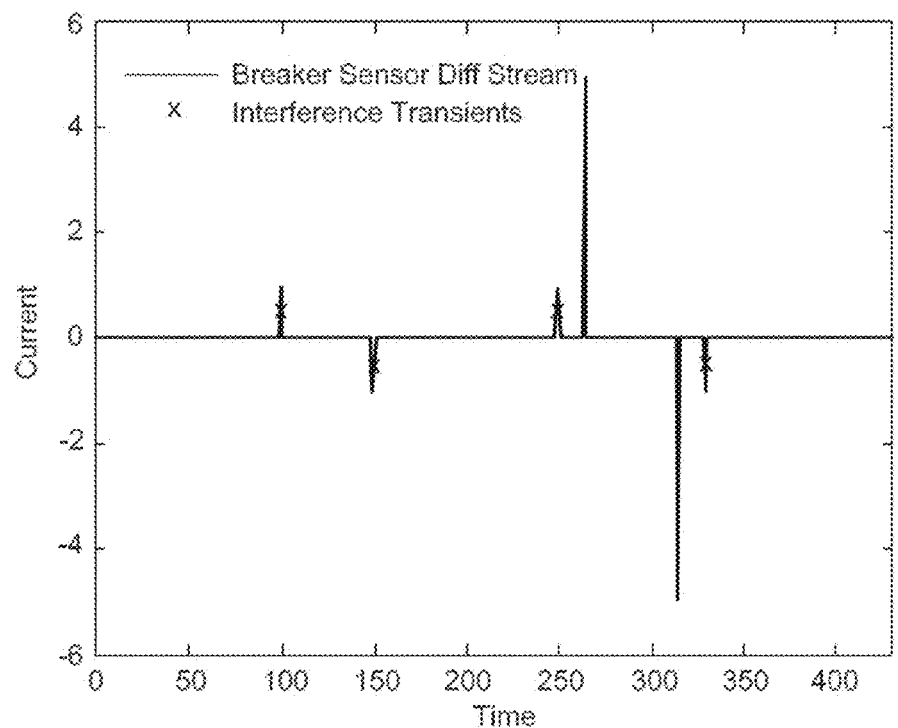
FIG. 15 shows the identified interference impulses.

The indices of interfering transients are now known and the diff stream from the breaker sensor is corrected by setting the interference impulses to zero, as shown in FIG. 15.

After actively suppressing the interfering impulses the diff stream is cumulatively summed to reconstruct the true current flowing through the breaker of interest. The cumulative sum is defined as:

$$\text{cumsum}(s[n]) = s[n] + s[n-1]$$

$$\text{cumsum}(s[0]) = 0$$

Figure 16:
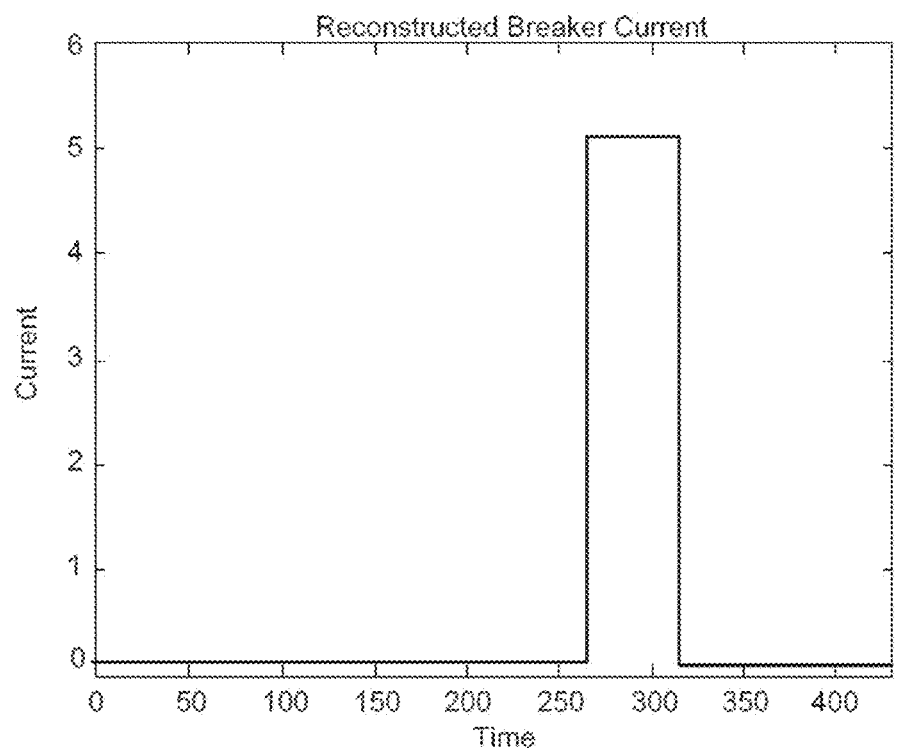
FIG. 16 shows the reconstructed output of the sensors with interference removed.

The reconstructed output is shown in FIG. 16. The output is now free of interference and shows the correct amount of current flowing through the breaker of interest.

Sensor Placement

While the reconstruction algorithms presented above do not require any specific sensor placement, positioning the sensor apparatus 110 as close as possible to the conductor 108 of interest can reduce the off-diagonal components of the interference matrix. The point of closest approach to the conductor 108 is not apparent from the surface of the breaker panel, as the position/rotation of conductors inside a cable is obscured and visually can only be determined by breaking the outer insulation.

Using sensor apparatus 110 we can find a suitable and even an optimal placement non-intrusively by sensing the electric field. Most utilities can provide a voltage independent of the attached load, so while the electric fields do interfere, they are all of the same strength for a given distance from a conductor, and therefore the electric field will be largest adjacent to a charged conductor. A suitable position for sensor apparatus 110 may be the location of the local maxima of the electric field.

In some embodiments, sensor apparatus 110 may include a position indicator device 216 for indicating to a user information regarding the electric field measured by the electric field sensor 204, as illustrated in FIG. 2B. Position indicator device 216 may provide any type of indication perceptible to a human, such as an audible or visual indication, based on the electric field sensed by the electric field sensor 204. As one example, the position indicator device 216 may indicate to the user the measured strength of the electric field. The user may move the sensor apparatus 110 until the user identifies the position of highest indicated electric field strength. As another example, the position indicator device 216 may be configured to provide an indication to the user when the position of maximum electric field strength is reached. As a further example, the position indicator device 216 may be configured to provide an indication to the user of a direction in which the sensor apparatus 110 should be moved to reach a location with higher electric field strength. For example, a cross-shaped pattern of lights on the sensor array 110 may illuminate to guide the user to position the sensor apparatus 110 in a suitable position. If indicated visually, one or more LEDs (light emitting diodes) or other types of lights on the sensor apparatus 110 may be used to provide the indication to a user. However, the techniques described herein are not limited in this respect, as a visual indication may be provided in another manner, such as using a display provided on the sensor apparatus 110 or on another device (e.g., a monitoring/processing unit connected to sensor apparatus 110), or the indication can be provided audibly.

In some embodiments, an electric field sensor can be used to determine information about the conductor(s) in a cable. Since a conductor at a fixed voltage produces a constant electric field, in multi-conductor cables the number and relative position of the conductors in the cable can be determined by recording the location and number of local electric field maxima.

Demonstration of Non-Contact Sensing

Figure 17B:
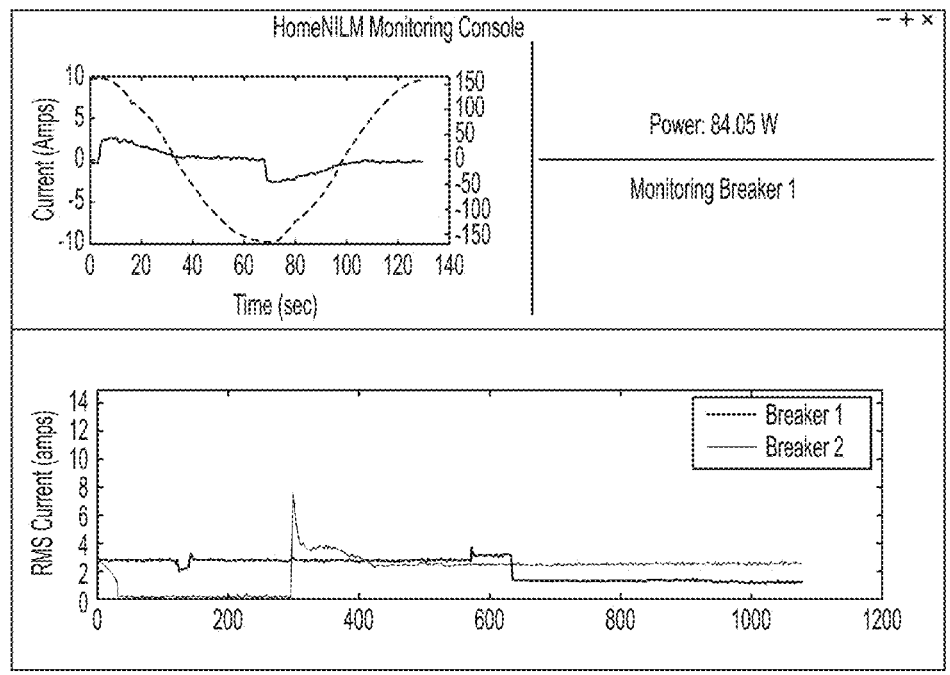
FIG. 17B shows power envelopes of both breakers and the wattage of a single breaker.

To demonstrate current sensing by measuring interfering fields we use two circuits on a standard home breaker panel (FIG. 17A). Sensors are placed on two neighboring breakers and calibrated using the method presented. Streaming data is fed to a Python program which displays the power envelopes of both breakers and displays the wattage of a single breaker (FIG. 17B) The current waveform has harmonics introduced by switch dimmers. This example could be extended to an arbitrary number of breakers given enough sensors.

Nonintrusive Monitoring of Flow Metering Devices

Above has been described techniques and apparatus for non-intrusive monitoring of currents and voltages of electrical wiring. However, the techniques described herein are not limited to the monitoring of electrical wiring, as they may be applied to any of a variety of non-intrusive monitoring applications. For example, the techniques described herein may be used for non-intrusive monitoring of a flow metering device, such as a water meter.

Many water distribution systems have flow metering devices to track water consumption. Information on the use of this valuable resource is important for a number of reasons including utility billing and informing conservation efforts. Tracking fluid flow may also be valuable for control of industrial processes.

The present inventors have recognized and appreciated that a large class of metering devices sense fluid flow through a magnetic link. For example, in a standard water meter, a first mechanical element in the path of the fluid flow is attached to a permanent magnet. As the first mechanical element spins in response to the fluid flow, the permanent magnet also spins. A second mechanical element outside of the fluid flow path is magnetically coupled to the permanent magnet, such that the second mechanical element spins in response to the rotating magnetic field produced by the permanent magnet, and the motion of the second mechanical element is measured. The magnetic coupling between the first and second mechanical elements allows for trouble-free sealing between the fluid path and the rest of the water meter. In the dry volume of the metering device, the magnetic coupling is either tracked directly with a follower magnet to actuate a mechanical display or the magnetic coupling is sensed via an appropriate sensor for electronic display purposes. The water meter thereby provides a running total of the amount of fluid that has passed therethrough.

In some embodiments, non-intrusive monitoring of flow monitoring devices, such as water meters, for example, can be performed by positioning a sensor apparatus 180 (FIG. 18) proximate the flow monitoring device in a suitable position to sense a field, such as a magnetic field, produced by the flow monitoring device. The sensor apparatus 180 may be positioned external to the flow monitoring device. Advantageously, no changes to the flow monitoring device are required. A retrofit monitoring device incorporating one or more sensor apparatus 180 as described herein may provide an inexpensive, easy to install, nonintrusive monitoring system that does not require modification of existing flow monitoring devices. Such techniques may utilize flow-induced field variations already produced by flow monitoring devices to produce a non-intrusive electronic telemetry stream of flow monitoring information.

A computer processor executing a signal processing algorithm as described herein may produce flow information having much higher time resolution and bandwidth than may be provided by the built-in display of a standard flow monitoring device. The flow information may be processed to analyze trends in the flow data, such as the amount of fluid consumed over time, and can enable observations to be made based on transient flow information. In a residential context, different water-consuming devices in the home may produce different flow transients when they are turned on/off. For example, to turning on/off a water faucet may produce different transient flow than would be caused by a toilet flushing, for example, or turning on/off a dishwasher. These transients may be analyzed to enable identifying which device is being turned on/off. Accordingly, a wide variety of information can be extracted about consumption in the home or industrial process based on central monitoring of a flow monitoring device.

Experiments were conducted using two different flow monitoring devices. One device is an electronic turbine flow meter which already contains a built in telemetry signal wire. The flow signal from this meter was used to validate our technique. The second device is a common household all-mechanical water utility meter of the nutating disk positive displacement design, which is the most common type of positive displacement flow meter.

A key element of the sensing method is the extraction of the flow rate information from the non-intrusive magnetic sensor signal. The rotation speed of the magnetic coupling device within each meter is proportional to the volume of fluid moving past the element per unit time. However, the magnetic sensor affixed externally to the meter measures the local magnetic field strength, which varies in time as the poles on the rotating magnetic coupling element change their relative position to the sensor in the course of their rotation. The relevant flow rate information is essentially a frequency modulation on the signal returned by the external magnetic sensor. A technique to track the instantaneous frequency of this signal is used to recover the flow rate information.

Flow Rate Experimental Validation

A version of the non-contact tmr magnetic sensor was used to sense the magnetic coupling in a scientific Omega brand FTB791 turbine flow meter with local digital display. An electronic output module was present providing a flow rate signal that was sampled at 2.5 kHz for validation. Field calibration was performed to convert the validation signal to gpm (gallons per minute).

Figure 19A:
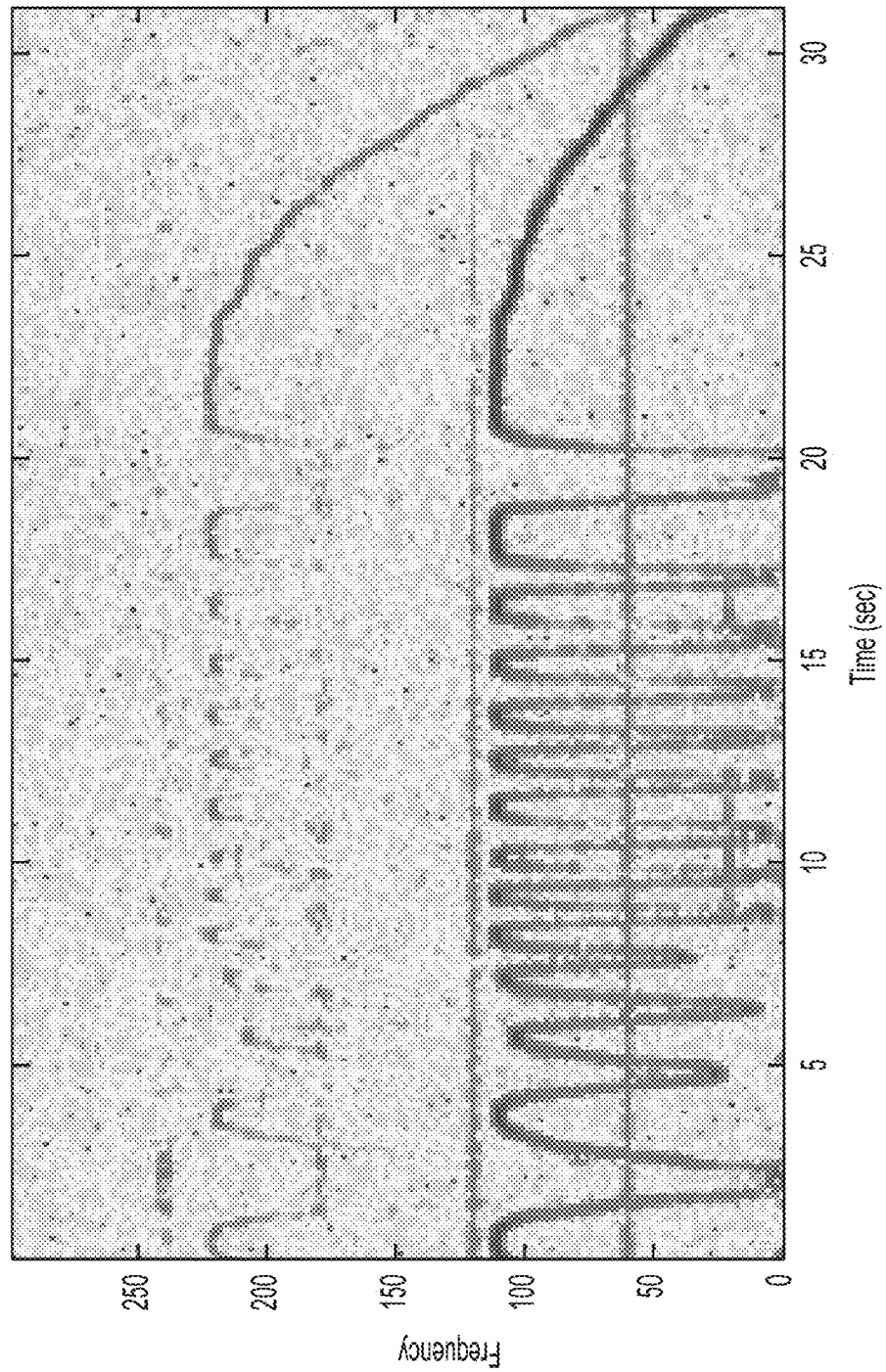
FIG. 19A shows a spectrogram of a signal from a magnetic sensor placed in the proximity of a flow meter.

The external magnetic field sensor was placed in proximity to the flow meter using a scope and constant flow to find a location of strong signal. This location corresponded closely with the boundary between the fluid volume and the display volume, as expected. The output of the magnetic sensor was sampled at 10 kHz, while the flow was varied manually from no flow to maximum flow with a ball valve in series upstream of the flow meter. A spectrogram (FIG. 19A) showed several harmonics in the magnetic signal, but the fundamental signal was never greater than ~150 Hz.

Figure 20:
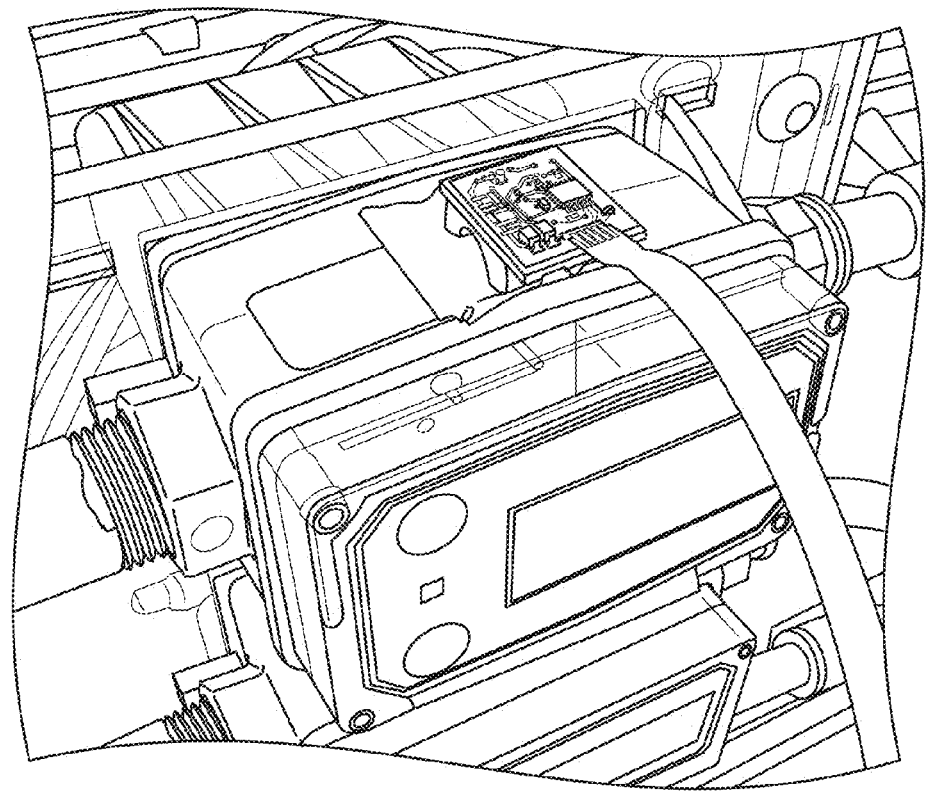
FIG. 20 shows an experimental setup for validating an external sensor measurement.

To aid the Hilbert frequency extraction procedure the signal was sharply low-passed filtered with a cutoff of 200 Hz before the Hilbert transform was performed and the phase differentiated. A 100 tap median filter and a 500 point moving average low pass filter was used to produce the plot in FIG. 19B. For the adaptive filter, the 10 kHz signal was first low-pass filtered to avoid aliasing and then down-sampled to 2.5 kHz before being input to the adaptive IIR filter. The parameters of the adaptive filter were mu=0.99 and the filter bandwidth set to 1. To jointly time-reference the frequency estimates and the validation flow rate signal a circular cross correlation was used to find the point of maximum correlation. Both frequency estimate signals were scaled to match the validating flow rate signal using least squares with an offset (for the Hilbert method) and without an offset (adaptive method.) The adaptive method performed better in this example due to its ability to handle very low or no flow rates and better noise immunity. The hardware involved in the test is shown in FIG. 20.

Water Meter Monitoring

Figure 21:
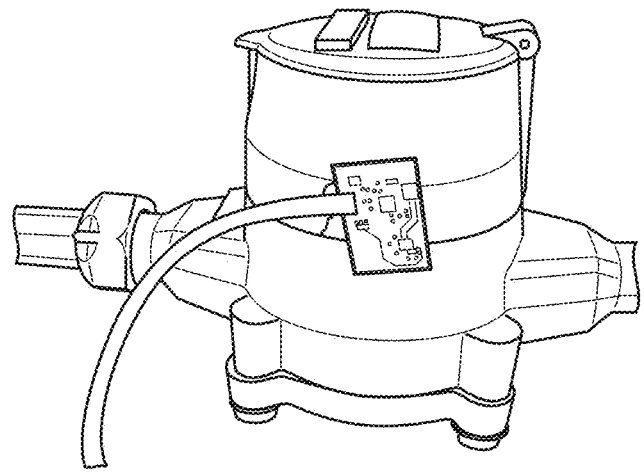
FIG. 21 shows a flow meter with a sensor positioned to detect a magnetic field therefrom.
Figure 22:
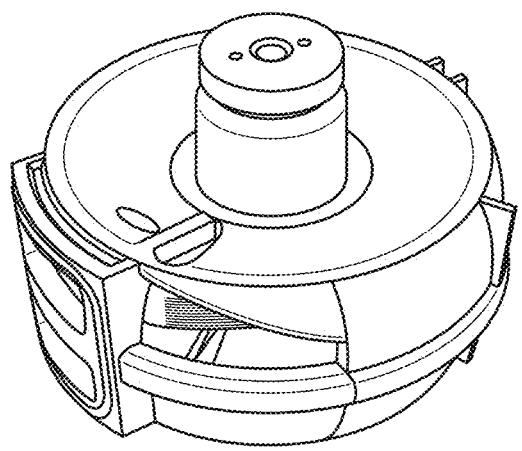
FIG. 22 shows a rotating permanent magnet on the inside of a flow meter.

Another test involved a Neptune brand 5/8 t_10 flow totalizer of the nutating disk design. This flow meter was disassembled to reveal the magnetic coupling of the fluid volume element. A photo of the meter and attached sensor apparatus is shown in FIG. 21. A photo of the magnetic coupling element is shown in FIG. 22.

Figure 23:
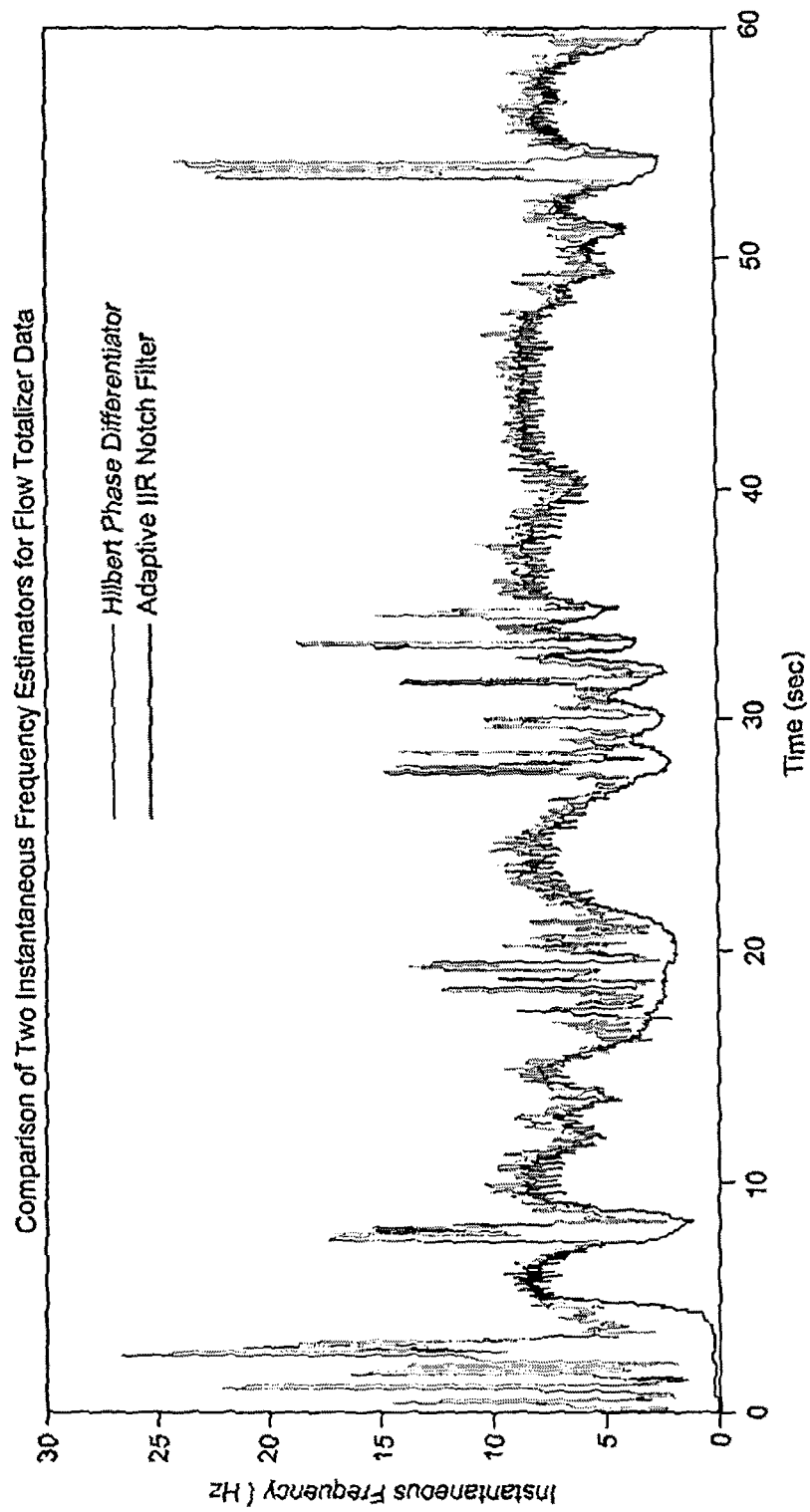
FIG. 23 shows measurements of instantaneous frequency using an adaptive IIR notch filter and a Hilbert phase differentiator.

No telemetry stream existed to validate the derived flow rate signal for this test. However, it is known that for the first few seconds of the test the flow rate was near zero as controlled by a laboratory faucet handle. The frequency estimate of the Adaptive IIR notch filtering scheme correctly represents this, and performed better overall than the to Hilbert phase differentiator frequency estimate once again. A better differentiator function may yield superior results in the case of the Hilbert based frequency estimation. Currently, for the Hilbert based estimator, the magnetic sensor signal is sharply low pass filtered with a cutoff at 50 Hz before Hilbert transform, and the phase is differenced with the rectangle rule. Then a 500 point median filter is applied followed by a 1000 point moving average. FIG. 23 shows measurements of instantaneous frequency using an adaptive IIR notch filter and a Hilbert phase differentiator. Before making the plot of FIG. 23, the result was down-sampled by a factor of 25.

For the Adaptive IIR filter frequency estimate the convergence rate parameter mu was set to 0.999, and the filter bandwidth theta_2 was set to 1 (out of a range of 0 to pi/2, with pi/2 being the narrowest bandwidth). The input to the adaptive filter was sharply low pass filtered with a cutoff at 200 Hz and then down sampled a factor of 25, for an effective Nyquist frequency of 200 Hz before being filtered by the adaptive filtering algorithm.

Figure 24:
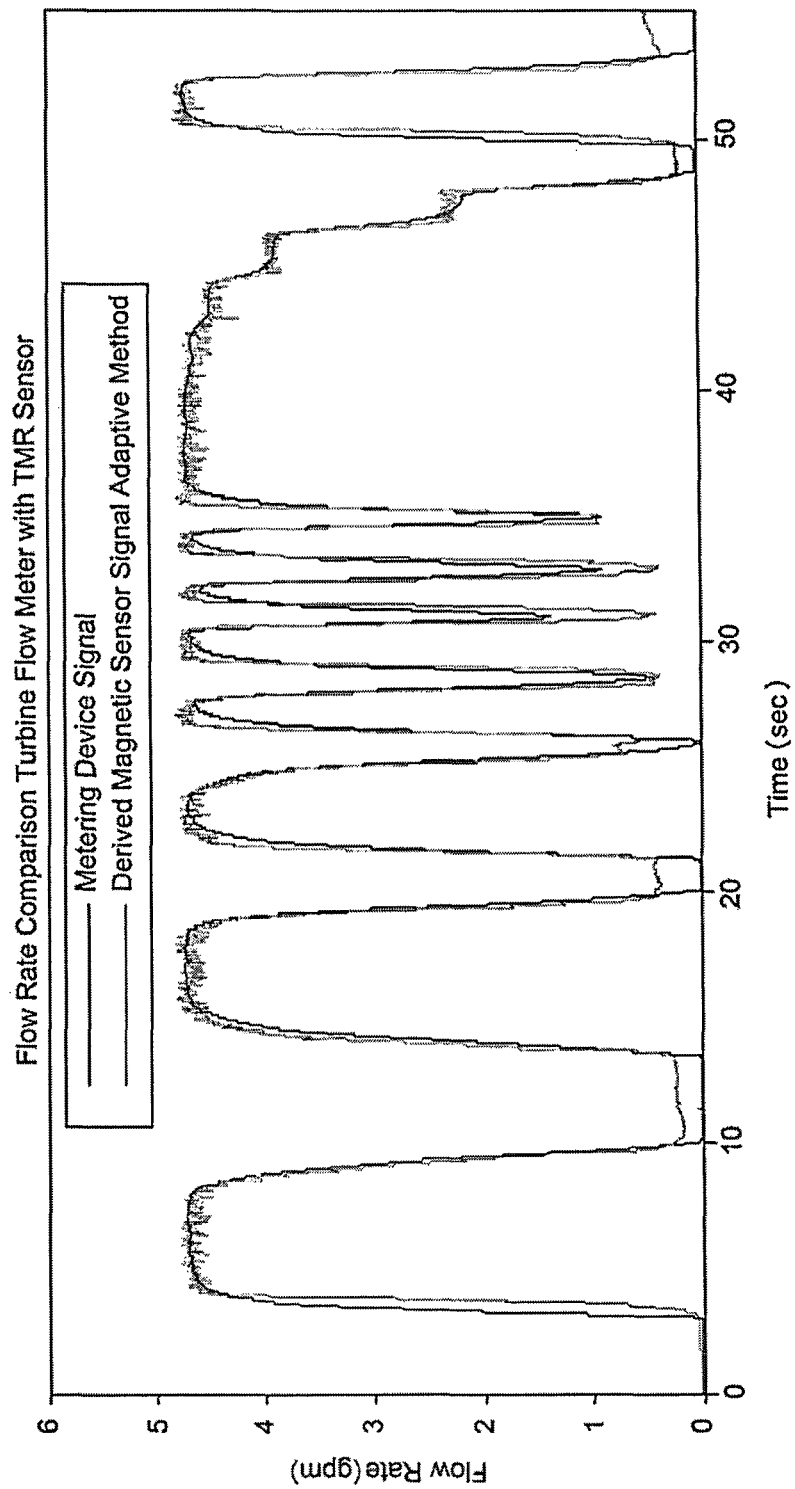
FIG. 24 shows a plot comparing the flow signal derived from a TMR device to a measured flow signal.

FIG. 24 shows the derived flow signal form a TMR device (using the adaptive method) reading the magnetic field near the same turbine flow meter as shown in FIG. 20, showing both sensors are viable.

Signal Processing Considerations and Algorithms for Nonintrusive Magnetic Sensor Based Flow Rate Determination.

This section describes algorithms for the determination of flow rate through nonintrusive magnetic sensor positioned to sense moving magnetic elements of a mechanical flow meter. First a model for the generation of the magnetic signal is presented for mechanical flow meters whose construction is such that the rate of flow is reflected in the rate of rotation of a spinning set of magnetic poles.

For a time varying flow rate f(t), the cumulative volume passing through the flow meter will be $$V(t) = \int_0^t f(t)dt \tag{1}$$

The mechanical flow meter will have a set or sets of N magnetic poles arranged such that they rotate in response to the flow. From a fixed observer external to the meter roughly in the plane orthogonal to the axis of rotation and passing through the region of the magnetic link between the fluid and dry volume of the meter, the strength of the magnetic field B is a function of the rotation angle θ, and can be modeled by the following equation:

$$B(\theta) = \sum_{i=1}^{k} c_j \sin(j*(\theta + \theta_0)) \qquad (2)$$

The construction of the water meter is such that the angle θ and V(t) are related through a characteristic volume coefficient $\mathcal{C}_V$:

$$\theta(t) = \mathcal{C}_V * V(t) \qquad (3)$$

In practice only a small number of $c_i$ coefficients are significant, and the coefficient $c_N \gg c_{i \neq N}$. In traditional encoder design much care is taken to ensure that only one coefficient is dominant and the other components are minimized. However, since the mechanical flow meter is not designed with this concern in mind, the minor coefficients may not be ignorable in general. The minor coefficients may be learned by the algorithm in order to deal with their interfering effect on the flow rate calculation, as discussed below. In some embodiments, the coefficients may be learned through a simple training run where a semi-steady flow is maintained through the water meter. One method to do this is by securing all water loads/flow control valves in the supplied building or pipe network to a zero flow state, and then opening a valve to a constant setting for the duration of the training period (which may be on the order of 1 min). To account for small flow variations present in utility connected water networks due to time to varying supply pressure, a local maximum and minimum detector may be used to observe the signal and interpolate signal segments containing N local maximums and N local minimums onto a common time basis, and then average several succeeding signal segments together. A Fourier transform may be performed on the result to generate an estimate of the $c_i$ coefficients in equation 2. Coefficients below a threshold may be discarded or set to zero.

The magnetic signal measured by the sensor is modeled by combining equations 1-3:

$$B(t) = \sum_{j=1}^{k} c_j \sin\left(j*\left(C_V * \int_0^t f(t)dt + \theta_0\right)\right) \qquad (4)$$

The sensor circuit may have its own characteristic frequency response, so the signal recorded by data acquisition hardware may be different than this signal. The following assumes that the sensor has a flat frequency response from DC through the highest expected component frequency at $k*\mathcal{C}_V*f_{max}$ re rad/sec, where k is the highest significant coefficient number of the equation describing the magnetic pole structure. Our desire is to recover an accurate estimate of flow rate f(t). The flow rate is encoded in the measured signal via its instantaneous frequency. A wide range of algorithms exist to estimate the instantaneous frequency (IF) of a signal, and the majority of them rely on a complex representation of the real signal called the analytic signal, which is traditionally generated from a single real signal through the Hilbert transform. However, it is known that for low frequency signals, like our application, spectral leakage causes error in using the Hilbert transform to generate the analytic signal.

In some embodiments, two sensors may be used to generate an analytic signal, described below, and may thereby enable avoiding the Hilbert transform altogether.

$$z(t) = a(t) e^{i*\varphi(t)} \qquad (5)$$

An analytic signal is a complex valued signal that can be modeled by equation 5. Placing the two sensors in space quadrature, based on the pre known pole count N of the magnetic pole structure inside the meter, would allow simple generation of the analytic signal by taking one signal as the real part of z(t) and the other signal as the imaginary to part of z(t). However, the pole count N may not be known ahead of time, or the sensor mounting device/considerations may not permit ideal space quadrature mounting of the sensors. In this case the signals would be combined according to equation 6.

$$z(t) = B_1(t) - e^{i*\varphi_M} B_2 \qquad (6)$$

Where $\varphi_M$ is the "magnetic" mounting angle difference between sensor 1 and 2. The angle $\varphi_M$ may be learned in a training step. For the same semi steady flow situation described above for learning the coefficients of equation 2, an algorithm may vary the $\varphi_M$ parameter in a range of greater than 0 radians (limited by sensor width and the radius of the flow meter) to π radians and attempt to minimize the range between the maximum and minimum values in the time variation in the amplitude of a(t) from equation 5, because for the correct angular correction and an approximately constant flow rate the amplitude envelope of the analytic signal will be close to constant. For most meters where the coefficient $c_N$ of equation 2 is dominant, one need not track dependence of the angular correction $\varphi_M$ parameter on pole count N because there is in practice little difference in the measured external signal from an N magnetic pole water meter with a mechanical measuring device rotating at hypothetical speed S and a 2 pole water meter rotating at speed N*S.

One area where pole count matters is determination of volume coefficient $\mathcal{C}_V$. This coefficient can either be known a priori as a parameter of the mechanical flow meter design under consideration (in which case N will likely also be known as an a priori parameter). Alternatively, $\mathcal{C}_V$ may be learned through any of a variety of methods, including a procedure known as a "bucket trial." A bucket trial may invoice the steady flow rate situation described above and a timer (e.g., a stop watch) to measure the time to fill a bucket of a known volume. A division of volume and time will reveal the average flow rate, which can be compared to the measured average frequency of the sensors over the same time period to generate $\mathcal{C}_V$. If determined form a field test from sensor output to and an independent measure of flow volume coefficient $\mathcal{C}_V$ will be correct, but if volume coefficient $\mathcal{C}_V$ is determined from CAD drawings or disassembly of the water meter then magnetic pole count N may be needed to calculate the effective volume coefficient $\mathcal{C}_V$ as seen from the magnetic sensor.

$$IF = \frac{1}{2\pi} \frac{d\phi(t)}{dt} \qquad (7)$$

The IF of a signal is only meaningful for mono-component signals, and as can be seen be equation 4, we may not strictly meet this criteria. IF is usually defined according to equation 7, where φ(t) is the instantaneous phase of z(t). The integer harmonics in the measured magnetic signal will cause an interference in the calculated IF trace. There are many methods to deal with this. So long as $c_N \gg c_{i \neq N}$ holds true, a two-step procedure can be used to first calculate a preliminary IF curve, which will primarily show the correct IF with small variations caused by the minor components of the signal. The preliminary IF curve can be used to inform the design of a time varying bandpass filter centered frequency of the major component of the signal, which can process the analytic signal z(t) to remove the interfering components, and then a final IF curve can be calculated. In some embodiments the known learned $c_i$ coefficients and their matching frequencies can be used to modify the IF definition for the integer harmonic family present in our signals to recover the flow rate with higher accuracy, as the small magnitude but higher frequency components will enable a higher resolution flow rate calculation. In either case the fundamental IF curve is related to flow rate through equation 8:

$$f(t) = \frac{IF}{C_V} \qquad (8)$$

Many methods of IF calculation exist. The main differences between methods of IF calculation are noise performance and computational requirements. Some methods may extract peaks of time frequency distributions including the short time Fourier transform and various forms of the Wigner-Ville distribution. Some methods perform the derivative operation in the definition of IF (equation 7) differently. Some methods use finite differences, some use zero crossings, and many methods fit polynomial or to other models to the $\varphi(t)$ phase signal and then differentiate the model.

A robust version of our algorithm uses a linear polynomial fit to a small moving window of phase points and extracts the slope of this fitted line as the IF estimate. Increasing the length of data points in the sliding window reduces the effect of noise and contaminating harmonics present in the measured signal on the IF estimate, but longer windows also tend to have reduced bandwidth, which has the effect of smoothing over fast flow transients. It is desirable to accurately recover fast flow transients because they may contain a high degree load identification information. A shorter data window would provide good flow transient information if noise and contaminating harmonics could be removed. We may remove these undesired signal components with a time varying band pass filter.

Some embodiments use a two-step algorithm. Using a long data window size to reduce contaminating harmonic influence, a preliminary estimate of the IF may be generated. This IF estimate may be used to construct a complex "mixing signal" of amplitude 1 and identical instantaneous frequency. This mixing signal may be multiplied element-wise by the analytic signal of equation 6. The resulting signal contains the majority of its flow rate information in a small frequency band near DC. A digital low pass filter may be applied to the result with a cutoff frequency set to remove signal content far from DC (i.e. noise and contaminating harmonics), and the output of this filter may be element-wise divided by the mixing signal to recover a cleaned analytic signal with reduced contaminating content. This cleaned signal is amenable to IF estimation using a shorter data window length and therefore provides better information about fast flow rate transients in a final IF estimation. In some situations, a combination of the initial (long window) IF estimate and the cleaned (short window) final IF estimate may be better suited to providing flow rate information depending on the details of the calculations involved, i.e. the cleaned IF estimate may be better at providing higher flow rates accurately, while the initial IF estimate, because it does not contain the low pass filter transients from, may be better at low flow rate information or providing the timing of flow events.

If only one sensor is present, or for some reason a constraint on computational power or other factor prevents utilization of the above IF algorithm, lower resolution and accuracy algorithms exist for determining flow rate from the measured signal. A simple method would be to detect zero crossings of the roughly sinusoidal signal from the sensor and use the time interval between zero crossings to estimate the frequency of each half period of the signal. This may provide a low resolution flow rate estimate which may be suitable for tracking gross water consumption.

For a single sensor system where the $c_i$ coefficients have been learned, or even where the coefficients are not known so long as $c_N \gg c_{i \neq N}$ and the signal is approximately a sinusoid, then it is possible to fit a model sinusoid or family of sinusoids to successive periods of the measured signal with a polynomial phase argument. The chosen order of the polynomial phase would be a tradeoff of computational complexity with flow rate resolution, and high orders would need to be avoided to avoid instability in the fitting. Regularization may be employed to ensure stable coefficients. In this scheme a separate processing track to deal with long periods of zero flow may be used. Zero flow situations can be detected by tracking the rms difference between the output of a long time running average filtered version of the signal and the unfiltered signal. When the rms difference falls below a threshold, low or zero flow is indicated, with the exact flow level based on the threshold, length of the filter, and the energy of the noise present in the signal. The nonlinear fitting algorithm may improve its performance by using initial guess information generated from the simpler zero crossing detector above, or form past signal segment fits. Nonlinear sinusoidal fitting procedures have the tradeoff of high computational complexity, but may provide a solution allowing for high resolution and accurate flow rate determination from a single sensor, if one wished to use the information for water load identification based on possibly unique flow rate transient information relating to the particular load's use.

Sensor Modifications and Algorithm to Extract Pseudo DC Response from Compensated TMR Sensor The circuit design for the compensated TMR sensor board employs a feedback loop that may remove the mean of the sensor output before amplification. This action to may facilitate utilizing the TMR sensor at high amplifications, as may be needed for at least some for the applications described herein, but a side effect is the creation of an effective high pass filter in the sensor dynamics. For the water flow metering application where flow rates can go to zero and the moving magnetic elements become stationary during periods of zero flow, the mean removal circuitry acts to bring sensor output to zero by removal of the constant value sensed by the TMR sensor in this situation. This effect may be undesirable for several reasons, as it handicaps the DC response of the sensor, and it makes the sensor output on occurrence of the next flow event a function of the "parked position" of the magnetic elements and ensuing zero flow sensed value, as well as the flow rate transient. This is because there will be a period of re-adjustment of the mean of the sensor output from wherever it settled in the zero flow period back to the more accurate true mean of the signal. The re-adjustment effect can potentially contaminate flow rate and other load identifying information in the flow rate transient.

In some embodiments, the above problem can be addressed by correcting the slow time mean shifts in software with the aid of an additional sampled signal at the reference pin of the instrumentation amplifier 221 (FIG. 4). This reference signal includes a scaled version of the adjustments of the signal mean being performed by the feedback loop. The steps of the correction algorithm follow: First the sensor output may be examined to find periods of flow and no flow. In some embodiments, this is accomplished by a threshold on the amplitude envelope of the analytic signal of equation 6. Optionally a digital high pass filter may be employed to aid in this flow vs. no flow segment detection as the high pass filter will reduce the magnitude of the analytic signal envelope if the frequency contained is low, and of course the envelope threshold and the design of the high pass filter determine the flow rate level below which is considered pseudo zero flow according to the pseudo DC recovery algorithm being described in this section.

Using the time indices of the threshold crossings of the envelope of the analytic signal, the sensor output signal and reference pin signal from each sensor is partitioned into flow and no flow segments. Then, for each flow or no flow segment the following is done: A least squares fit is performed to find the linear scale and offset coefficients to match each reference pin signal segment to its corresponding sensor output signal segment. The reference pin signal is then adjusted by these coefficients to form a mean correction signal. The mean correction signal is subtracted from the sensor output signal to undo the effect of the mean adjustments by the feedback loop. This step will correct the sensor output signal's flow segments to roughly constant zero mean, but it will also cause the sensor output signal's non flow segments to have a roughly zero constant value, which is not correct. The solution to this is to recognize that for non flow segments, the final value of the immediately preceding flow segment is approximately the correct constant value for the entire non flow segment, so this value is added to the roughly zero value non flow segment value to arrive at mean corrected non flow signal segment. The mean corrected flow and non flow segments are then re assembled (concatenated) in correct time order and a new mean corrected analytic signal is generated according to equation 6 and used for IF estimation and flow rate determination as previously described in earlier sections.

Appendix A below provides further information and figures illustrating an algorithm for determining flow rate information, as well as experimental results Retrofit Device Designs Mechanical flow metering devices are usually designed to measure flow in only one direction, especially for potable water utility service. However, for other flows the meter may be designed to account for reverse flow. In order to measure flows in two directions two sensors may be used, placed to sense the magnetic field of the moving elements one in advance of the other. Any of a variety of methods may be used to then extract the direction of rotation of the moving magnetic elements, and this rotation direction will identify flow direction.

Figure 25:
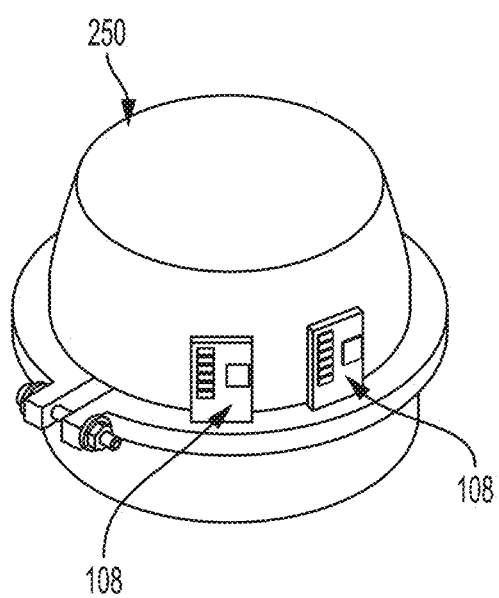
FIG. 25 shows an example of a monitoring apparatus having a sensor and a sensor positioning apparatus which may be attached to a water meter.

FIG. 25 shows a diagram of an exemplary mounting solution including a sensor positioning apparatus 250 configured to attach to a standard nutating disk water meter to place one or more sensors in the correct location for monitoring flow. The angular separation of the sensors about the circumference of the meter may be chosen so it is not equal to twice the angular separation of the pole to pole distance of the magnetic rotating element if a unique flow direction determination is desired. Given the relatively low pole count in standard meters a sure method of achieving this placement is to make sure to the angular distance between sensors is not an integer fraction of 2pi radians, as no equally spaced magnetic pole design would be incompatible with this sensor arrangement.

Application of Non Contact Differential Capacitive Voltage Sensing to Motor Spindown Speed Determination after Power Off The inventors also point out another application of the non contact voltage sensor described above pertaining to non contact speed measurement of electric motors during spin-down after power has been removed. Spin down can provide an important fault diagnosis opportunity for a machine. For example, most motors in machines with rotating components such as shafts, fans, pumps or similar, cause machine vibrations at multiples of the rotation speed. These vibrations can contain diagnostic information on machine health. The spin down of a motor after power off effectively sweeps these vibration frequencies through a frequency range as the rotation speed decreases that can serve to be a valuable source of machine health and condition information. However, many algorithms to make use of this information require knowledge of the excitation or shaft speed through time that was the source of the vibrations. For applications where installation challenges, cost, down-time and complications or safety considerations rule out the use of conventional shaft speed sensors, the non contact differential voltage sensor disclosed herein provides an alternative solution for shaft speed measurement during this critical spin down after power off period.

While shaft rotation of an electric motor with permanent magnets on the rotor may generate voltages on the stator wires, what the inventors have realized is that residual magnetism present an all tested induction motors (an extremely common type of motor containing no permanent magnets and ubiquitous throughout industry) serves to generate similar (and usually much smaller) voltages on the stator windings.

After motor power off the stator winding are open-circuited with zero current flow. The differential non contact capacitive voltage sensor with is installed with sensing foil wrapped around two leads to stator conductors/motor power cable of the motor in question. The differential configuration is essential because ambient utility 60 Hz electric pickup will dominate and overwhelm the signal from any non-differential sensor design due to the large amplification gains needed by the capacitive sensing circuit and to the small voltage signals generated by weak residual magnetism in induction motors. In the differential sensor configuration the ambient 60 Hz electric pickup is removed by the differential action of the instrumentation amplifier. Care should be taken in correct positioning of the sensitive pickup foil electrodes and their sizes to ensure that the contribution of the ambient 60 Hz electrical pickup on each sensor is equal for the I amp to effectively filter this common mode component. Or other active solutions, such as direct filtering or gain leveling, can be employed to make the 60 Hz energy in each channel of the differential pair equal before differencing to remove this common mode signal component.

In the situation of a powered running motor, and for a very short time after power off while the formerly powered magnetic field on the rotor is dissipating, the high gain differential capacitive voltage sensors described may be output-saturated, and not able to deliver the full range of the stator voltage signal. This is not an issue as the speed measurement accuracy needed for most vibration processing algorithms can be satisfied by simple zero crossing detection and timing. Or, if desired, in some embodiments the final amplification level can be continuously adjusted to ensure no sensor output saturation occurs. Experiments were conducted on a three phase induction and single phase induction motor, comparing noncontact capacitive voltage sensor signal with conventional voltage sensor signal and derived shaft speeds with shaft encoder measured speed.

Appendix B below provides further information and figures regarding a differential capacitive sensor, as well as observations of motor spin down.

Appendix A

There are 2 main parts to an exemplary algorithm for determining flow rate information from the TMR magnetic sensor board. The first part is a data correction step to recover a pseudo DC response from the sensor circuit (which has a high pass characteristic in its output in order to deal with the characteristics of the TMR chip itself). The second step is estimation of instantaneous frequency (IF) of the sensor output, from which flow rate may be calculated (e.g., by multiplication of the volume coefficient).

Pseudo DC Response Recovery

The idea behind sampling the signal at the reference pin of the instrumentation amplifier (I-amp) 221 is to allow for improved sensor performance during flow transients. When there is no flow, the motion of the magnetic elements in the flow meter stops and the integrator in the I-amp reference compensation circuit will in general cause a shift in the mean value of the main sensor output. When flow resumes, the sensor outputs mean will then adjust to the previous (and correct) value. These shifts in the mean of the signals depend on the magnetic DC level during zero flow and that in turn depends on where the magnetic elements come to rest at the end of the previous flow period. In order to best recover information about flow rate transients the effect of this high pass behavior on the sensor output during flow transients may be taken into account. By sampling the reference pin of the I-amp and using this information to track and correct the changes of the mean of the sensor output, the high pass filtering effect on flow transient signatures can be accounted for, and a pseudo DC response characteristic can be recovered. Not performing this correction may result in the masking of signal content important to the recognition and matching of identical flow transient signatures made different only via the starting position of the magnetic elements in the flow meter and the state of charge in the I-amp reference compensation circuit capacitor.

The following plots were generated from data sampled at 10 kHz. The sensor output and the I-amp reference pin are both sampled for each of the two sensors. Due to specific knowledge of the flow meter being monitored and the range of possible flow rates in the experimental setup, all sampled data is immediately re-sampled to 100 Hz, with the aid of a sharp digital low pass filter to ensure no aliasing. This pre-processing step is optional, but it reduces computation complexity and improves signal to noise ratio in the sampled data.

Figure 39:
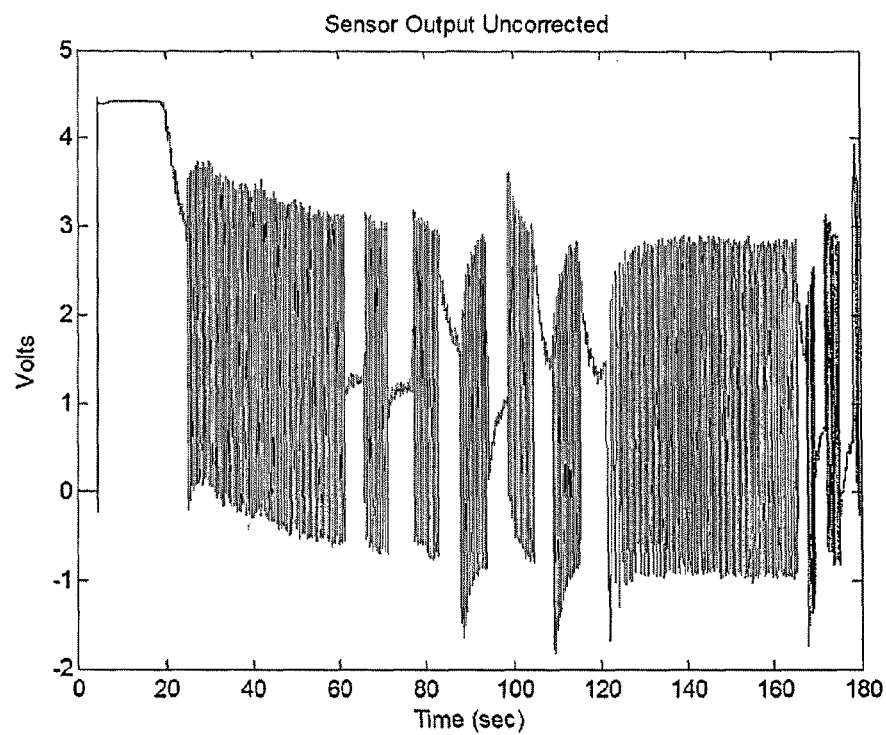
FIG. 39 shows a plot of a sampled sensor output channel.

FIG. 39 shows a plot of the sampled sensor output channel. Sampling began before the sensor was powered on (at t=3 sec) to illustrate the effect of the settling time of the initial TMR I-amp reference compensation circuit (shown as 220 in the circuit schematic figure). As an effective high pass filter, this compensation circuit serves to adjust the mean of the sensor output towards zero internally (this internal zero value may be shifted by some level before sampling at an A2D converter by succeeding amplification circuitry, this effect is shown in the plot above as well). The time constant of this circuit is many seconds duration.

Also visible in FIG. 39 are periods of flow and periods of no flow. During most periods of flow the magnetic elements of the flow meter being sensed are rotating (becoming closer and further from the sensor on a periodic basis) on a time much scale faster than the settling time of the I-amp reference compensation circuit causing the mean adjustment to move towards the a consistent average signal level in common between successive periods of flow. However, when flow ceases and the magnetic elements of the flow meter stop their motion, the sensed magnetic field strength at the sensor will become constant, and the I-amp reference compensation circuit will cause the reported sensor output to reduce over time to an internal zero value which is later offset to a non-zero but constant value via succeeding circuitry before sampling.

Figure 40:
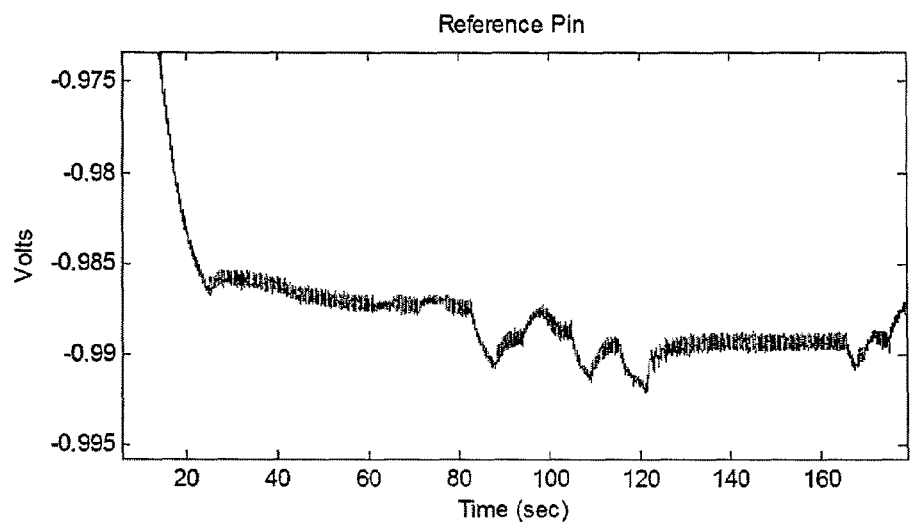
FIG. 40 shows a plot of the signal sampled at the I-amp reference pin.

FIG. 40 shows a plot of the sampled I-amp reference pin. For the experiment the pin was sampled directly, but in other implementations the node may be voltage buffered before sampling to shield the rest of the sensor circuitry from possible noise. The voltage level of the reference pin directly adjusts the mean of the I-amp value, and its dynamics are of the same slow time scale. This permits the use of significant low pass filtering to further remove noise in this signal and increase its accuracy, which is important in light of the fact that, after settling of the initial power on transient, the range of variation in this signal is extremely small (less than 0.01 volts).

Figure 41:
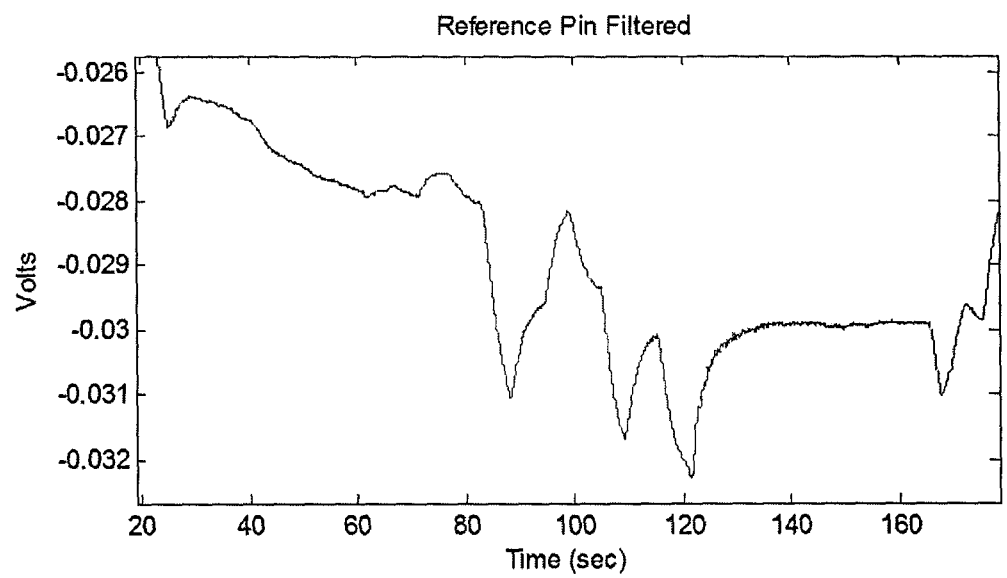
FIG. 41 shows the I-amp reference pin signal after low-pass filtering with a filter of similar time constant as the I-amp reference pin compensation circuit.

FIG. 41 shows the I-amp reference pin signal after lowpass filtering with a filter of similar time constant as the I-amp reference pin compensation circuit. A scalar shift in mean value of this signal is shown, due to subtraction of the whole signal mean.

The I-amp reference compensation circuit exists to correct for undesirable behavior of the TMR sensor technology. One of those behaviors is a propensity to change its sensitivity based on hysteresis effects and exposure to constant magnetic fields. During each period of no flow the TMR is in general exposed to a different constant magnetic level, causing the behavior of the TMR to generally change each time. Because of these factors, the relation between the I-amp reference pin signal and the sensor output mean is generally piecewise time varying, i.e., it changes for every flow to and no flow region. The DC response recovery correction may be done in a piecewise manner. The boundaries between regions of flow and no flow in the sensor output signal (FIG. 39) are found. One method to do this is by digital high pass filtering with a higher frequency cutoff than is already present in the I-amp reference compensation circuit and then thresholding signal amplitude envelope or short time rms energy measures or any other number of measures. High pass filtering can also be done on the analytic signal constructed from two sensors where their output has been corrected to be in quadrature around the flow meter. This gives an easy signal amplitude envelope to threshold. Data whose amplitude envelope is below the threshold is considered to be data from times of zero flow. Depending on the threshold level and the high pass filter design regions of low but non zero flow mat be classified as no flow. It may be important to design these details carefully to avoid misclassification. For a desired minimum flow rate detection level one may design the threshold and high pass filter accordingly. This inexact tradeoff is the reason behind the name of this section as Pseudo DC response recovery For each sensor output data segment from a flow or no flow region, a least squares fit for the linear scale and offset relationship between the corresponding filtered reference pin data segment and the sensor output data segment is performed. Then the filtered reference pin data segment is scaled and offset by the values found in the least squares optimization and subtracted from the sensor output data segment. This de-trends and brings to zero the mean value of the sensor output for flow segments, but it also de-trends and brings to zero the sensor output during no flow segments. However, it is known that the final magnetic signal value of the preceding region of flow is the correct DC value for the entirety of the no flow region, so this value is added to all points of the de-trended and zero mean no flow data segment. The resulting data segments are then re-assembled to give the pseudo DC corrected signal visible in FIG. 42.

Figure 42:
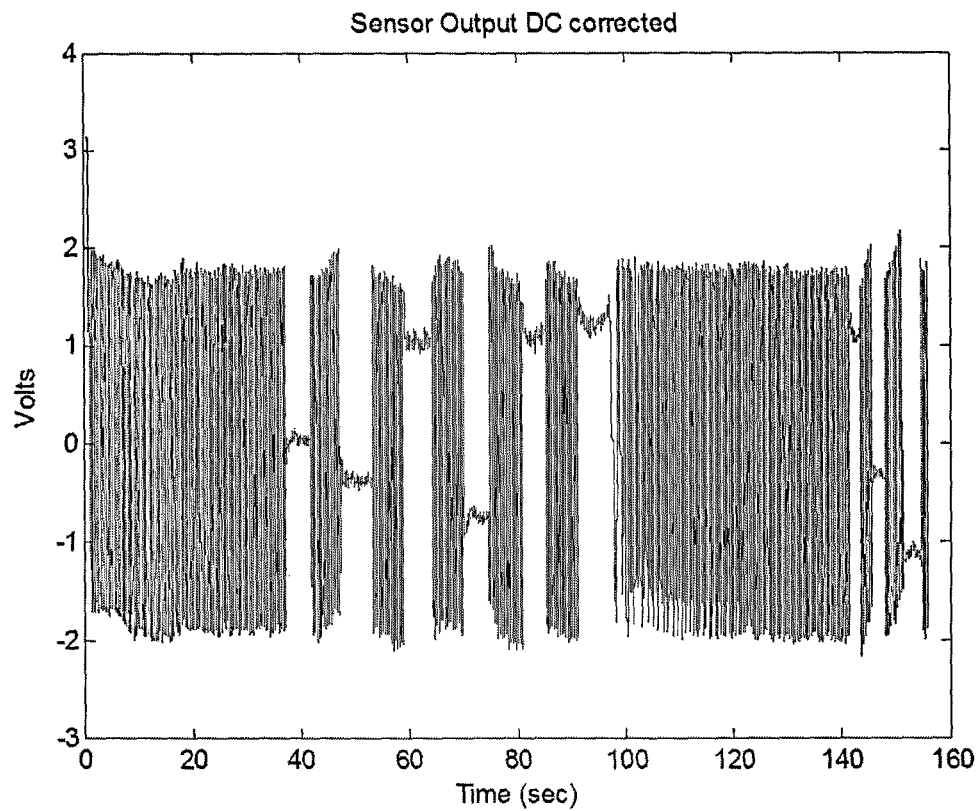
FIG. 42 shows the reassembled signal after piecewise pseudo DC response correction.

FIG. 42 shows the reassembled signal after piecewise pseudo DC response correction. Possible jumps in signal value between segments that are a result of the piecewise correction present no problems to the algorithm for instantaneous frequency estimation used on this signal.

Figures for Instantaneous Frequency Estimation

Figure 43:
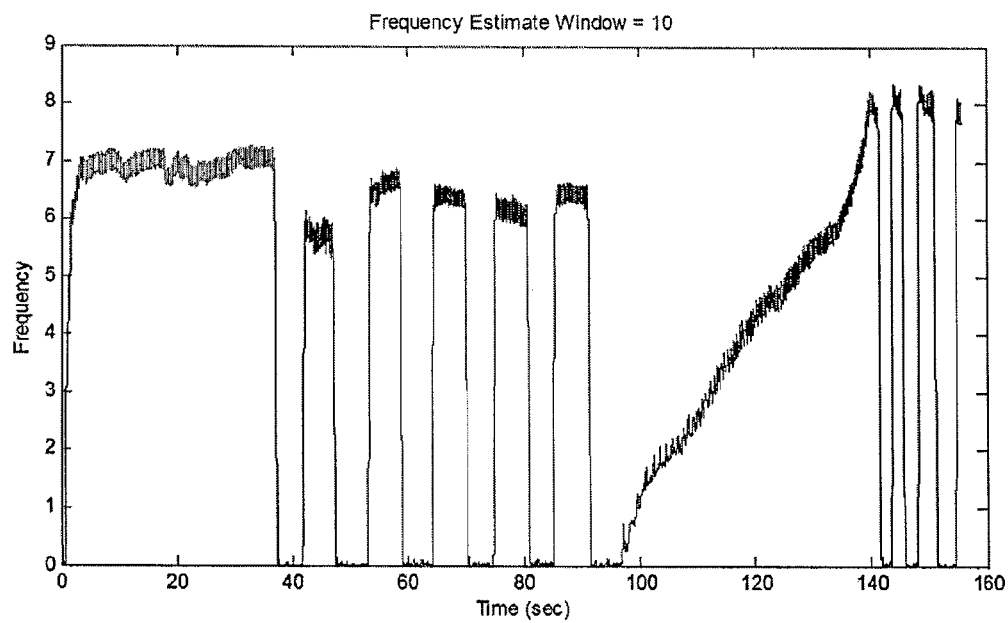
FIG. 43 shows an IF estimate from a linear model of phase variation of the analytic signal using a shorter data window.
Figure 44:
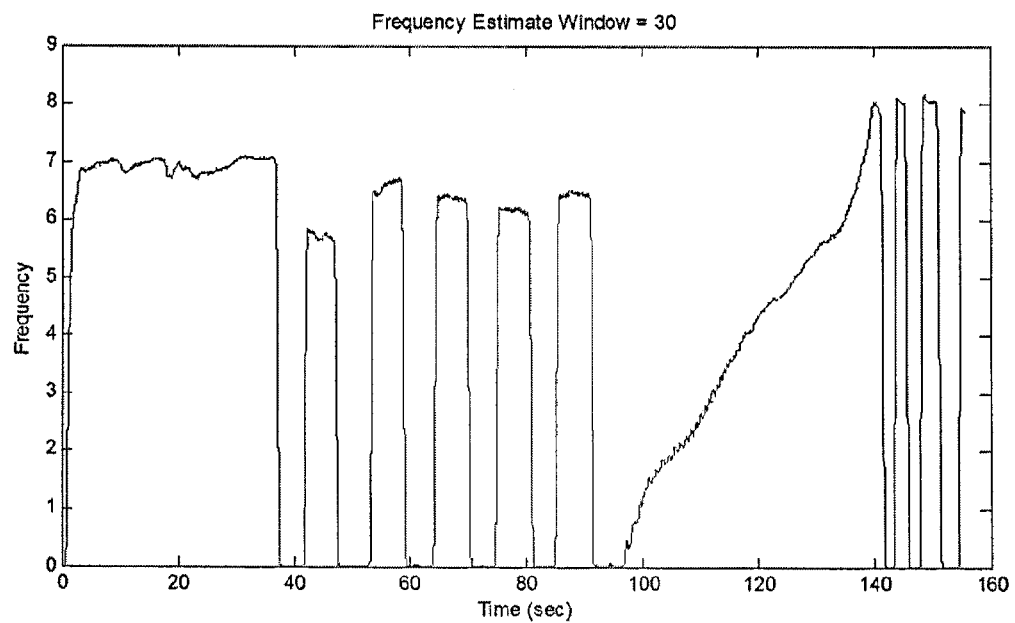
FIG. 44 shows use of a longer data window in the IF estimation.

FIGS. 43 and 44 show the difference between using a long data window for IF to estimation and a short data window.

FIG. 43 shows an IF estimate from a linear model of phase variation of the analytic signal using a shorter data window (length=10). The effect of noise and non-dominant harmonics in the measured signal are evident by the fast time additive variation in the IF estimate about the true IF level FIG. 44 shows use of a longer data window in the IF estimation reduces the effects of noise and non dominant harmonics, but also smoothes over faster transients in the IF, causing possible loss of load identification information.

Figure 45:
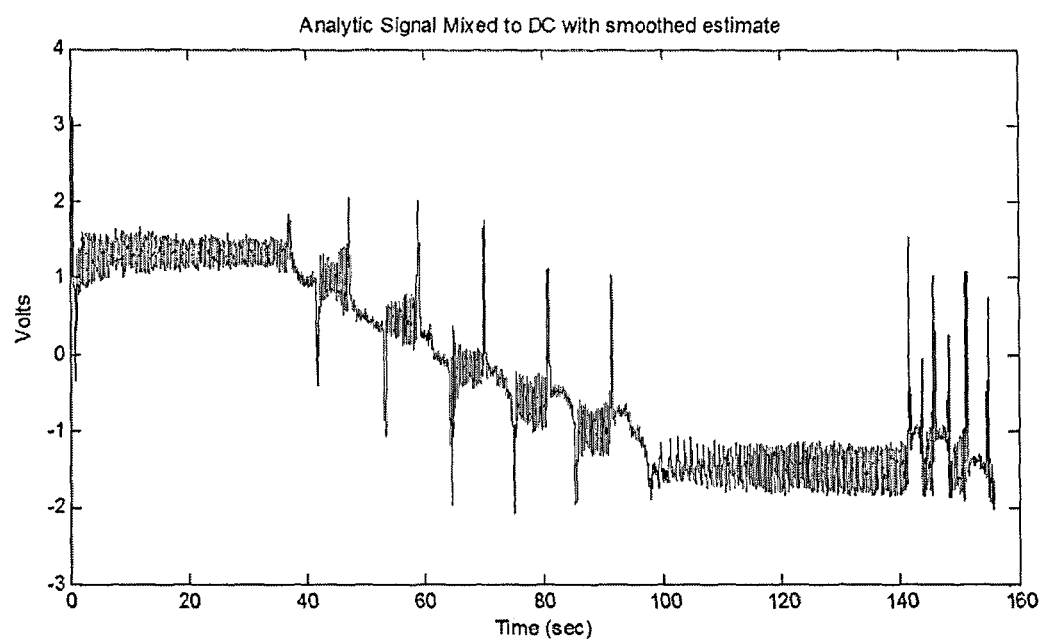
FIG. 45 is a plot showing the result (real part) of the multiplication of the constructed mixing signal and the analytic signal constructed by combining two sensor output signals in complex quadrature.

FIG. 45 is a plot showing the result (real part) of the multiplication of the constructed mixing signal (from the 30 point window IF estimate) and the analytic signal constructed by combining two sensor output signals in complex quadrature.

Figure 46:
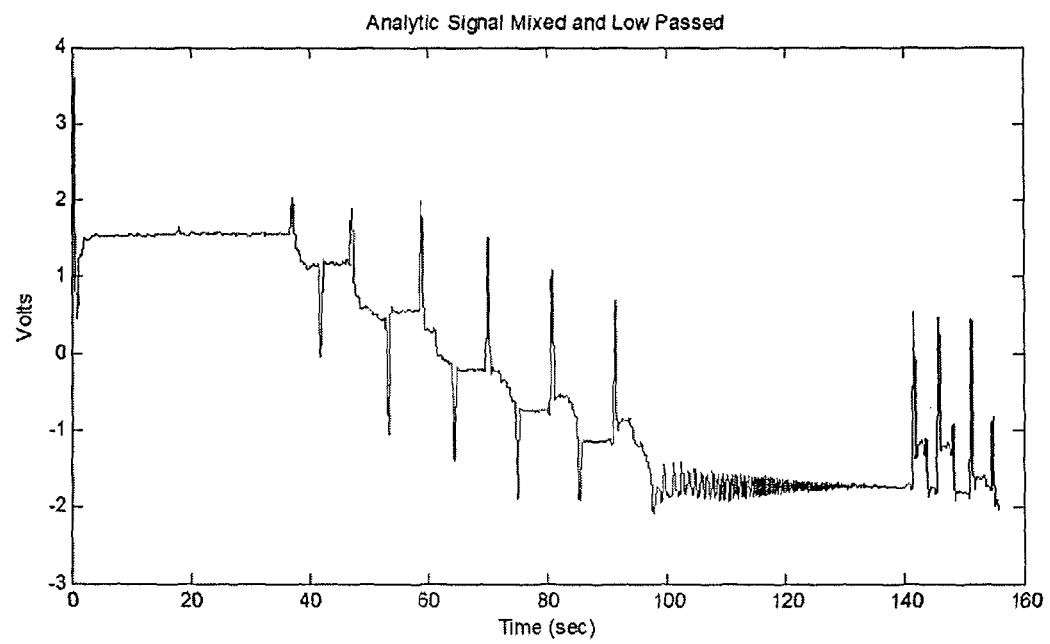
FIG. 46 is a plot of the data of FIG. 45 after low pass filtering.

FIG. 46 is a plot of the data of FIG. 45 after low pass filtering. Low pass filtering with a constant frequency filter in this mixed signal domain is equivalent to having a time varying band pass filter in the original signal domain, whose band pass characteristics follow the preliminary IF estimate.

Figure 47:
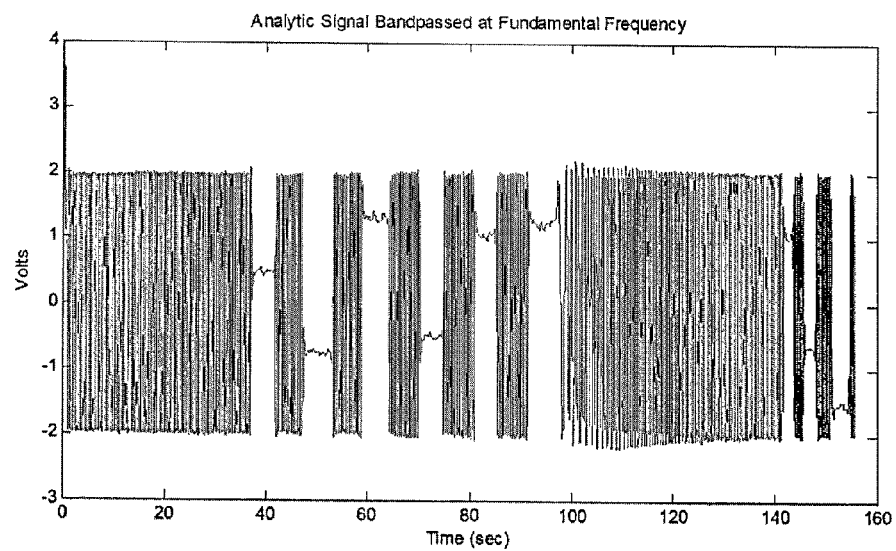
FIG. 47 shows the data of FIG. 46 after element-wise division of the mixing signal to return the analytic signal to the original domain.

FIG. 47 shows the data of FIG. 46 after element-wise division of the mixing signal to return the analytic signal to the original domain. In comparison to FIG. 42, the data is less noisy and the magnitude of non dominant harmonics have been reduced.

Figure 48:
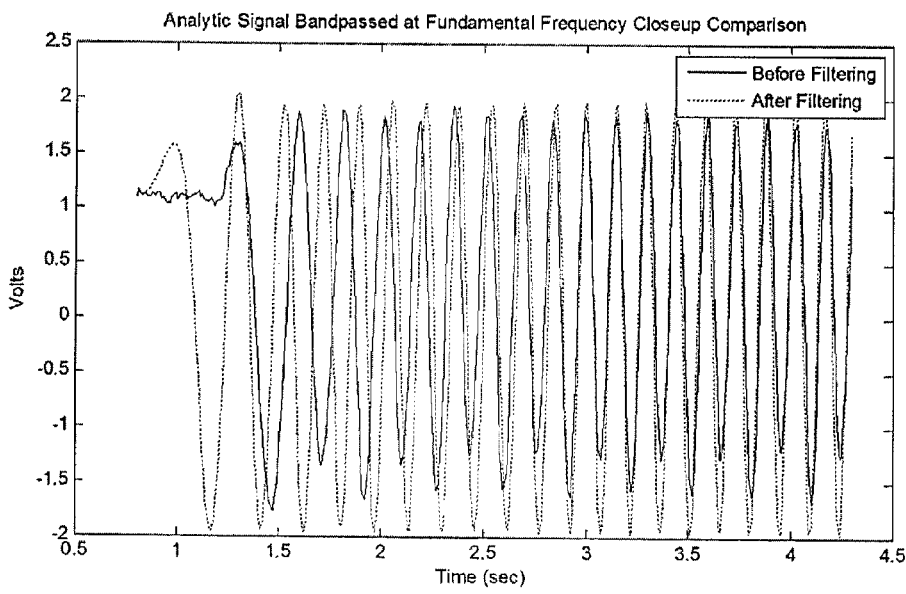
FIG. 48 shows a close up before and after plot of the data showing the reduction in non-dominant harmonics, but a side effect is a smoothing effect on the flow transient at time 1.25 sec in this plot.

FIG. 48 shows a close up before and after plot of the data showing the reduction in non-dominant harmonics, but a side effect is a smoothing effect on the flow transient at time 1.25 sec in this plot.

Figure 49:
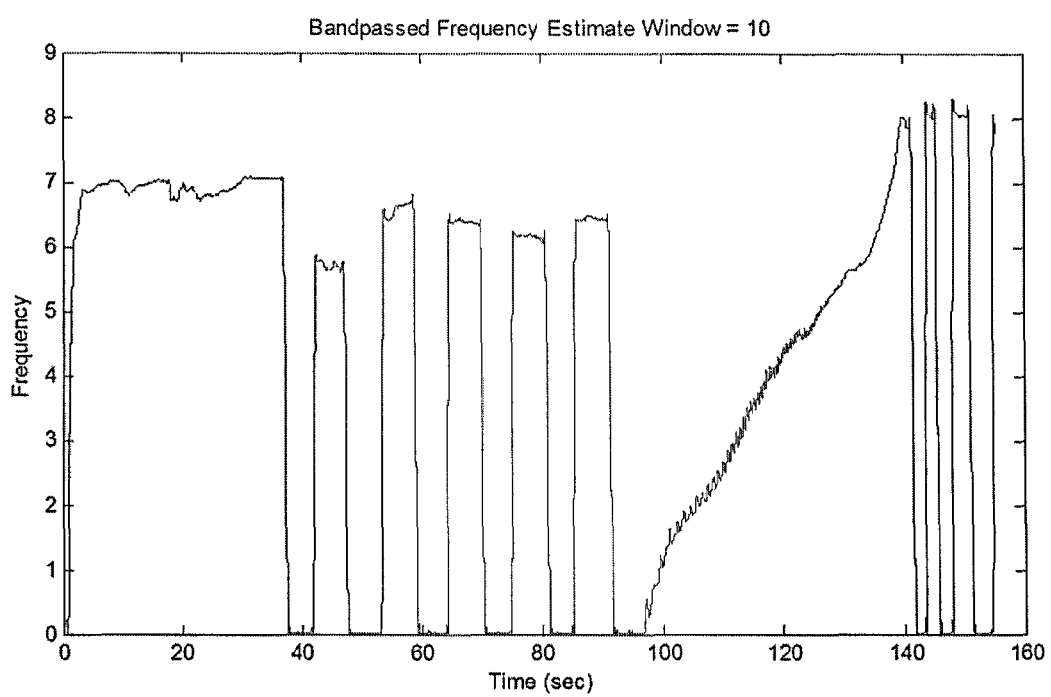
FIG. 49 shows the IF may then be estimated with shorter data windows and give cleaner more accurate results than before.

FIG. 49 shows the IF may then be estimated with shorter data windows and give cleaner more accurate results than before (compare to FIG. 43.) However, due to smoothing of transients, a fusion of long window IF estimates on unfiltered data and short window IF estimates on filtered data may yield the best results. For example long window IF estimates on unfiltered data may be better for low flow levels while short window IF estimates on filtered data may be better on high flow levels, with the optimal tradeoff depending on the noise levels, flow meter details and levels of non dominant harmonic contamination in the measured signal.

Appendix B

While the single ended sensor design does detect electric fields well, it does not to discriminate between electric fields directly below it (e.g. from a wire), and those existing elsewhere around—which that can be caused by many different sources of interference. As discussed above, FIG. 9 shows a single ended capacitive pickup schematic. To improve the specificity of the sensor with only a small reduction in sensitivity, the following differential setup can be used. A differential sensor can be used for sensing of electric fields in any application described herein. As discussed above, FIG. 31 shows a schematic of a differential capacitive pickup. FIGS. 32A and 32B show the conceptual operation of the differential capacitive pickup. This setup is particularly sensitive to fields produced directly below it, because this produces a strong differential measurement across the sensor plates. An additional benefit is the steeper roll off in sensitivity as the distance from the source increases. The magnitude of the output signal is proportional to strength of the electric field at the sensor plate that is described by Coulomb's law:

$$|E| \propto \frac{q}{r^2}$$

Here q is the charge on the wire and r is the distance from the wire to the sensor plate. For the differential circuit there are two plates stacked vertically, and if we assume a unit distance between the plates then the output of the sensor becomes:

$$|E| \propto \frac{q}{r^2} - \frac{q}{(1+r)^2}$$

Figure 50:
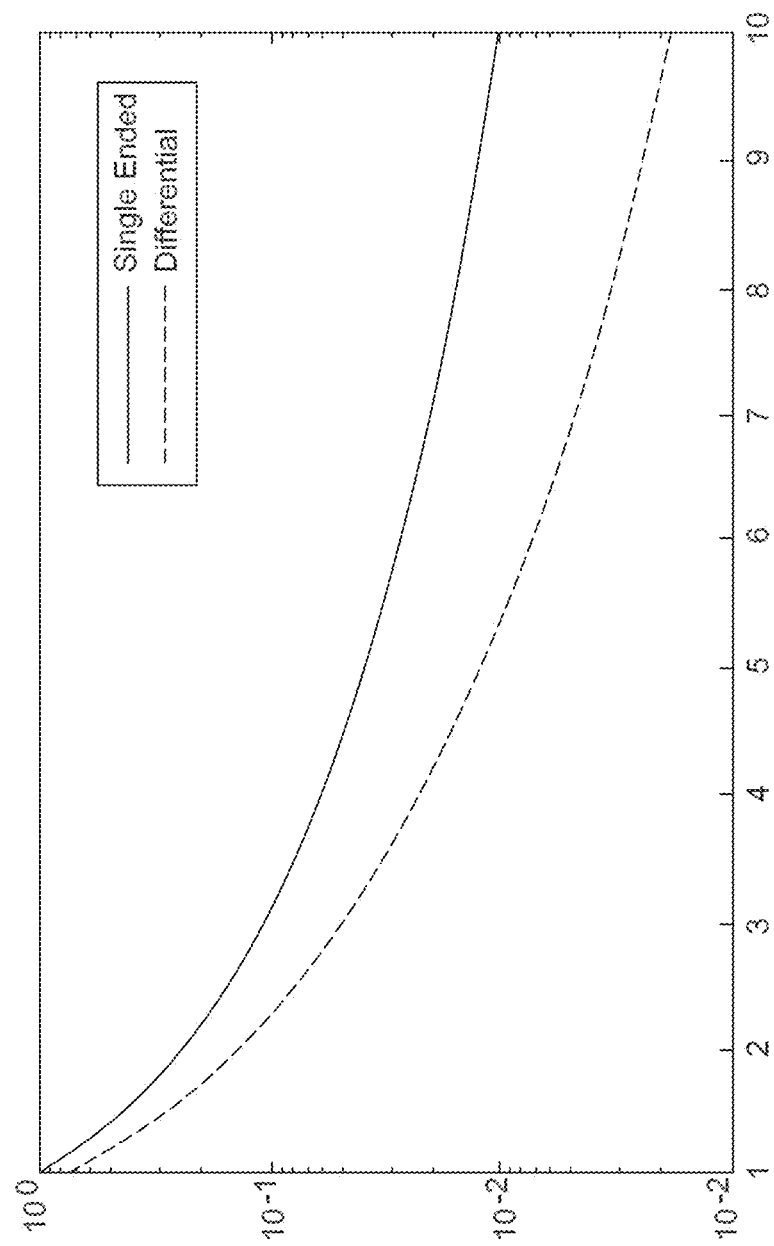
FIG. 50 shows a logarithmic plot of sensitivity versus distance for the single ended and differential topologies.

FIG. 50 shows a logarithmic plot of sensitivity versus distance for the single ended and differential topologies (single ended—upper curve, differential—lower curve). The differential sensor is much less sensitive to fields that are far from the plates—which is exactly the desired behavior. The Y-Axis shows the log of sensitivity and the X X-Axis shows normalized distance from the plates.

In addition to accurately sensing line voltage, this differential setup can also be used to measure the speed of electric motors during spin down. Once power is removed from a motor, all of the lines are effectively floating with respect to earth ground. There is a small amount of voltage produced between the lines due to the residual magnetism in the rotor. Connecting the sensor plates to two of the motor power lines produces a very sensitive measurement of this voltage. This measurement corresponds directly to the rotational speed of the shaft; because of this we can use it to calculate a very precise measure of speed during the spin down. To get a measure of motor speed one traditionally has to connect a tachometer to the shaft whereas this technique does not require any modification to the motor or shaft. Experimental results are shown in FIGS. 51A and 51B.

Figure 51A:
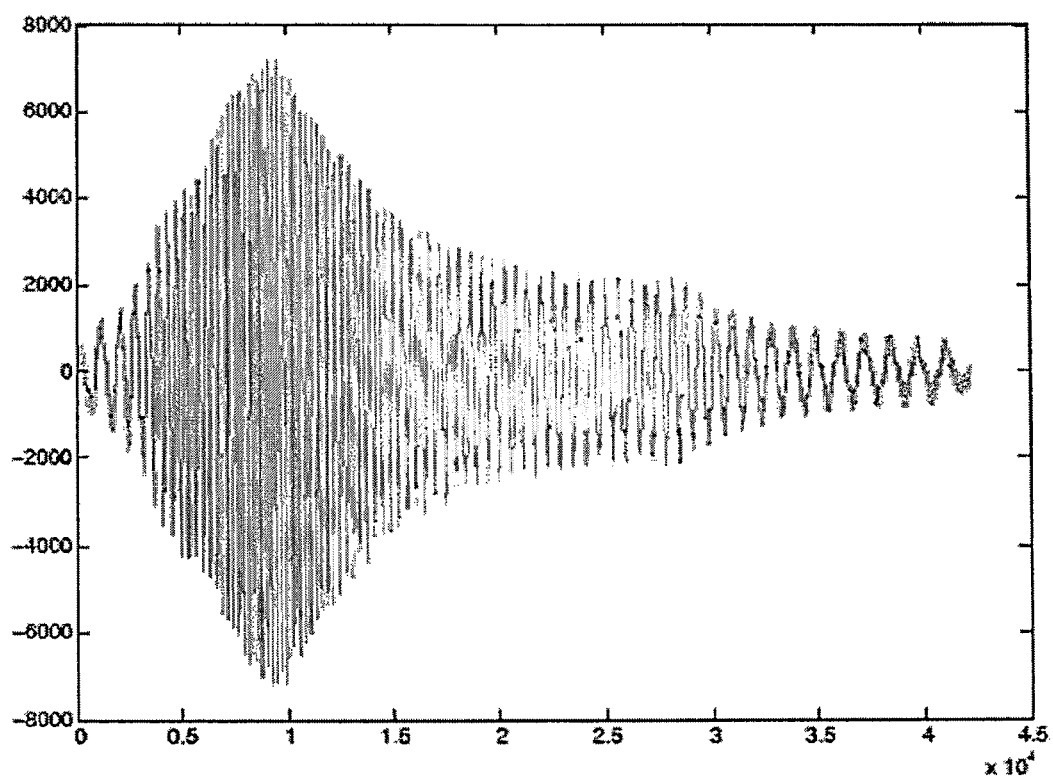
FIGS. 51A and 51B show measurements of an electric motor tuned manually across a wide range of speeds.
Figure 51B:
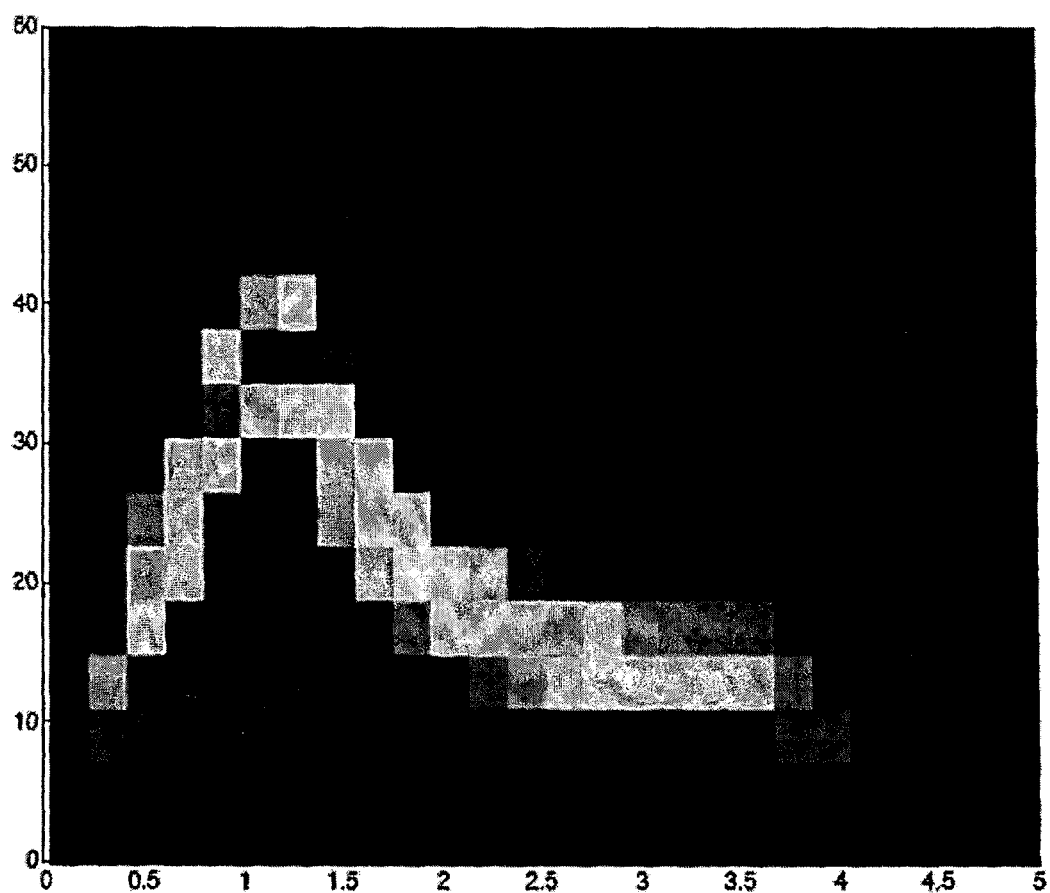

FIGS. 51A and 51B show measurements of an electric motor tuned manually across a wide range of speeds. Sensor output is shown in FIG. 51A vs time and motor speed (in revolutions per second) is shown in FIG. 51B vs time.

Additional Aspects

Figure 26:
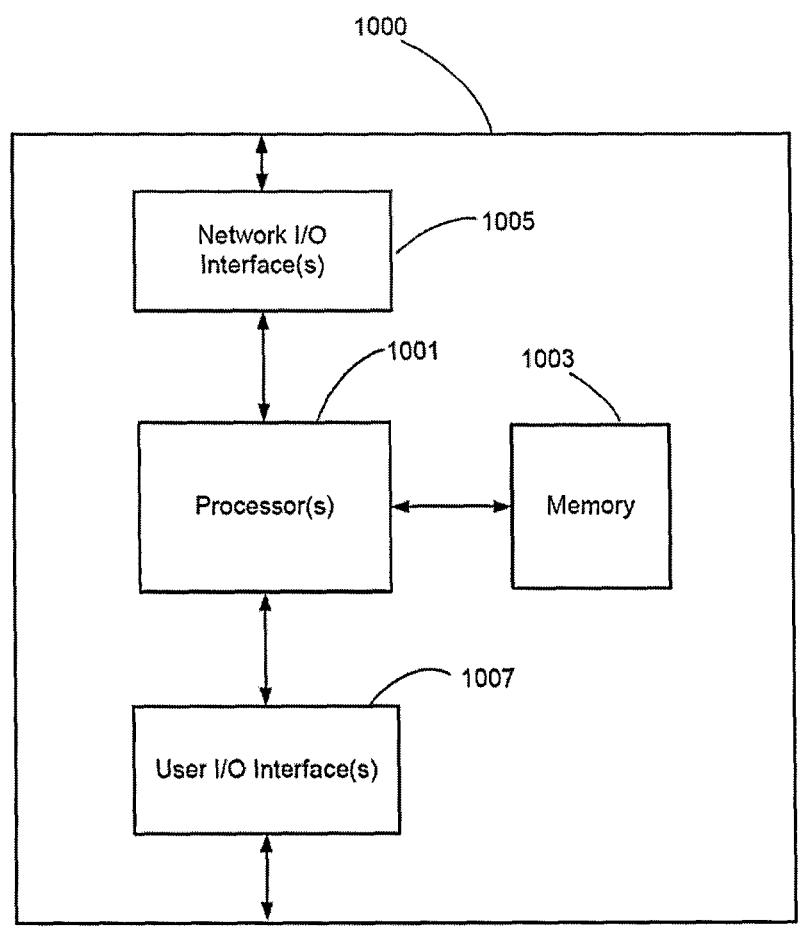
FIG. 26 shows an exemplary computing device.

In some embodiments, techniques described herein, including the above described algorithms, may be carried out using one or more computing devices. Embodiments are not limited to operating with any particular type of computing device. Sensor circuitry or a processor as described herein may be configured to perform A/D conversion and/or other processing of signals from FIG. 26 is a block diagram of an illustrative computing device 1000 that may be used to implement any of the above-described techniques. Computing device 1000 may include one or more processors 1001 and one or more tangible, non-transitory computer-readable storage media (e.g., memory 1003). Memory 1003 may store, in a tangible non-transitory computer-recordable medium, computer program instructions that, when executed, implement any of the above-described functionality. Processor(s) 1001 may be coupled to memory 1003 and may execute such computer program instructions to cause the functionality to be realized and performed.

Computing device 1000 may also include a network input/output (I/O) interface 1005 via which the computing device may communicate with other computing devices (e.g., over a network), and may also include one or more user I/O interfaces 1007, via which the computing device may provide output to and receive input from a user. The user I/O interfaces may include devices such as a keyboard, a mouse, a microphone, a display device (e.g., a monitor or touch screen), speakers, a camera, and/or various other types of I/O devices.

The above-described embodiments can be implemented in any of numerous ways. For example, the embodiments may be implemented using hardware, software or a combination thereof. When implemented in software, the software code can be executed on any suitable processor (e.g., a microprocessor) or collection of processors, whether provided in a single computing device or distributed among multiple computing devices. It should be appreciated that any component or collection of components that perform the functions described above can be generically considered as one or more controllers that control the above-discussed functions. The one or more controllers can be implemented in numerous ways, such as with dedicated hardware, or with general purpose hardware (e.g., one or more processors) that is programmed using microcode or software to perform the functions recited above.

In this respect, it should be appreciated that one implementation of the embodiments described herein comprises at least one computer-readable storage medium (e.g., RAM, ROM, EEPROM, flash memory or other memory technology, CD-ROM, digital versatile disks (DVD) or other optical disk storage, magnetic cassettes, magnetic tape, magnetic disk storage or other magnetic storage devices, or other tangible, non-transitory computer-readable storage medium) encoded with a computer program (i.e., a plurality of executable instructions) that, when executed on one or more processors, performs the above-discussed functions of one or more embodiments. The computer-readable medium may be transportable such that the program stored thereon can be loaded onto any computing device to implement aspects of the techniques discussed herein. In addition, it should be appreciated that the reference to a computer program which, when executed, performs any of the above-discussed functions, is not limited to an application program running on a host computer. Rather, the terms computer program and software are used herein in a generic sense to reference any type of computer code (e.g., application software, firmware, microcode, or any other form of computer instruction) that can be employed to program one or more processors to implement aspects of the techniques discussed herein.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing to description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A monitoring apparatus for monitoring flow of a fluid through a water meter, the monitoring apparatus comprising:
    a first sensor apparatus configured to make a plurality of first measurements of a rotating magnetic field produced by a rotating magnetic device within the water meter when the rotating magnetic device is at a plurality of different positions relative to the first sensor apparatus;
    a second sensor apparatus configured to make a plurality of second measurements of the rotating magnetic field produced by the rotating magnetic device; and
    a sensor positioning apparatus configured to position the first sensor apparatus and the second sensor apparatus external to and proximate to the water meter to measure the rotating magnetic field at first and second angular positions, respectively, wherein the plurality of first measurements and the plurality of second measurements are processed to extract data representing the flow versus time.

2. The monitoring apparatus of claim 1, wherein the sensor positioning apparatus is configured to attach to the water meter.

3. The monitoring apparatus of claim 1, wherein the first sensor apparatus comprises a magnetic field sensor.

4. The monitoring apparatus of claim 3, wherein the magnetic field sensor is a tunneling magnetoresistive magnetic field sensor.

5. The monitoring apparatus of claim 1, wherein the first sensor apparatus comprises a first magnetic field sensor and the second sensor apparatus comprises a second magnetic field sensor.

6. The monitoring apparatus of claim 1, further comprising:
    a processor configured to analyze the first and second plurality of measurements to extract the data.

7. The monitoring apparatus of claim 6, wherein the processor is configured to extract a measurement of instantaneous flow over time from the first and second plurality of measurements.

8. A non-intrusive monitoring method for monitoring flow of a fluid through a field-producing device, the method comprising:
    receiving a plurality of measurements obtained by a sensor apparatus positioned proximate to the field-producing device when a rotating magnetic device within the field-producing device is at a plurality of different positions relative to the sensor apparatus; and
    processing the plurality of measurements to extract data representing the flow of the fluid through the field-producing device versus time.

9. The non-intrusive monitoring method of claim 8, wherein the data represents instantaneous flow versus time.

10. The non-intrusive monitoring method of claim 8, wherein the plurality of measurements is a first plurality of measurements, the sensor apparatus is a first sensor apparatus and a second sensor apparatus is positioned proximate to the field-producing device, and the method further comprises:
receiving a second plurality of measurements from the second sensor apparatus; and
processing the second plurality of measurements, wherein the data is extracted by processing the first and second plurality of measurements.

11. The non-intrusive monitoring method of claim 10, wherein the first and second sensor apparatus are positioned such that the first and second plurality of measurements are in phase quadrature.

12. The non-intrusive monitoring method of claim 10, wherein the first and second plurality of measurements are processed to identify a direction of the flow.

13. A monitoring apparatus for monitoring flow of a fluid through a field-producing device, the monitoring apparatus comprising:
a sensor apparatus configured to measure a plurality of field strengths as a rotating magnetic device within the field-producing devices rotates relative to the sensor apparatus; and
a processor configured to extract, from the plurality of field strengths measured by the sensor apparatus at different positions of the rotating magnetic device relative to the sensor apparatus, data representing the flow of the fluid through the field-producing device versus time, the data representing flow rate transients within the field-producing device from turning on or off a fluid-consuming device that receives the fluid from the field-producing device.

14. The monitoring apparatus of claim 13, further comprising a sensor positioning apparatus configured to position the sensor apparatus external to and proximate to the field-producing device, wherein the field-producing device is a water meter.

15. The monitoring apparatus of claim 14, wherein the sensor positioning apparatus is configured to attach to the field-producing device.

16. The monitoring apparatus of claim 13, wherein the field is a magnetic field and the sensor apparatus comprises a magnetic field sensor.

17. The monitoring apparatus of claim 16, wherein the magnetic field sensor is a tunneling magnetoresistive magnetic field sensor.

18. The monitoring apparatus of claim 13, wherein the sensor apparatus is a first sensor apparatus and the monitoring apparatus further comprises a second sensor apparatus.

19. The monitoring apparatus of claim 18, wherein the first sensor apparatus comprises a first magnetic field sensor and the second sensor apparatus comprises a second magnetic field sensor.

20. The monitoring apparatus of claim 13, wherein the processor is configured to extract a measurement of instantaneous flow over time.

21. The monitoring apparatus of claim 1, wherein the sensor positioning apparatus is configured to fit over an exterior of the water meter and attach to the water meter.

22. The monitoring apparatus of claim 1, wherein the plurality of first measurements are sampled throughout rotation of the rotating magnetic device with a sampling resolution.

23. The monitoring apparatus of claim 22, wherein the sampling resolution is in a kHz range.

24. The monitoring apparatus of claim 1, wherein an instantaneous frequency of the water meter is extracted from the samples of the first measurements to obtain the data representing the flow versus time.

25. The non-intrusive monitoring method of claim 8, wherein the plurality of measurements are sampled throughout rotation of the field-producing device with a sampling resolution.

26. The non-intrusive monitoring method of claim 25, wherein the sampling resolution is in a kHz range.

27. The non-intrusive monitoring method of claim 8, wherein an instantaneous frequency of the water meter is extracted from the samples of the plurality of measurements to obtain the data representing the flow of the fluid through the field-producing device versus time.

\* \* \* \* \*